(12) United States Patent
Marpe et al.

(10) Patent No.: US 10,404,272 B2
(45) Date of Patent: *Sep. 3, 2019

(54) ENTROPY ENCODING AND DECODING SCHEME

(71) Applicant: GE VIDEO COMPRESSION, LLC, Albany, NY (US)

(72) Inventors: Detlev Marpe, Berlin (DE); Tung Nguyen, Berlin (DE); Heiko Schwarz, Berlin (DE); Thomas Wiegand, Berlin (DE)

(73) Assignee: GE VIDEO COMPRESSION, LLC, Albany, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/198,338

(22) Filed: Nov. 21, 2018

(65) Prior Publication Data

US 2019/0097649 A1 Mar. 28, 2019

Related U.S. Application Data

(63) Continuation of application No. 16/109,953, filed on Aug. 23, 2018, which is a continuation of application
(Continued)

(51) Int. Cl.
*H03M 7/00* (2006.01)
*H03M 7/40* (2006.01)
*H03M 7/46* (2006.01)

(52) U.S. Cl.
CPC .............. *H03M 7/00* (2013.01); *H03M 7/40* (2013.01); *H03M 7/4006* (2013.01); *H03M 7/46* (2013.01)

(58) Field of Classification Search
CPC ...................................................... H03M 7/00
(Continued)

(56) References Cited

U.S. PATENT DOCUMENTS

| 5,600,812 A | 2/1997 | Park |
| 5,604,498 A | 2/1997 | Park |

(Continued)

FOREIGN PATENT DOCUMENTS

| CN | 1112799 A | 11/1995 |
| CN | 1118196 A | 3/1996 |

(Continued)

OTHER PUBLICATIONS

"Information Technology—Coding of Audio-Visual Objects—Part 16: Animation Framework Extension (AFX), Amendment 1: Scalable Complexity 3D Mesh Compression," ISOIIEC 14496-16:2009/FDAM 1:2010 (E), Jan. 22, 2010, 62 pages.
(Continued)

*Primary Examiner* — Lam T Mai
(74) *Attorney, Agent, or Firm* — Pillsbury Winthrop Shaw Pittman, LLP

(57) ABSTRACT

Decomposing a value range of the respective syntax elements into a sequence of n partitions with coding the components of z laying within the respective partitions separately with at least one by VLC coding and with at least one by PIPE or entropy coding is used to greatly increase the compression efficiency at a moderate coding overhead since the coding scheme used may be better adapted to the syntax element statistics. Accordingly, syntax elements are decomposed into a respective number n of source symbols $s_i$ with i=1 . . . n, the respective number n of source symbols depending on as to which of a sequence of n partitions into which a value range of the respective syntax elements is sub-divided, a value z of the respective syntax elements falls into, so that a sum of values of the respective number of source symbols $s_i$ yields z, and, if n>1, for all i=1 . . . n−1, the value of $s_i$ corresponds to a range of the $i^{th}$ partition.

30 Claims, 23 Drawing Sheets

Related U.S. Application Data

No. 15/717,427, filed on Sep. 27, 2017, now Pat. No. 10,090,856, which is a continuation of application No. 15/479,787, filed on Apr. 5, 2017, now Pat. No. 9,806,738, which is a continuation of application No. 15/195,696, filed on Jun. 28, 2016, now Pat. No. 9,647,683, which is a continuation of application No. 14/980,671, filed on Dec. 28, 2015, now Pat. No. 9,473,169, which is a continuation of application No. 14/734,407, filed on Jun. 9, 2015, now Pat. No. 9,252,806, which is a continuation of application No. 13/940,561, filed on Jul. 12, 2013, now Pat. No. 9,083,374, which is a continuation of application No. PCT/EP2012/050431, filed on Jan. 12, 2012.

(60) Provisional application No. 61/432,884, filed on Jan. 14, 2011.

(58) Field of Classification Search
USPC ............................................. 341/51–70
See application file for complete search history.

(56) References Cited

U.S. PATENT DOCUMENTS

| | | | |
|---|---|---|---|
| 5,717,394 | A | 2/1998 | Schwartz et al. |
| 7,221,296 | B2 | 5/2007 | Ziauddin |
| 7,573,405 | B2 | 8/2009 | Shima |
| 7,796,065 | B2 | 9/2010 | Fenney |
| 8,396,311 | B2 | 3/2013 | Chono |
| 8,410,959 | B2 | 4/2013 | Karczewicz et al. |
| 8,483,282 | B2 | 7/2013 | Karczewicz et al. |
| 9,083,371 | B2 | 7/2015 | Aruga |
| 9,083,374 | B2 | 7/2015 | Marpe |
| 9,252,806 | B2 | 2/2016 | Marpe |
| 9,473,169 | B2 | 10/2016 | Marpe |
| 9,647,683 | B2 | 5/2017 | Marpe |
| 9,806,738 | B2 * | 10/2017 | Marpe ............ H03M 7/40 |
| 10,090,856 | B2 * | 10/2018 | Marpe ............ H03M 7/40 |
| 2004/0081241 | A1 | 4/2004 | Kadono et al. |
| 2005/0088324 | A1 | 4/2005 | Ikuo et al. |
| 2005/0283700 | A1 | 12/2005 | O'Dea |
| 2006/0071827 | A1 | 4/2006 | Lynch et al. |
| 2007/0110153 | A1 | 5/2007 | Cho et al. |
| 2010/0153828 | A1 | 6/2010 | De Lind Van Wijngaarden |
| 2011/0211636 | A1 | 9/2011 | Yamada et al. |
| 2012/0121012 | A1 | 5/2012 | Shiodera |
| 2012/0262444 | A1 | 10/2012 | Stefanoski et al. |
| 2013/0107951 | A1 | 5/2013 | Sole |
| 2014/0333458 | A1 | 11/2014 | Marpe |
| 2016/0353110 | A1 | 12/2016 | Zhang |
| 2017/0127058 | A1 | 5/2017 | Misra |

FOREIGN PATENT DOCUMENTS

| | | |
|---|---|---|
| CN | 1610265 A | 4/2005 |
| CN | 1215647 C | 8/2005 |
| CN | 101099391 A | 1/2008 |
| CN | 101243459 B | 12/2010 |
| EP | 2768144 B1 | 3/2016 |
| JP | 08116266 A | 5/1996 |
| JP | 2003153265 A | 5/2003 |
| JP | 2005-507184 | 3/2005 |
| JP | 2007116501 A | 5/2007 |
| JP | 2008-514142 A | 5/2008 |
| JP | 2009-516417 A | 4/2009 |
| JP | 2010-527523 A | 8/2010 |
| KR | 10-1741296 B1 | 5/2017 |
| TW | 200917850 A | 4/2009 |
| TW | 200930102 A | 7/2009 |
| WO | 2008/129021 A2 | 10/2008 |
| WO | 2010/052833 A1 | 5/2010 |
| WO | 2012/031628 A1 | 3/2012 |

OTHER PUBLICATIONS

Kiely, "Selecting the Golomb Parameter in Rice Coding," IPN Progress Report 42-159, Nov. 15, 2004, pp. 1-18.

Marpe et al., "Entropy Coding in Video Compression Using Probability Interval Partitioning," 28th Picture Coding Symposium, PCS2010, Dec. 8-10, 2010, pp. 66-69.

Marpe et al., "Entropy Encoding and Decoding Scheme Using VLC Coding and Pipe or Entropy Coding for High Compression Efficiency", U.S. Appl. No. 13/940,561, filed Jul. 12, 2013.

Nguyen et al. "Reduced-Complexity Entropy Coding of Transform Coefficient Levels Using a Combination of VLC and PIPE, "Joint Collaborative Team on Video Coding (JCT/VC) of ITU-T SG 16 WP3 and ISO/IEC JTC1/SC29WG11, Jan. 2011, pp. 1-9.

Notice of Allowance dated Dec. 16, 2016 in Taiwanese Application 104129973.

Notice of Allowance dated Mar. 16, 2017 in U.S. Appl. No. 15/257,606.

Office Action and Search Report dated Oct. 10, 2015, in corresponding Chinese Patent Application No. 201280011782.8, with English translation.

Office Action dated Nov. 16, 2016 in U.S. Appl. No. 15/257,606.

Official Communication issued in International Patent Application No. PCT/EP2012/050431, dated Oct. 23, 2012.

Winger, "Putting a Reasonable Upper Limit of Binarization Expansion," Joint Video Team (JVT) of ISOIIEC MPEG & ITU-T VCEG (ISO/IEC JTC1/SC29/WG11 and ITU-T SG16 Q.6) May 6-10, 2002, pp. 1-8.

Winken et al., "Description of Video Coding Technology Proposal by Fraunhofer HHI," Joint Collaborative Team on Video Coding (JCT-VC) of ITU-T SG16 WP3 and ISO/IEC JTC1/SC29/WG11, Apr. 2010, pp. 1-44.

Notice of Allowance dated Jun. 27, 2016 in U.S. Appl. No. 15/479,787.

Non-final Office Action U.S. Appl. No. 15/717,427 dated Dec. 11, 2017.

Non Final Office Action U.S. Appl. No. 15/717,427 dated Mar. 26, 2018.

Office Action dated Dec. 6, 2017 in Japanese Application No. 2017-002986.

Bardone, David et al., Adaptive Golomb codes for Level Binalization in the H.264/AVC FRExt Lossless Mode, ISSPIT2008. IEEE International Symposium on Signal Processing and Information Technology, US, IEEE, Dec. 16, 2008, pp. 287-291, IEEE Xplore.

Ohkubo, Sakae et al., H.264/AVC Text, Third version, Impress R&D, Jan. 1, 2009, pp. 150-151.

Budagavi, Madhukar et al., Parallel Context Processing Techniques for High Coding Efficiency Entropy Coding in HEVC, JCTVC-6088, ITU-T, Jul. 21, 2010.

Notice of Allowance U.S. Appl. No. 15/717,427 dated May 23, 2018.

Non-final Office Action U.S. Appl. No. 15/717,579 dated Apr. 3, 2018.

Extended European Search Report EP Application No. 18160276.4 dated May 4, 2018.

Non-final Office Action U.S. Appl. No. 16/109,953 dated Dec. 13, 2018.

Notice of Allowance U.S. Appl. No. 15/717,579 dated Sep. 21, 2018.

Notice of Allowance Korean Patent Application No. 10-2017-7027820 dated Nov. 29, 2018 with English translation.

Notice of Allowance Korean Patent Application No. 10-2017-7027822 dated Nov. 29, 2018 with English translation.

Decision to Grant a Patent issued in corresponding Japanese Patent Application 2017-002986 dated Jan. 8, 2019 with English translation.

Notice of Reasons for Rejection dated Jun. 25, 2019 issued in corresponding Korean Patent Application No. 10-2019-7005616 with English translation.

\* cited by examiner

FIGURE 8A

| codeword | maximum codeword size |
|---|---|
| 0100 (complete codeword, bin encoder 2) | 4 |
| reserved codeword, bin encoder 3 | 5 |
| reserved codeword, bin encoder 3 | 5 |
| reserved codeword, bin encoder 3 | 5 |
| 11110 (complete codeword, bin encoder 1) | 6 |
| reserved codeword, bin encoder 1 | 6 |
| reserved codeword, bin encoder 1 | 6 |
| ---- next free codeword buffer entry ---- | | processing order →

FIGURE 8B

| codeword | maximum codeword size |
|---|---|
| reserved codeword, bin encoder 3 | 1 |
| reserved codeword, bin encoder 3 | 1 |
| 11110 (complete codeword, bin encoder 1) | 7 |
| 1010 (complete codeword, bin encoder 1) | 7 |
| reserved codeword, bin encoder 1 | 7 |
| 01 (complete codeword, bin encoder 2) | 3 |
| reserved codeword, bin encoder 2 | 3 |
| ---- next free codeword buffer entry ---- | | processing order →

| 01000111 (completed 8 bits, bin encoder 2) |
| reserved 10 bits, bin encoder 3 |
| reserved 16 bits, bin encoder 4 |
| reserved 4 bits, bin encoder 5 |
| 111100 (completed 6 bits, bin encoder 1) |
| 001101 (completed 6 bits, bin encoder 1) |
| reserved 6 bits, bin encoder 1 |
| --- next free codeword buffer entry --- |

→ processing order

FIGURE 12A

| reserved 8 bits, bin encoder 3 |
| reserved 8 bits, bin encoder 2 |
| 11110000 (completed 8 bits, bin encoder 1) |
| 10100101 (completed 8 bits, bin encoder 1) |
| reserved 8 bits, bin encoder 1 |
| 01010011 (completed 8 bits, bin encoder 4) |
| reserved 8 bits, bin encoder 4 |
| --- next free codeword buffer entry --- |

→ processing order

FIGURE 12B

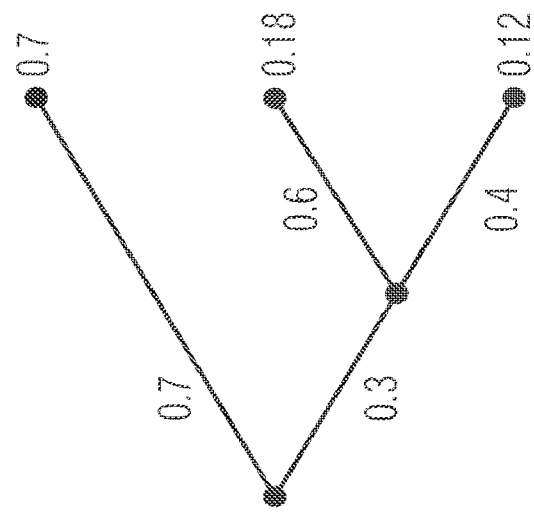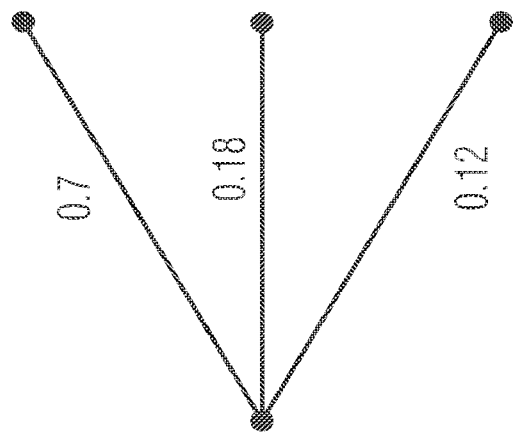
FIGURE 18

| maximum codeword size | |
|---|---|
| 0100 (complete codeword, bin encoder 2) | 4 |
| reserved codeword, bin encoder 3 | 5 |
| variable length codeword (complete) | 5 |
| reserved codeword, bin encoder 3 | 5 |
| 11110 (complete codeword, bin encoder 1) | 6 |
| variable length codeword (complete) | 6 |
| reserved codeword, bin encoder 1 | 6 |
| --- next free codeword buffer entry --- | | processing order →

FIGURE 23A

| maximum codeword size | |
|---|---|
| reserved codeword, bin encoder 3 | 1 |
| reserved codeword, bin encoder 3 | 1 |
| 11110 (complete codeword, bin encoder 1) | 7 |
| 1010 (complete codeword, bin encoder 1) | 7 |
| variable length codeword (complete) | 7 |
| 01 (complete codeword, bin encoder 2) | 3 |
| reserved codeword, bin encoder 2 | 3 |
| --- next free codeword buffer entry --- | | processing order →

FIGURE 23B ated entropy
ENTROPY ENCODING AND DECODING SCHEME

CROSS-REFERENCE TO RELATED APPLICATIONS

This application is a Continuation of U.S. patent application Ser. No. 16/109,953, filed Aug. 23, 2018, which is a Continuation of U.S. patent application Ser. No. 15/717,427 filed Sep. 27, 2017, now U.S. Pat. No. 10,090,856, which is a Continuation of U.S. patent application Ser. No. 15/479,787 filed Apr. 5, 2017, now U.S. Pat. No. 9,806,738, which is a Continuation of U.S. patent application Ser. No. 15/195,696 filed Jun. 28, 2016, now U.S. Pat. No. 9,647,683, which is a Continuation of U.S. patent application Ser. No. 14/980,671 filed Dec. 28, 2015, now U.S. Pat. No. 9,473,169, which is a Continuation of U.S. patent application Ser. No. 14/734,407 filed on Jun. 9, 2015, now U.S. Pat. No. 9,252,806, which is a Continuation of U.S. patent application Ser. No. 13/940,561 filed on Jul. 12, 2013, now U.S. Pat. No. 9,083,374, which is a continuation of International Application No. PCT/EP2012/050431 filed on Jan. 12, 2012, and additionally claims priority from U.S. Provisional Patent Application No. 61/432,884 filed on Jan. 14, 2011. Each of the foregoing patent applications and patents is incorporated herein by reference in its entirety.

BACKGROUND OF THE INVENTION

The present invention relates to entropy encoding and decoding and may be used in applications such as, for example, video and audio compression.

Entropy coding, in general, can be considered as the most generic form of lossless data compression. Lossless compression aims to represent discrete data with fewer bits than needed for the original data representation but without any loss of information. Discrete data can be given in the form of text, graphics, images, video, audio, speech, facsimile, medical data, meteorological data, financial data, or any other form of digital data.

In entropy coding, the specific high-level characteristics of the underlying discrete data source are often neglected. Consequently, any data source is considered to be given as a sequence of source symbols that takes values in a given m-ary alphabet and that is characterized by a corresponding (discrete) probability distribution {p1, . . . , Pm}. In these abstract settings, the lower bound of any entropy coding method in terms of expected codeword length in bits per symbol is given by the entropy $$H = -\sum_{i=1}^{m} p_i \log_2 p_i \quad (A1)$$

Huffman codes and arithmetic codes are well-known examples of practical codes capable of approximating the entropy limit (in a certain sense). For a fixed probability distribution, Huffman codes are relatively easy to construct. The most attractive property of Huffman codes is that its implementation can be efficiently realized by the use of variable-length code (VLC) tables. However, when dealing with time-varying source statistics, i.e., changing symbol probabilities, the adaptation of the Huffman code and its corresponding VLC tables is quite demanding, both in terms of algorithmic complexity as well as in terms of implementation costs. Also, in the case of having a dominant alphabet value with $p_k > 0.5$, the redundancy of the corresponding Huffman code (without using any alphabet extension such as run length coding) may be quite substantial. Another shortcoming of Huffman codes is given by the fact that in case of dealing with higher-order probability modeling, multiple sets of VLC tables may be necessitated. Arithmetic coding, on the other hand, while being substantially more complex than VLC, offers the advantage of a more consistent and adequate handling when coping with adaptive and higher-order probability modeling as well as with the case of highly skewed probability distributions. Actually, this characteristic basically results from the fact that arithmetic coding provides a mechanism, at least conceptually, to map any given value of probability estimate in a more or less direct way to a portion of the resulting codeword. Being provided with such an interface, arithmetic coding allows for a clean separation between the tasks of probability modeling and probability estimation, on the one hand, and the actual entropy coding, i.e., mapping of a symbols to codewords, on the other hand.

An alternative to arithmetic coding and VLC coding is PIPE coding. To be more precise, in PIPE coding, the unit interval is partitioned into a small set of disjoint probability intervals for pipelining the coding processing along the probability estimates of random symbol variables. According to this partitioning, an input sequence of discrete source symbols with arbitrary alphabet sizes may be mapped to a sequence of alphabet symbols and each of the alphabet symbols is assigned to one particular probability interval which is, in turn, encoded by an especially dedicated entropy encoding process. With each of the intervals being represented by a fixed probability, the probability interval partitioning entropy (PIPE) coding process may be based on the design and application of simple variable-to-variable length codes. The probability modeling can either be fixed or adaptive. However, while PIPE coding is significantly less complex than arithmetic coding, it still has a higher complexity than VLC coding.

Therefore, it would be favorable to have an entropy coding scheme at hand which enables to achieve a better tradeoff between coding complexity on the one hand and compression efficiency on the other hand, even when compared to PIPE coding which already combines advantages of both arithmetic coding and VLC coding.

Further, in general, it would be favorable to have an entropy coding scheme at hand which enables to achieve a better compression efficiency per se, at a moderate coding complexity.

SUMMARY

According to an embodiment, an entropy encoding apparatus may have: a decomposer configured to convert a sequence of syntax elements having a value range which is sub-divided into a sequence of N partitions into a sequence of source symbols by individually decomposing each of at least a subgroup of the syntax elements into a respective number n of source symbols $s_i$ with i=1 . . . n, the respective number n of source symbols depending on as to which of the sequence of N partitions a value z of the respective syntax elements falls into, so that a sum of values of the respective number of source symbols $s_i$ yields z, and, if n>1, for all i=1 . . . n−1, the value of $s_i$ corresponds to a range of the $i^{th}$ partition; a subdivider configured to subdivide the sequence of source symbols into a first subsequence of source symbols and a second subsequence of source symbols such that all source symbols $s_x$ with x being member of a first subset of {1 . . . N} are contained within the first subsequence and all source symbols $s_y$ with y being member of a second subset of {1 . . . N} being disjoint to the first subset, are contained within the second subsequence; a VLC encoder configured to symbol-wisely encode the source symbols of the first subsequence; and a probability interval partitioning entropy or arithmetic encoder configured to encode the second subsequence of source symbols.

According to another embodiment, an entropy decoding apparatus may have: a VLC decoder configured to codeword-wisely reconstruct source symbols of a first subsequence of source symbols from codewords of a first bitstream; a probability interval partitioning entropy or arithmetic decoder configured to reconstruct a second subsequence of source symbols; a composer configured to compose a sequence of syntax elements having a value range which is sub-divided into a sequence of N partitions from the first subsequence of source symbols and the second subsequence of source symbols by individually composing each syntax element from a respective number n of source symbols by, for each of at least a subgroup of the syntax elements, determining the respective number n of source symbols $s_i$ with i=1 . . . n depending on as to which of the sequence of N partitions into which a value range of the respective syntax elements is sub-divided, a value z of the respective syntax elements falls into, by summing-up the values of the respective number of source symbols $s_i$ from 1 to n as long as the value of $s_i$ corresponds to a range of the $i^{th}$ partition so as to acquire the value of the syntax element z, wherein the composer is configured to retrieve all source symbols $s_x$ with x being member of a first subset of {1 . . . N} from the first subsequence and all source symbols $s_y$ with y being member of a second subset of {1 . . . N} being disjoint to the first subset, from the second subsequence.

According to another embodiment, an entropy encoding method may have the steps of: converting a sequence of syntax elements having a value range which is sub-divided into a sequence of N partitions into a sequence of source symbols by individually decomposing each of at least a subgroup of the syntax elements into a respective number n of source symbols $s_i$ with i=1 . . . n, the respective number n of source symbols depending on as to which of the sequence of N partitions a value z of the respective syntax elements falls into, so that a sum of values of the respective number of source symbols $s_i$ yields z, and, if n>1, for all i=1 . . . n−1, the value of $s_i$ corresponds to a range of the $i^{th}$ partition; subdividing the sequence of source symbols into a first subsequence of source symbols and a second subsequence of source symbols such that all source symbols $s_x$ with x being member of a first subset of {1 . . . N} are contained within the first subsequence and all source symbols $s_y$ with y being member of a second subset of {1 . . . N} being disjoint to the first subset, are contained within the second subsequence; by VLC encoding, symbol-wisely encoding the source symbols of the first subsequence; and by probability interval partitioning entropy or arithmetic encoding, encoding the second subsequence of source symbols.

According to another embodiment, an entropy decoding method may have the steps of: by VLC decoding, codeword-wisely reconstructing source symbols of a first subsequence of source symbols from codewords of a first bitstream; by probability interval partitioning entropy or arithmetic decoding, reconstructing a second subsequence of source symbols; composing a sequence of syntax elements having a value range which is sub-divided into a sequence of N partitions from the first subsequence of source symbols and the second subsequence of source symbols by individually composing each syntax element from a respective number n of source symbols by, for each of at least a subgroup of the syntax elements, determining the respective number n of source symbols $s_i$ with i=1 . . . n depending on as to which of the sequence of N partitions into which a value range of the respective syntax elements is sub-divided, a value z of the respective syntax elements falls into, by summing-up the values of the respective number of source symbols $s_i$ from 1 to n as long as the value of $s_i$ corresponds to a range of the $i^{th}$ partition so as to acquire the value of the syntax element z, wherein the composing includes retrieving all source symbols $s_x$ with x being member of a first subset of {1 . . . N} from the first subsequence and all source symbols $s_y$ with y being member of a second subset of {1 . . . N} being disjoint to the first subset, from the second subsequence.

Another embodiment may have a computer program having a program code for performing, when running on a computer, an inventive method.

The present invention is based on the idea that decomposing a value range of the respective syntax elements into a sequence of n partitions with coding the components of the syntax element values z laying within the respective partitions separately with at least one by VLC coding and with at least one by PIPE or arithmetic coding or any other entropy coding method may greatly increase the compression efficiency at a moderate coding overhead in that the coding scheme used may be better adapted to the syntax element statistics. Accordingly, in accordance with embodiments of the present invention, syntax elements are decomposed into a respective number n of source symbols $s_i$ with i=1 . . . n, the respective number n of source symbols depending on as to which of a sequence of n partitions (1401_3) into which a value range of the respective syntax elements is sub-divided, a value z of the respective syntax elements falls into, so that a sum of values of the respective number of source symbols $s_i$ yields z, and, if n>1, for all i=1 . . . n−1, the value of $s_i$ corresponds to a range of the $i^{th}$ partition Further, some embodiments of the present invention, which use PIPE coding besides VLC coding, exploit the fact that a better tradeoff between coding complexity on the one hand and compression efficiency on the other hand may be achieved if in addition to the categorizing feature of PIPE coding according to which alphabet symbols are distributed among a plurality of specialized entropy en/decoders according to their probability distribution estimate, a further categorizing stage is provided according to which source symbols to be encoded are sub-divided into a first substream which is subject to VLC coding, and a second substream which is—represented in the symbol alphabet of the PIPE coder, i.e. as a sequence of alphabet symbols—subject to PIPE coding. By this measure, source symbols having an appropriate symbol probability distribution, i.e. a probability distribution suitable for being efficiently coded by means of VLC coding without the deficiencies outlined above in the introductory portion of the specification of the present application, may be categorized as VLC coded symbols such as the higher valued partitions whereas other source symbols such as the lowest valued partitions may be treated as PIPE coded symbols and subject to PIPE coding, the coding complexity of which is higher than VLC coding, but at a better compression efficiency.

In accordance with an embodiment, it is possible to decompose syntax elements into a respective integer number of source symbols, one of which being treated as VLC coded symbol, the other one of which being treated as PIPE coded symbol.

BRIEF DESCRIPTION OF THE DRAWINGS

Embodiments of the present invention will be detailed subsequently referring to the appended drawings, in which:

FIGS. 8a and 8b show schematic illustrating examples for the status of a codeword buffer at the encoder side of FIG. 7 according to an embodiment;

FIGS. 12a and 12b show schematic illustrating examples for the status of a global bit buffer at the encoder side of FIG. 11 according to an embodiment;

FIG. 18 shows a schematic diagram illustrating an example for conversion of a ternary choice tree into a full binary choice tree;

FIGS. 23a and 23b show schematic diagram illustrating examples for the status of a global bit buffer at the encoder side of FIG. 22 according to an embodiment;

DETAILED DESCRIPTION OF THE INVENTION

Before several embodiments of the present application are described in the following with respect to the figures, it is noted that equal reference signs are used throughout the figures in order to denote equal or equivalent elements in these figures, and the description of these elements presented with any of the previous figures shall also apply to any of the following figures as far as the previous description does not conflict with the description of the current figures.

Figure 1A:
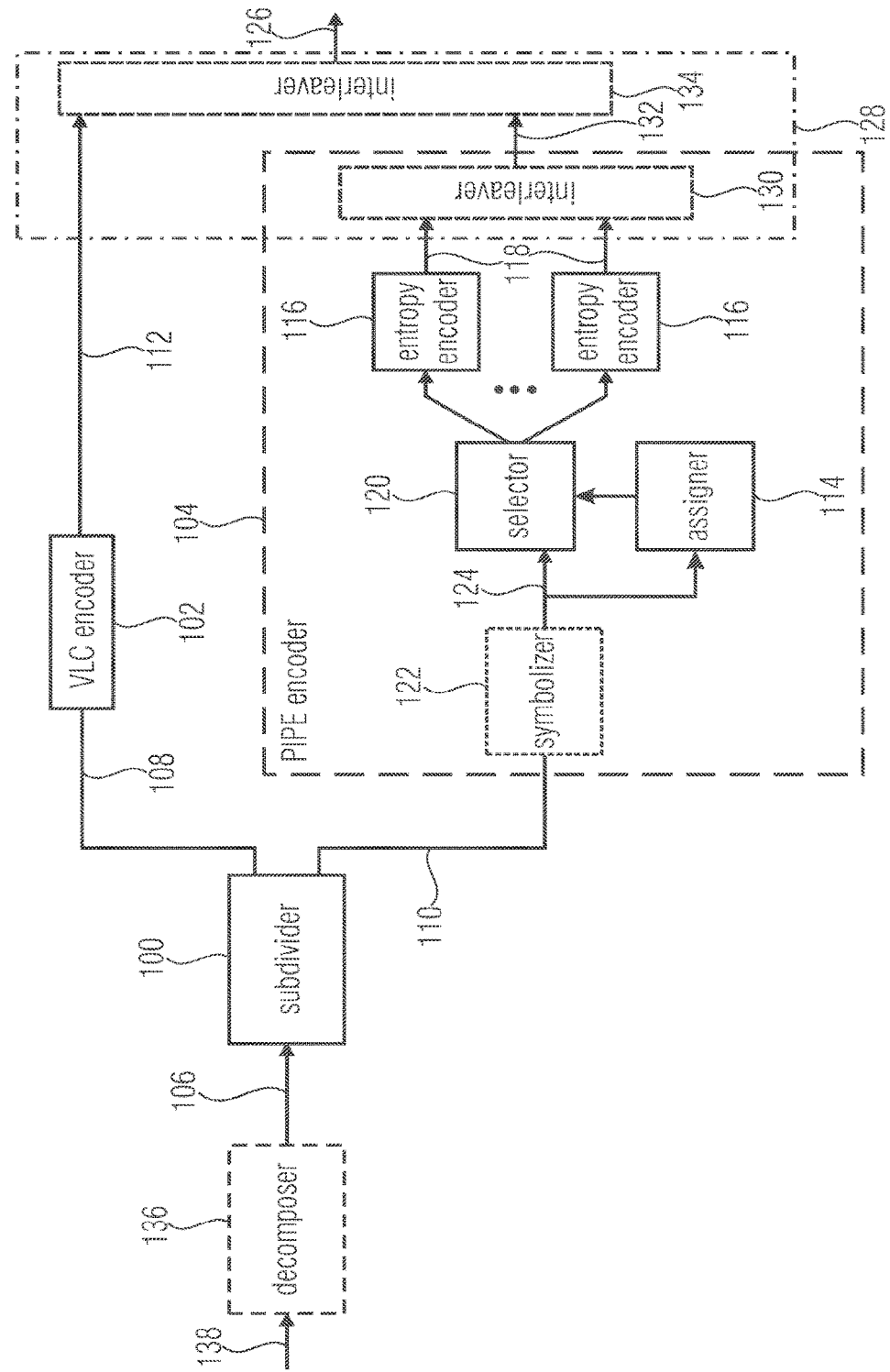
FIG. 1a shows a block diagram of an entropy encoding apparatus according to an embodiment.

FIG. 1a shows an entropy encoding apparatus according to an embodiment of the present application. The apparatus comprises a subdivider 100, a VLC encoder 102 and a PIPE encoder 104.

The subdivider 100 is configured to subdivide a sequence of source symbols 106 into a first subsequence 108 of source symbols and a second subsequence 110 of source symbols. The VLC encoder 102 has an input thereof connected to a first output of subdivider 100 and is configured to symbol-wisely convert the source symbols of the first subsequence 108 into codewords forming a first bitstream 112. The VLC encoder 102 may comprise a look-up table and use, individually, the source symbols as an index in order to look-up, per source symbol, a respective codeword in the look-up table. The VLC encoder outputs the latter codeword, and proceeds with the following source symbol in subsequence 110 in order to output a sequence of codewords in which each codeword is associated with exactly one of the source symbols within subsequence 110. The codewords may have different lengths and may be defined such that no codeword forms a prefix with any of the other codewords. Additionally, the look-up table may be static.

The PIPE encoder 104 has an input thereof connected to a second output of subdivider 100 and is configured to encode the second subsequence 110 of source symbols, represented in form of a sequence of alphabet symbols, and comprises an assigner 114 configured to assign a measure for an estimate of a probability distribution among possible values the respective alphabet symbols may assume, to each alphabet symbol of the sequence of alphabet symbols based on information contained within previous alphabet symbols of the sequence of alphabet symbols, a plurality of entropy encoders 116 each of which is configured to convert the alphabet symbols forwarded to the respective entropy encoder into a respective second bitstream 118, and a selector 120 configured to forward each alphabet symbol of the second subsequence 110 to a selected one of the plurality of entropy encoders 116, the selection depending on the afore-mentioned measure for the estimate of the probability distribution assigned to the respective alphabet symbol. The association between source symbols and alphabet symbols may be such that each alphabet symbol is uniquely associated with exactly one source symbol of subsequence 110 in order to represent, along with possibly further alphabet symbols of the sequence of alphabet symbols which may immediately follow each other, this one source symbol.

As described in more detail below, the sequence 106 of source symbols may be a sequence of syntax elements of a parsable bitstream. The parsable bitstream may, for example, represent video and/or audio content in a scalable or non-scalable manner with the syntax elements representing, for example, transform coefficient levels, motion vectors, motion picture reference indices, scale factors, audio envelope energy values or the like. The syntax elements may, in particular, be of different type or category with syntax elements of the same type, for example, having the same meaning within the parsable bitstream but with respect to different portions thereof, such as different pictures, different macroblocks, different spectral components or the like, whereas syntax elements of different type may have a different meaning within the bitstream, such as a motion vector has a different meaning than a syntax element representing a transform coefficient level representing the motion prediction residual.

The subdivider 100 may be configured to perform the subdivision depending on the type of the syntax elements. That is, subdivider 100 may forward syntax elements of a first group of types to the first subsequence 108 and forward syntax elements of a second group of types distinct from the first group, to the second subsequence 110. The subdivision performed by subdivider 100 may be designed such that the symbol statistics of the syntax elements within subsequence 108 is suitable for being VLC encoded by VLC encoder 102, i.e. does result in almost a minimum entropy possible despite the use of VLC encoding and its restriction with regard to its suitability for certain symbol statistics as outlined in the introductory portion of the specification of the present application. On the other hand, the subdivider 100 may forward all other syntax elements onto the second subsequence 110 so that these syntax elements having symbols statistics not being suitable for VLC encoding, are encoded by the more complex, but more efficient-in terms of compression ratio-PIPE encoder 104.

As it is also the case with the more detailed described embodiments of the following figures, the PIPE encoder 104 may comprise a symbolizer 122 configured to individually map each syntax element of the second subsequence 110 into a respective partial sequence of alphabet symbols, together forming the afore-mentioned sequence 124 of alphabet symbols. In other words, the symbolizer 122 may not be present if, for example, the source symbol of subsequence 110 are already represented as respective partial sequences of alphabet symbols. The symbolizer 122 is, for example, advantageous in case the source symbols within the subsequence 110 are of different alphabets, and especially, alphabets having different numbers of possible alphabet symbols. Namely, in this case, the symbolizer 122 is able to harmonize the alphabets of the symbols arriving within substream 110. The symbolizer 122 may, for example, be embodied as a binarizer configured to binarize the symbols arriving with in subsequence 110.

As mentioned before, the syntax elements may be of different type. This may also be true for the syntax elements within substream 110. The symbolizer 122 may then be configured to perform the individual mapping of the syntax elements of the subsequence 110 using a symbolizing mapping scheme, such as a binarization scheme, different for syntax elements of different type. Examples for specific binarization schemes are presented in the following description, such as a unary binarization scheme, an exp-Golomb binarization scheme of order 0 or order 1, for example, or a truncated unary binarization scheme, a truncated and reordered exp-Golomb order 0 binarization scheme or a non-systematic binarization scheme.

Accordingly, the entropy encoders 116 could be configured to operate on a binary alphabet. Finally, it should be noted that symbolizer 122 may be regarded as being part of the PIPE encoder 104 itself as shown in FIG. 1a. Alternatively, however, the binarizer may be regarded as being external to the PIPE encoder.

Similar to the latter notice, it should be noted that the assigner 114, although shown to be connected serially between symbolizer 122 and selector 120, may alternatively be regarded as being connected between an output of symbolizer 124 and a first input of selector 120, with an output of assigner 114 being connected to another input of selector 120 as later described with respect to FIG. 3. In effect, the assigner 114 accompanies each alphabet symbol with the afore-mentioned measure for an estimation of the probability distribution.

Figure 22:
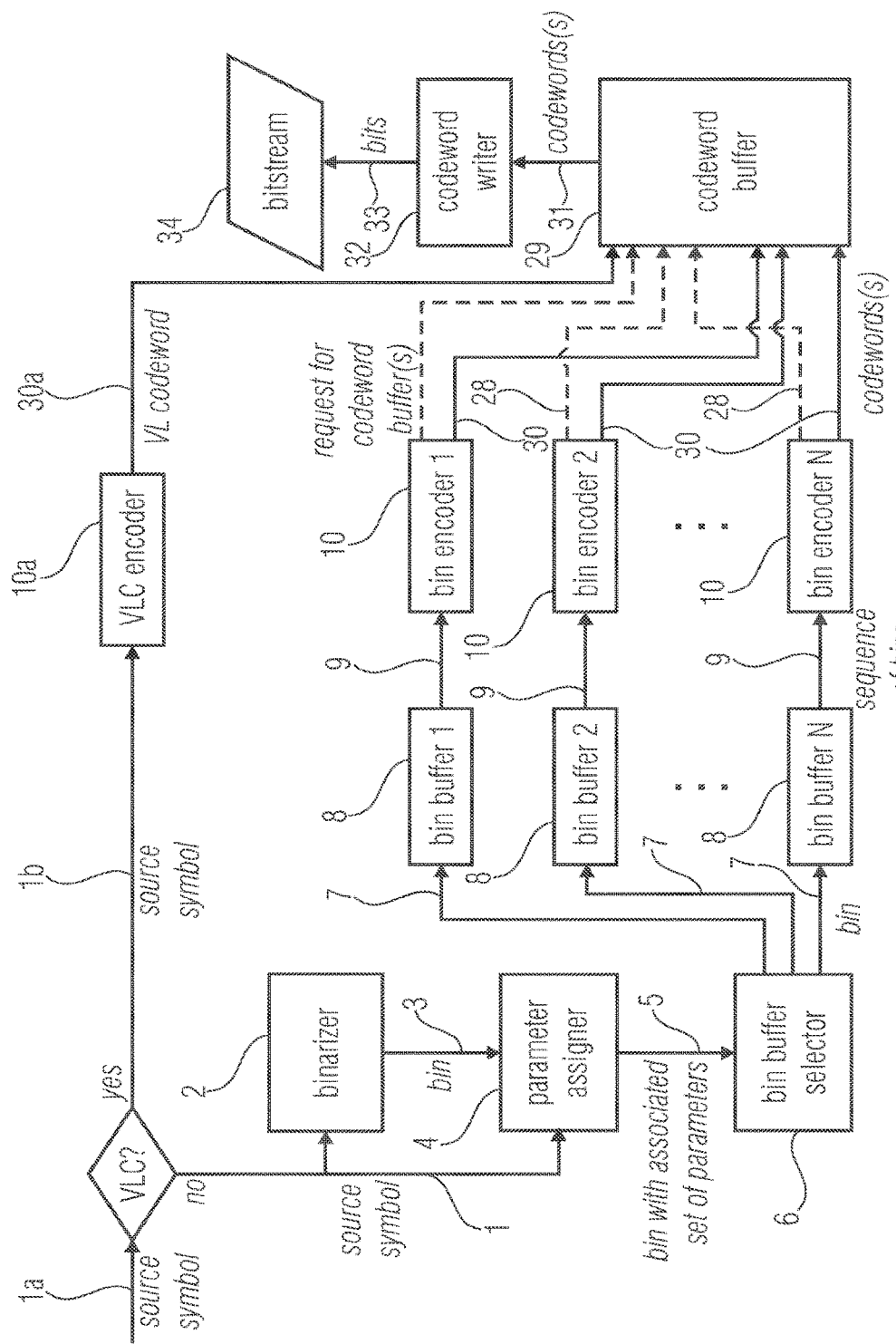
FIG. 22 shows a block diagram of an entropy encoding apparatus according to an even further embodiment.
Figure 24:
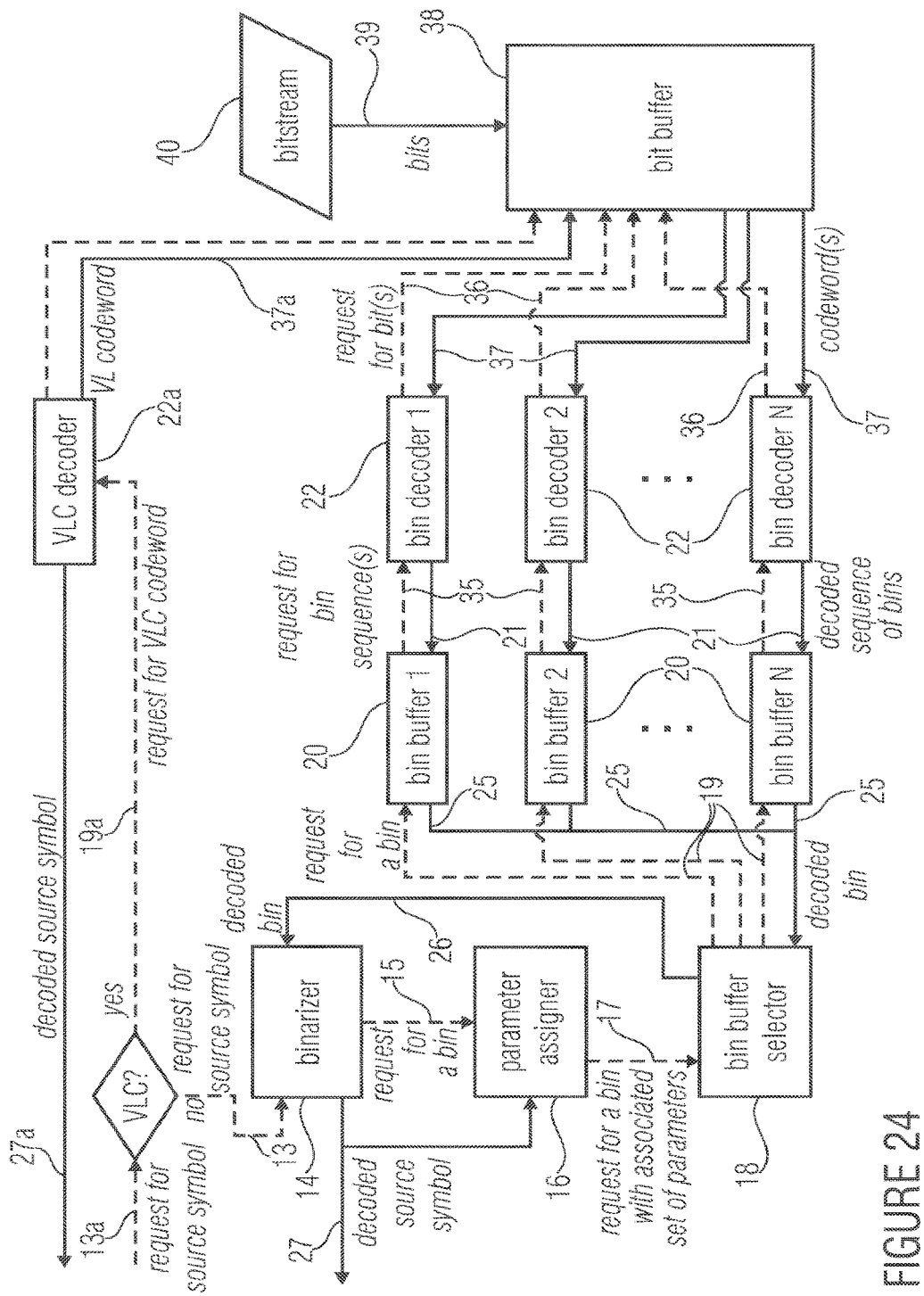
FIG. 24 shows a block diagram of an entropy decoding apparatus according to a further embodiment of the present application.

As far as the output of the entropy encoding apparatus of FIG. 1a is concerned, same is composed of the first bitstream 112 output by VLC encoder 102 and the plurality of second bitstreams 118 output by the plurality of entropy encoders 116. As further described below, all these bitstreams may be transmitted in parallel. Alternatively, same may be interleaved into a common bitstream 126 by use of an interleaver 128. The embodiments of FIGS. 22 to 24 show examples with such bitstream interleaving. As further shown in FIG. 1, the PIPE encoder 104 itself may comprise its own interleaver 130 in order to interleave the plurality of second bitstreams 118 into a common PIPE coded bitstream 132. Possibilities for such interleaver 130 are derivable from the following embodiments described with respect to FIGS. 5 to 13. Bitstream 132 and bitstream 112 may, in a parallel configuration, represent the output of the entropy encoding apparatus of FIG. 1a. Alternatively, another interleaver 134 may interleave both bitstreams in which case interleaver 130 and 134 would form two stages of one two-stage interleaver 128.

As has been described above, subdivider 100 may perform the subdivision syntax-element-wise, i.e. the source symbols the subdivider 100 operates on may be whole syntax elements, or alternatively speaking, subdivider 100 may operate in units of syntax elements.

However, according to an alternative embodiment, the entropy encoding apparatus of FIG. 1a may comprise decomposer 136 in order to decompose syntax elements within a parsable bitstream 138 individually into one or more of the source symbols of the source symbol sequence 106 entering subdivider 100. In particular, decomposer 136 may be configured to convert the sequence 138 of syntax elements into the sequence 106 of source symbols by individually decomposing each syntax element into a respective integer number of source symbols. The integer number may vary among the syntax elements. In particular, some of the syntax elements may even be left unchanged by decomposer 136, whereas other syntax elements are decomposed in exactly two, or at least two, source symbols. The subdivider 100 may be configured to forward one of the source symbols of such decomposed syntax elements to the first subsequence 108 of source symbols and another one of the source symbols of the same decomposed syntax element to the second subsequence 110 of source symbols. As mentioned above, the syntax elements within bitstream 138 may be of different type, and the decomposer 136 may be configured to perform the individual decomposing depending on the type of the syntax element. The decomposer 136 performs the individual decomposing of the syntax elements such that a predetermined unique reverse mapping later on used at the decoding side, from the integer number of source symbols to the respective syntax element, common for all syntax elements exists.

For example, the decomposer 136 may be configured to decompose syntax elements z in parsable bitstream 138, into two source symbols x and y so that z=x+y, z=x−y, z=x·y or z=x: y. By this measure, subdivider 100 may decompose the syntax elements into two components, namely source symbols of source symbol stream 106, one of which is suitable to be VLC encoded in terms of compression efficiency, such as x, and the other one of which is not suitable for VLC encoding and is, therefore, passed on to the second substream 110 rather than the first substream 108, such as y. The decomposition used by decomposer 136 needs not to be bijective. However, as mentioned before, there should exist a reverse mapping enabling a unique retrieval of the syntax elements of the possible decompositions among which decomposer 136 may choose if the decomposition is not bijective.

Up to now, different possibilities have been described for the handling of different syntax elements. As to whether such syntax elements or cases exist, is optional. The embodiments described herein below, however, concentrate on syntax elements which are decomposed by decomposer 136 according to the following principle.

Figure 1B:
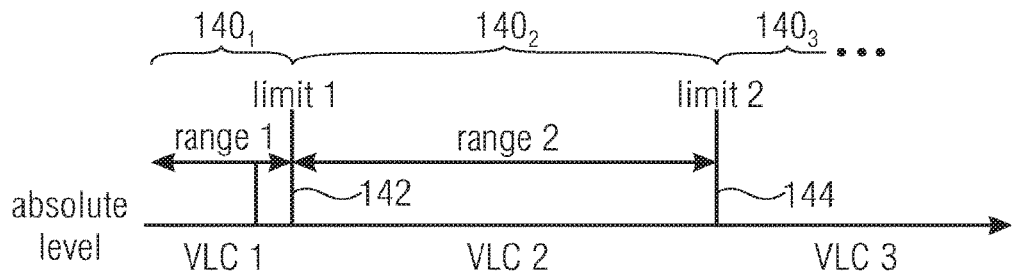
FIG. 1b shows a schematic diagram illustrating a possible decomposition of syntax elements into source symbols according to an embodiment.
Figure 1C:
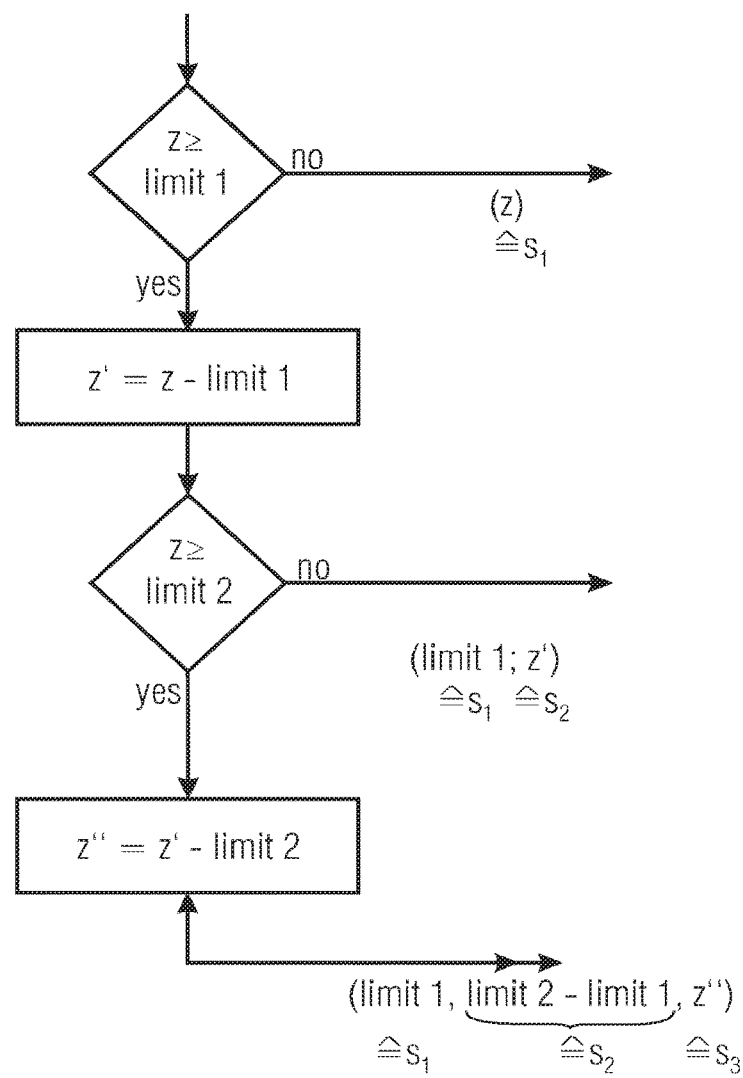
FIG. 1c shows a flow diagram illustrating a possible mode of operation of decomposer of FIG. 1a in decomposing syntax elements into source symbols according to an embodiment.

As shown in FIG. 1b, the decomposer 136 is configured to decompose certain syntax elements z in parsable bitstream 138 in stages. Two or more stages may exist. The stages are for dividing the value range of syntax element z into two or more adjacent subintervals or sub-ranges as shown in FIG. 1c. The value range of syntax element may have two infinite endpoints, merely one or may have definite endpoints. In FIG. 1c, the value range of syntax element is exemplarily sub-divided into three partitions $140_{1-3}$. As shown in FIG. 1b, if the syntax element is greater or equal than the bound 142 of the first partition $140_1$, i.e. the upper limit separating partitions $140_1$ and $140_2$, then the syntax element is subtracted by the bound limit1 of the first partition $140_1$ and z is again checked as to whether same is even greater or equal than the bound 144 of the second partition $140_2$, i.e. the upper limit separating partitions $140_2$ and $140_3$. If z' is greater or equal than the bound 144, then z' is subtracted by the bound limit2 of the second partition $140_2$ resulting in z''. In the first case where z is smaller than limit1, the syntax element z is sent to subdivider 100 in plain. In case of z being between limit1 and limit2, the syntax element z is sent to subdivider 100 in as a tuple (limit1, z') with z=limit1+z', and in case of z being above limit2, the syntax element z is sent to subdivider 100 in as a triplet (limit1, limit2−limit1, z') with z=limit1+limit2+z'. The first (or sole) component, i.e. z or limit1, forms a first source symbol to be coded by subdivider 100, the second component, i.e. z' or limit2−limit1, forms a second source symbol to be coded by subdivider 100, if present, and the third component, i.e. z'', forms a third source symbol to be coded by subdivider 100, if present. Thus, in accordance with the embodiment of FIGS. 1b and 1c, the syntax element is mapped to any of 1 to 3 source symbols, but generalizations onto a less or more maximum number of source symbols is readily derivable from the above description, and such alternatives will also be described in the following.

In any case, all these different components or resulting source symbols are according to the below embodiments, coded with coding alternatives among. At least one of them is forwarded by subdivider to PIPE coder 104, and at last another one thereof is sent to VLC coder 102.

Particular advantageous embodiments are outlined in more detail below.

Figure 2A:
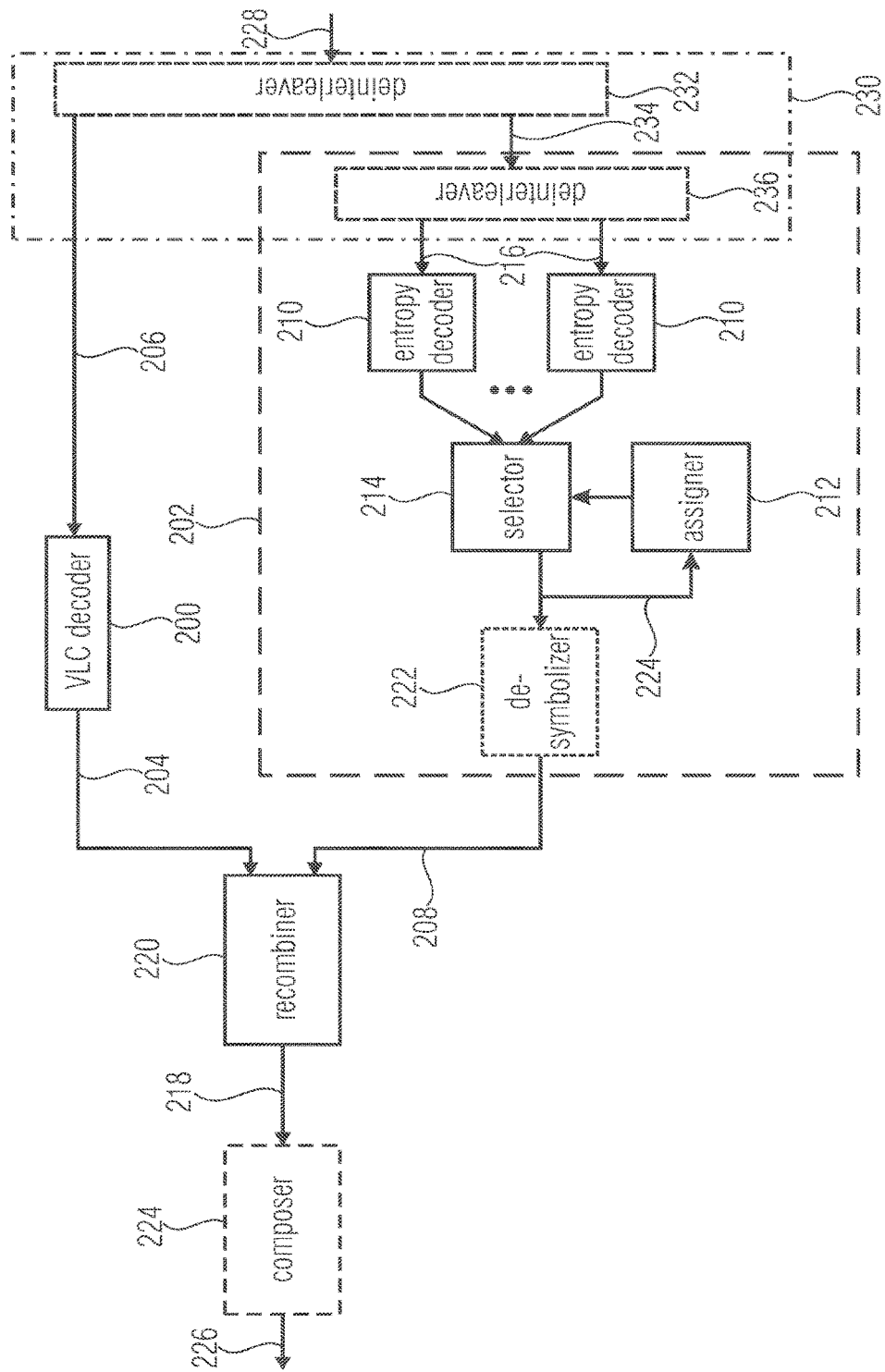
FIG. 2a shows a block diagram of an entropy decoding apparatus according to an embodiment.

After having described above an embodiment for an entropy encoding apparatus, an embodiment for an entropy decoding apparatus is described with respect to FIG. 2a. The entropy decoding apparatus of FIG. 2a comprises a VLC decoder 200 and a PIPE decoder 202. The VLC decoder 200 is configured to code-wisely reconstruct source symbols of a first subsequence 204 from codewords of a first bitstream 206. The first bitstream 206 is equal to bitstream 112 of FIG. 1, and the same applies to subsequence 204 as far as subsequence 108 of FIG. 1a is concerned. The PIPE decoder 202 is configured to reconstruct a second subsequence 208 of source symbols, represented in the form of a sequence of alphabet symbols, and comprises a plurality of entropy decoders 210, an assigner 212 and a selector 214. The plurality of entropy decoders 210 are configured to convert a respective one of second bitstreams 216 into alphabet symbols of the sequence of alphabet symbols. The assigner 212 is configured to assign a measure of an estimate of a probability distribution among the possible values the respective alphabet symbols may assume, to each alphabet symbol of the sequence of alphabet symbols representing the second subsequence 208 of source symbols to be reconstructed, based on information contained within previously reconstructed alphabet symbols of the sequence of alphabet symbols. To this end, assigner 212 may be serially connected between an output of selector 214 and an input thereof, while further inputs of selector 214 have outputs of the entropy decoders 210 respectively connected thereto. The selector 214 is configured to retrieve each alphabet symbol of the sequence of alphabet symbols from a selected one of the plurality of entropy decoders 210, the selection depending on the measure assigned to the respective alphabet symbol. In other words, the selector 214 along with the assigner 212 is operative to retrieve the alphabet symbols obtained by entropy decoders 210 in an order among the entropy decoders 210 obtained by surveying information contained within previous alphabet symbols of the sequence of alphabet symbols. In even other words, assigner 212 and selector 214 are able to reconstruct the original order of the alphabet symbols from alphabet symbol to alphabet symbol. Along with forecasting the next alphabet symbol, assigner 212 is able to determine the afore-mentioned measure of the estimate of the probability distribution for the respective alphabet symbol by use of which selector 214 selects among the entropy decoders 210 to retrieve the actual value of this alphabet symbol. To be even more precise, an as will be described in more detail below, the PIPE decoder 202 may be configured to reconstruct the subsequence 208 of source symbols, represented in form of the sequence of alphabet symbols, responsive to alphabet symbol requests sequentially requesting for the alphabet symbols, and the an assigner 212 may be configured to assign to each request for an alphabet symbol of the sequence of alphabet symbols representing the second subsequence (208) of source symbols to be reconstructed, the afore-mentioned measure of an estimate of a probability distribution among the possible values the respective alphabet symbol may assume. Accordingly, the selector 214 may be configured to retrieve, for each request for an alphabet symbol of the sequence of alphabet symbols representing the second subsequence (208) of source symbols to be reconstructed, the respective alphabet symbol of the sequence of alphabet symbols from a selected one of the plurality of entropy decoders 210, the selection depending on the measure assigned to the respective request for the respective alphabet symbol. The concordance between requests at the decoding side on the one hand, and the data flow or encoding at the encoding side on the other hand will be outlined in more detail with respect to FIG. 4.

As the first subsequence 214 of source symbols and the second subsequence 208 of source symbols commonly form one common sequence 210 of source symbols, the entropy decoding apparatus of FIG. 2a may, optionally, comprise a recombiner 220 configured to recombine the first subsequence 204 and the second subsequence 208 to obtain the common sequence 218 of source symbols. This common sequence 208 of source symbols yields a reconstruction of sequence 106 of FIG. 1a.

In accordance with the description presented above with respect to FIG. 1, the source symbols of the first and second subsequences 204 and 208 may be syntax elements of a parsable bitstream. In this case, recombiner 220 could be configured to reconstruct this parsable bitstream of the sequence 218 of syntax elements by interleaving the source symbols arriving via first and second subsequences 204 and 208 in an order prescribed by some parsing rule defining an order among the syntax elements. In particular, the syntax elements may be, as described above, of different type and the recombiner 220 may be configured to retrieve or request syntax elements of a first group of types from the VLC decoder 200 via substream 204, and syntax elements of a second type from the PIPE decoder 202 via substream 208. Accordingly, whenever the just-mentioned parsing rule indicates that a syntax element of a type within the first group is the next in line, recombiner 202 inserts an actual source symbol of subsequence 204 into common sequence 218, and from subsequence 208 otherwise.

Likewise, the PIPE decoder 202 could comprise a desymbolizer 222 connected between the output of selector 214 and an input of recombiner 220. Similar to the description above with respect to FIG. 1, desymbolizer 222 could be regarded as being external to the PIPE decoder 202 and could be even arranged behind recombiner 202, i.e. at the output side of recombiner 220, alternatively. The desymbolizer 222 could be configured to remap, in units of partial sequences of alphabet symbols, the sequence of alphabet symbols 224 output by selector 214 into the source symbols, i.e. syntax elements of subsequence 208. Similar to recombiner 220, desymbolizer 222 knows about the construction of possible partial sequences of alphabet symbols. In particular, desymbolizer 222 may analyze recently received alphabet symbols from selector 214 in order to ascertain as to whether these recently received alphabet symbols yield a valid partial sequence of alphabet symbols associated with a respective value of the respective syntax element, or as to whether this is not the case, and which alphabet symbol is missing next. In even other words, the symbolizer 222 knows, at any time, as to whether further alphabet symbols have to be received from selector 214 in order to finish the reception of a respective syntax element or not, and accordingly, to which syntax element a respective one of the alphabet symbols output by selector 214 belongs. To this end, the desymbolizer 222 may use a symbolizing (de) mapping scheme differing for syntax elements of different type. Similarly, assigner 212 knows about the association of a current alphabet symbol to be retrieved from any of the entropy decoders 210 by selector 214, to a respective one of the syntax elements and may set the above-mentioned measure of estimation of a probability distribution of this alphabet symbol accordingly, i.e. depending on the associated syntax element type. Even further, assigner 212 may be differentiate between different alphabet symbols belonging to the same partial sequence of a current alphabet symbol and may set the measure of estimate of probability distribution differently for these alphabet symbols. Details in this regard are described in more detail below. As describe therein, assigner 212 may be configured to assign contexts to the alphabet symbols. The assignment may be dependent on the syntax element type and/or the position within the partial sequence of alphabet symbols of the current syntax element. As soon as assigner 212 has assigned a context to a current alphabet symbol to be retrieved from any of the entropy decoders 210 by selector 214, alphabet symbol may inherently have the measure of estimate of probability distribution associated therewith as each context has its measure of estimate associated therewith. Further, the context—and its associated measure of estimate of probability distribution—may be adapted according to the actual statistics of the alphabet symbols of the respective context having been retrieved from the entropy decoders 210 so far. Details in this regard are presented in more detail below.

Similar to the above discussion of FIG. 1, it may be possible that the correspondence between the afore-mentioned source symbols of subsequences 204 and 208 in syntax elements is not a one-to-one correspondence. Rather, the syntax elements may have been decomposed into an integer number of sources symbols with the number, eventually, varying among the syntax elements, but being, in any case, greater than one at least for one syntax element. As noted above, the following embodiments focus on the handling of these kind of syntax elements, and syntax elements of other kinds may even not be present.

For handling the just mentioned syntax elements, the entropy decoding apparatus of FIG. 2a may comprise a composer 224 configured to redo the decomposition performed by decomposer 136 of FIG. 1a. In particular, composer 224 may be configured to compose the sequence 226 of syntax elements from the source symbols of sequence 218 or, if the recombiner 220 is missing, subsequences 204 and 208, by individually composing each syntax element from a respective integer number of source symbols with one of the source symbols of the integer number of source symbols belonging to the first subsequence 204 and another one of the source symbols of the integer number of sources symbols of the same syntax element belonging to the second subsequence 208. By this measure, certain syntax elements may have been decomposed at the encoder side so as to separate components suitable for VLC decoding from a remaining component having to be passed through the PIPE decoding path. Similar to the above discussion, the syntax element may be of different type and the composer 224 may be configured to perform the individual composition depending on the type of the syntax elements. In particular, composer 224 may be configured to obtain the respective syntax elements by logically or mathematically combining the integer number of source symbols of the respective syntax element. For example, composer 224 may be configured, for each syntax element, apply+, −, : or · to first and second source symbols of one syntax element.

As described above, the embodiments described herein below, however, concentrate on syntax elements which are decomposed by decomposer 136 according to FIGS. 1b and 1c and the alternatives described regarding thereto. FIG. 2a shows as to how composer 224 may function to reconstruct these syntax elements from their source symbols 218.

Figure 2B:
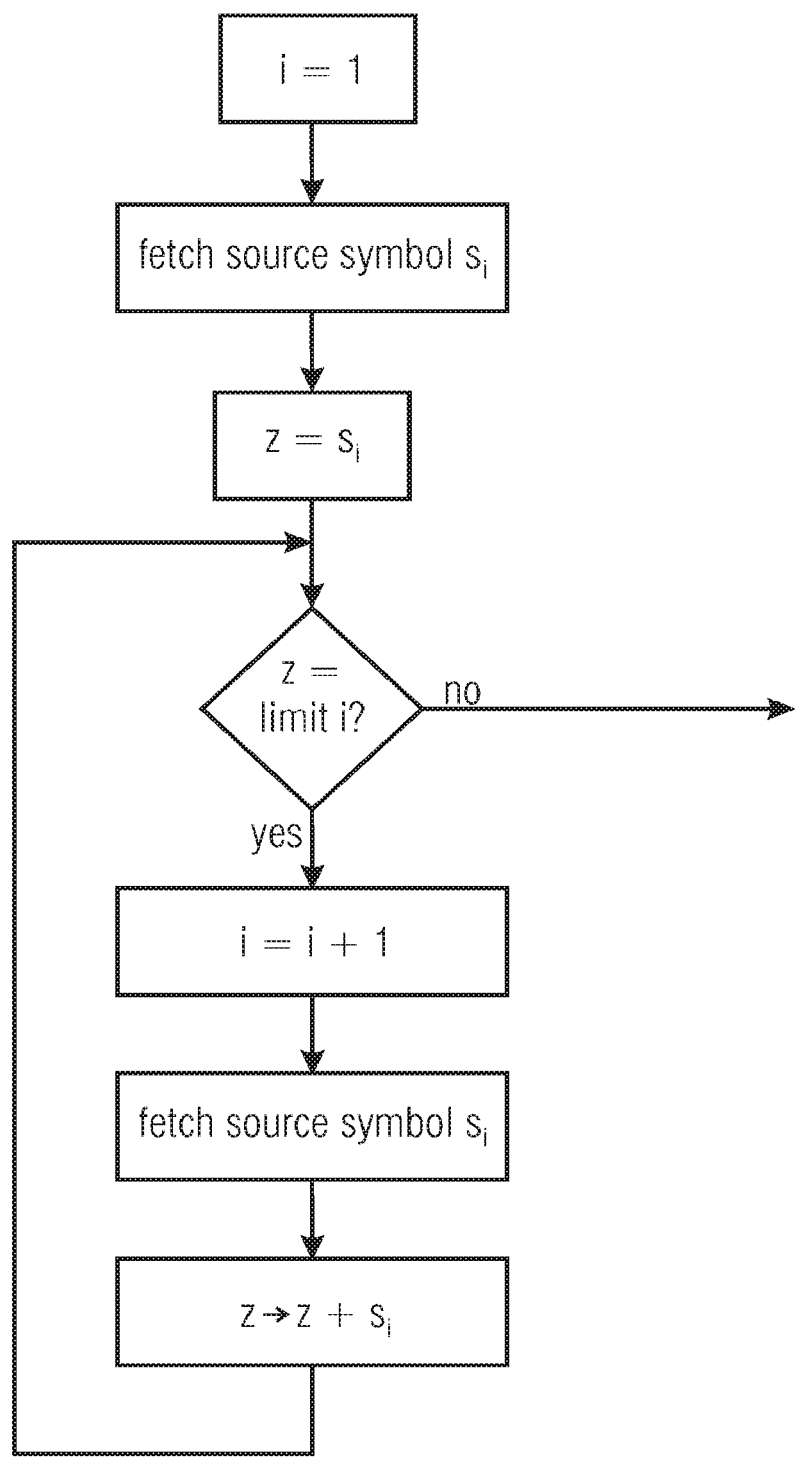
FIG. 2b shows a flow diagram illustrating a possible mode of operation of composer of FIG. 2a in composing syntax elements from source symbols according to an embodiment.

As shown in FIG. 2b, the composer 224 is configured to compose such syntax elements z in stages from incoming source symbols $s_1$ to $s_x$ with x being any of 1 to 3 in the present example. Two or more stages may exist. As shown in FIG. 2b, composer 224 preliminarily sets z to be the first symbol s1 and checks as to whether z is equal to the first limit1. If this is not case, z has been found. Otherwise, composer 224 adds the next source symbol $s_2$ of source symbol stream 218 to z and again checks as to whether this z equals limit2. If not, z has been found. If not, composer 224 adds the next source symbol s3 of source symbol stream 218 to z, in order to obtain z in its final form. Generalizations onto a less or more maximum number of source symbols is readily derivable from the above description, and such alternatives will also be described in the following.

In any case, all these different components or resulting source symbols are according to the below embodiments, coded with coding alternatives among. At least one of them is forwarded by subdivider to PIPE coder 104, and at last another one thereof is sent to VLC coder 102.

Particular advantageous embodiments are outlined in more detail below. These Details concentrate on favorable possibilities of dividing the value range of the syntax elements and the entropy VLC and PIPE coding schemes which may be used to encode the source symbols.

Further, as has also been described above with respect to FIG. 1, the entropy decoding apparatus of FIG. 2a may be configured to receive the first bitstream 206 as well as the plurality of second bitstreams 216 separately or in an interleaved form by way of an interleaved bitstream 228. In the latter case, entropy decoding apparatus of FIG. 2a may comprise a deinterleaver 230 configured to deinterleave the interleaved bitstream 228 to obtain the first bitstream 206 on the one hand and the plurality of second bitstreams 216 on the other hand. Similar to the above discussion of FIG. 1, the deinterleaver 230 may be subdivided into two stages, namely a deinterleaver 232 for deinterleaving the interleaved bitstream 228 into two parts, namely bitstream 206 on the one hand and an interleaved form 234 of the second bitstream 216 on the other hand, and a deinterleaver 236 for deinterleaving the latter bitstream 234 to obtain the individual bitstreams 216.

Thus, FIG. 1a and FIG. 2a showed an entropy encoding apparatus on the one hand and an entropy decoding apparatus suitable for decoding the encoding result obtained by the entropy encoding apparatus of FIG. 1, on the other hand. Details regarding many of the elements shown in FIGS. 1a and 2 are described in more detail with regard to the further figures. Accordingly, reference is made to these details in the following description and these details shall be regarded as also applying to the embodiments of FIGS. 1a and 2 individually, as far as these details are separately implementable in the above-described embodiments. Merely with respect to the interleavers and deinterleavers 132 and 234, some additional notice is made here. In particular, interleaving of the bitstreams 112 and 118 may be favorable in case the bitstreams have to be multiplexed into one channel in order to be transmitted. In this case, it may be favorable to interleave the VLC bitstream 112 on the one hand and the PIPE encoding bitstreams 118 on the other hand so as to obey certain conditions to be met such as obeying some maximum decoding delay. In even other words, it may be necessitated that the relative time displacement between the times the syntax elements and source symbols, respectively, are retrievable at the decoding side on the one hand and the relative displacement in time in accordance with their position in the parsable bitstream on the other hand, does not exceed a certain maximum delay. Many alternatives for solving this problem are described below. One of these possibilities involves the entropy encoders 116 to be of a variable length coder type configured to map alphabet symbol sequences to codewords, and the entropy decoders 210 to do the reverse mapping. The codewords of VLC bitstream 112 and PIPE bitstreams 118 may be, but do not have to be, selected such that no codeword of any of these bitstreams is prefix of any codeword of any of the other bitstreams, so that the codeword borders remain uniquely determinable at the decoder side. In any case, the interleaver 128 may be configured to reserve and buffer a sequence of codeword entries for the codeword within the first bitstream 112 and the second bitstream 118 in a sequential order depending on an order in which the alphabet symbols of the sequence 124 of alphabet symbols forwarded by the selector 120 to the plurality of entropy encoders 116 result in a beginning of a new alphabet symbol sequence to be mapped to a respective codeword at the respective entropy encoder 116 and a new source symbol of the second substream 108 is mapped by the VLC encoder 102, respectively. In other words, interleaver 128 inserts the codewords of bitstream 112 into the common bitstream 126 in the order of the source symbols from which they have been obtained by VLC encoding, in their order within substream 108 and source symbol stream 106, respectively. Codewords output by entropy encoders 116 are inserted into the common bitstream 126 between consecutive ones of the codewords of the VLC bitstream 112. Owing to the PIPE encoding categorization of the alphabet symbols by assigner 114 and selector 120, respectively, each of the codewords of the entropy encoders 116 have alphabet symbols of different source symbols of substream 110 encoded therein. The position of the codewords of the PIPE encoded bitstreams 118 within the common bitstream 126 among each other and relative to the VLC codeword of bitstream 112 is determined by the first alphabet symbol encoded in each codeword, respectively, i.e. the oldest one in time. The order of these primary alphabet symbols encoded into the codewords of bitstreams 118 in the alphabet symbol stream 124 determines the order of the codewords of bitstreams 118 within the common bitstream 126 among each other; relative to the VLC codewords of bitstream 112, the source symbol to which these primary alphabet symbols encoded into the codewords of bitstreams 118 belong, determine between which consecutive codewords of bitstream 112 the respective codeword of any of bitstreams 118 is to be positioned. In particular, the consecutive VLC codewords between which the respective codeword of any of bitstreams 118 is to be positioned, are those between which the source symbol of substream 110 is positioned in accordance with the original order of un-subdivided source symbol stream 106, to which the respective primary alphabet symbol encoded into the respective codeword of bitstreams 118 belongs. The interleaver 128 may be configured to remove codewords entered into the afore-mentioned codeword entries in sequential order to obtain the common bitstream 126 of interleaved codewords. As has already been described above, the entropy encoders 116 may be configured to sequentially enter their codewords into the codeword entries reserved for the respective entropy encoder 116 and the selector 120 may be configured to forward the alphabet symbols representing the source symbols of the second substream 110 in an order maintaining an order in which the source symbols of the first substream 108 and the second substream 110 were interleaved within the sequence 106 of source symbols.

Additional measures may be provided in order to cope with situations where certain ones of the entropy encoders 116 are selected such seldom that it takes too long a time to obtain a valid codeword within that very rarely used entropy encoder 116. Examples for such measures are described in more detail below. In particular, the interleaver 128 along with the entropy encoder 116 may, in this case, be configured to flush their alphabet symbols collected so far and codewords having been entered into the afore-mentioned codeword entries, respectively, in a manner so that the time of this flushing procedure may be forecasted or emulated at the decoding side.

At the decoding side, the deinterleaver 230 may act in the reverse sense: whenever, in accordance with the aforementioned parsing scheme, the next source symbol to be decoded, is a VLC coded symbol, a current codeword within common bitstream 228 is regarded as a VLC codeword and forwarded within bitstream 206 to VLC decoder 200. On the other hand, whenever any of the alphabet symbols belonging to any of the PIPE encoded symbols of substream 208 is a primary alphabet symbol, i.e. necessitates a new mapping of a codeword of a respective one of the bitstreams 216 to a respective alphabet symbol sequence by the respective entropy decoder 210, the current codeword of common bitstream 228 is regarded as a PIPE encoded codeword and forwarded to the respective entropy decoder 210. The detection of the next codeword border, i.e. the detection of the extension of the next codeword from the end of the codeword just having been forwarded to any of the decoders 200 and 202, respectively, to its end within the inbound interleaved bitstream 228 may be deferred, and be performed under knowledge of, the decoder 200 and 202 being the dedicated recipient of this next codeword in accordance with the above-outlined rule: based on this knowledge, the codebook used by the recipient decoder is known and the respective codeword detectable. If, on the other hand, the codebooks would be designed such that the codeword borders would be detectable without the a-priori knowledge about the recipient decoder among 200 and 202, then the codeword separation could be performed in parallel. In any case, due to the interleaving, the source symbols are available at the decoder in an entropy decoded form, i.e. as source symbols, in their correct order at reasonable delay.

After having described above embodiments for an entropy encoding apparatus and a respective entropy decoding apparatus, next more detailed embodiments for the above-mentioned PIPE encoders and PIPE decoders are described.

Figure 3:
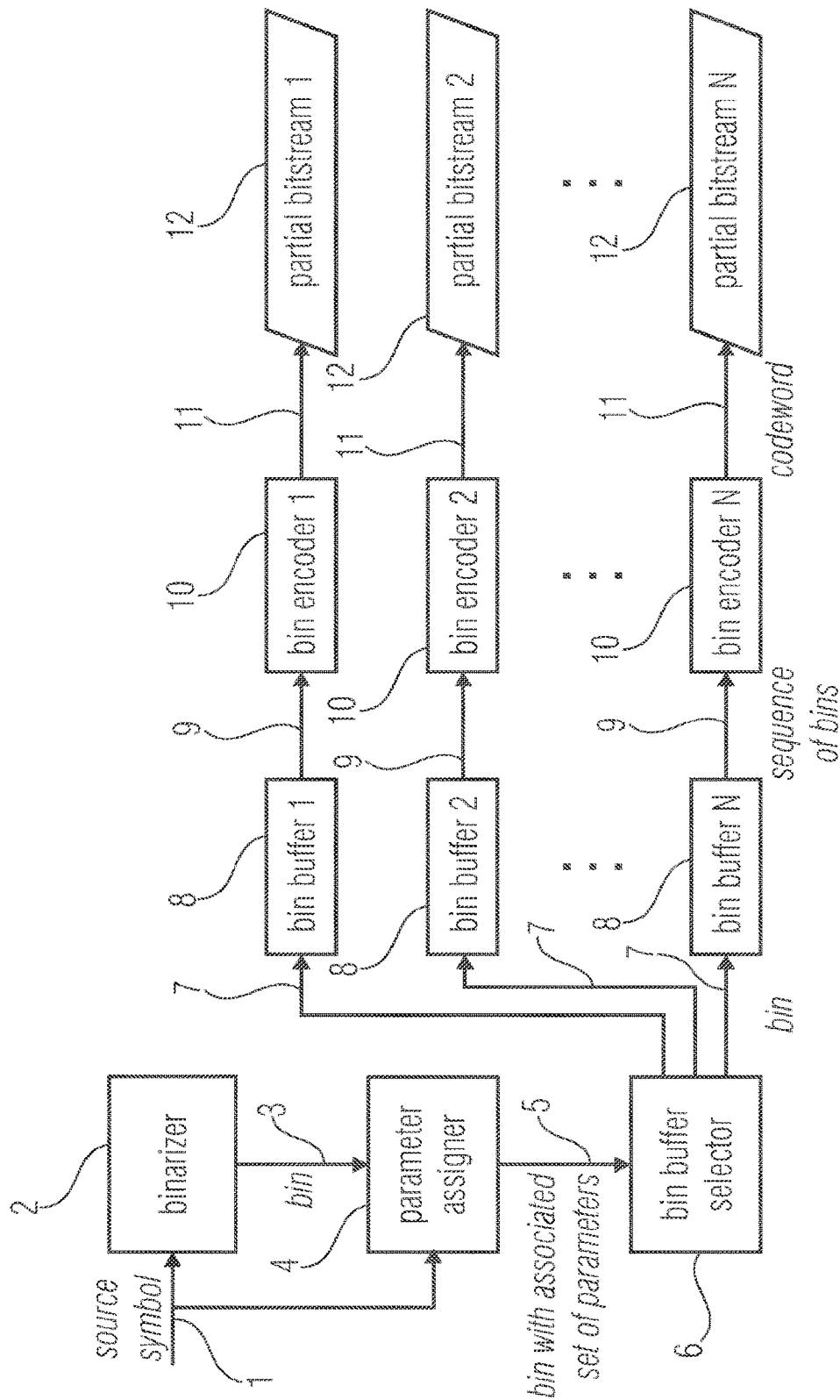
FIG. 3 shows a block diagram of a PIPE encoder according to an embodiment which may be used in FIG. 1.

A PIPE encoder according to an embodiment is illustrated in FIG. 3. Same may be used as PIPE encoder in FIG. 1a. The PIPE encoder losslessly converts a stream of source symbols 1 into a set of two or more partial bitstreams 12. Each source symbol 1 may be associated with a category or type of a set of one or more categories or types. As an example, the categories can specify the type of the source symbol. In the context of hybrid video coding, a separate category may be associated with macroblock coding modes, block coding modes, reference picture indices, motion vector differences, subdivision flags, coded block flags, quantization parameters, transform coefficient levels, etc. In other application areas such as audio, speech, text, document, or general data coding, different categorizations of source symbols are possible.

In general, each source symbol can take a value of a finite or countable infinite set of values, where the set of possible source symbol values can differ for different source symbol categories. For reducing the complexity of the encoding and decoding algorithm and for allowing a general encoding and decoding design for different source symbols and source symbol categories, the source symbols 1 are converted into ordered sets of binary decisions and these binary decisions are then processed by simple binary coding algorithms. Therefore, the binarizer 2 bijectively maps the value of each source symbol 1 onto a sequence (or string) of bins 3. The sequence of bins 3 represents a set of ordered binary decisions. Each bin 3 or binary decision can take one value of a set of two values, e.g. one of the values 0 and 1. The binarization scheme can be different for different source symbol categories. The binarization scheme for a particular source symbol category can depend on the set of possible source symbol values and/or other properties of the source symbols for the particular category. Table 1 illustrates three example binarization schemes for countable infinite sets. Binarization schemes for countable infinite sets can also be applied for finite sets of symbol values. In particular for large finite sets of symbols values, the inefficiency (resulting from unused sequences of bins) can be negligible, but the universality of such binarization schemes provides an advantage in terms of complexity and memory requirements. For small finite sets of symbol values, it is often advantageous (in terms of coding efficiency) to adapt the binarization scheme to the number of possible symbol values. Table 2 illustrates three example binarization schemes for finite sets of 8 values. Binarization schemes for finite sets can be derived from the universal binarization schemes for countable infinite sets by modifying some sequences of bins in a way that the finite sets of bin sequences represent a redundancy-free code (and potentially reordering the bin sequences). As an example, the truncated unary binarization scheme in Table 2 was created by modifying the bin sequence for the source symbol 7 of the universal unary binarization (see Table 1). The truncated and reordered Exp-Golomb binarization of order 0 in Table 2 was created by modifying the bin sequence for the source symbol 7 of the universal Exp-Golomb order 0 binarization (see Table 1) and by reordering the bin sequences (the truncated bin sequence for symbol 7 was assigned to symbol 1). For finite sets of symbols, it is also possible to use non-systematic I non-universal binarization schemes, as exemplified in the last column of Table 2.

TABLE 1

Binarization examples for countable infinite sets (or large finite sets).

| symbol value | unary binarization | Exp-Golomb order 0 binarization | Exp-Golomb order 1 binarization |
|---|---|---|---|
| 0 | 1 | 1 | 10 |
| 1 | 01 | 010 | 11 |
| 2 | 001 | 011 | 0100 |
| 3 | 0001 | 0010 0 | 0101 |
| 4 | 0000 1 | 0010 1 | 0110 |
| 5 | 0000 01 | 0011 0 | 0111 |
| 6 | 0000 001 | 0011 1 | 0010 00 |
| 7 | 0000 0001 | 0001 000 | 0010 01 |
| ... | ... | ... | ... |

TABLE 2

Binarization examples for finite sets.

| symbol value | truncated unary binarization | truncated and reordered Exp-Golomb order 0 binarization | non-systematic binarization |
|---|---|---|---|
| 0 | 1 | 1 | 000 |
| 1 | 01 | 000 | 001 |
| 2 | 001 | 010 | 01 |
| 3 | 0001 | 011 | 1000 |
| 4 | 0000 1 | 0010 0 | 1001 |
| 5 | 0000 01 | 0010 1 | 1010 |
| 6 | 0000 001 | 0011 0 | 1011 0 |
| 7 | 0000 000 | 0011 1 | 1011 1 |

Each bin 3 of the sequence of bins created by the binarizer 2 is fed into the parameter assigner 4 in sequential order. The parameter assigner assigns a set of one or more parameters to each bin 3 and outputs the bin with the associated set of parameters 5. The set of parameters is determined in exactly the same way at encoder and decoder. The set of parameters may consist of one or more of the following parameters:
- a measure for an estimate of the probability for one of the two possible bin values for the current bin,
- a measure for an estimate of the probability for the less probable or more probable bin value for the current bin,
- an identifier specifying an estimate for which of the two possible bin values represents the less probable or more probable bin value for the current bin,
- the category of the associated source symbol,
- a measure for the importance of the associated source symbol,
- a measure for the location of the associated symbol (e.g. in temporal, spatial, or volumetric data sets),
- an identifier specifying the channel code protection for the bin or the associated source symbol,
- an identifier specifying the encryption scheme for the bin or the associated source symbol,
- an identifier specifying a class for the associated symbol,
- the bin number in the sequence of bins for the associated source symbol.

In an embodiment, the parameter assigner 4 associates each bin 3, 5 with a measure for an estimate of the probability for one of the two possible bin values for the current bin. The parameter assigner 4 associates each bin 3, 5 with a measure for an estimate of the probability for the less probable or more probable bin value for the current bin and an identifier specifying an estimate for which of the two possible bin values represents the less probable or more probable bin value for the current bin. It should be noted that the probability for the less probable or more probable bin value and the identifier specifying which of the two possible bin values represents the less probable or more probable bin value are equivalent measures for the probability of one of the two possible bin values.

In a further embodiment, the parameter assigner 4 associates each bin 3,5 with a measure for an estimate of the probability for one of the two possible bin values for the current bin and one or more further parameters (which may be one or more of the above listed parameters). In a further embodiment, the parameter assigner 4 associates each bin 3,5 with a measure for an estimate of the probability for the less probable or more probable bin value for the current bin, an identifier specifying an estimate for which of the two possible bin values represents the less probable or more probable bin value for the current bin, and one or more further parameters (which may be one or more of the above listed parameters).

In an embodiment, the parameter assigner 4 determines one or more of the above mentioned probability measures (measure for an estimate of the probability for one of the two possible bin values for the current bin, measure for an estimate of the probability for the less probable or more probable bin value for the current bin, identifier specifying an estimate for which of the two possible bin values represents the less probable or more probable bin value for the current bin) based on a set of one or more already encoded symbols. The encoded symbols that are used for determining the probability measures can include one or more already encoded symbols of the same symbol category, one or more already encoded symbols of the same symbol category that correspond to data sets (such as blocks or groups of samples) of neighboring spatial and/or temporal locations (in relation to the data set associated with the current source symbol), or one or more already encoded symbols of different symbol categories that correspond to data sets of the same and/or neighboring spatial and/or temporal locations (in relation to the data set associated with the current source symbol).

Each bin with an associated set of parameters 5 that is output of the parameter assigner 4 is fed into a bin buffer selector 6. The bin buffer selector 6 potentially modifies the value of the input bin 5 based on the input bin value and the associated parameters 5 and feds the output bin 7—with a potentially modified value—into one of two or more bin buffers 8. The bin buffer 8 to which the output bin 7 is sent is determined based on the value of the input bin 5 and/or the value of the associated parameters 5.

In an embodiment, the bin buffer selector 6 does not modify the value of the bin, i.e., the output bin 7 has the same value as the input bin 5.

In a further embodiment, the bin buffer selector 6 determines the output bin value 7 based on the input bin value 5 and the associated measure for an estimate of the probability for one of the two possible bin values for the current bin. In an embodiment, the output bin value 7 is set equal to the input bin value 5 if the measure for the probability for one of the two possible bin values for the current bin is less than (or less than or equal to) a particular threshold; if the measure for the probability for one of the two possible bin values for the current bin is greater than or equal to (or greater than) a particular threshold, the output bin value 7 is modified (i.e., it is set to the opposite of the input bin value). In a further embodiment, the output bin value 7 is set equal to the input bin value 5 if the measure for the probability for one of the two possible bin values for the current bin is greater than (or greater than or equal to) a particular threshold; if the measure for the probability for one of the two possible bin values for the current bin is less than or equal to (or less than) a particular threshold, the output bin value 7 is modified (i.e., it is set to the opposite of the input bin value). In an embodiment, the value of the threshold corresponds to a value of 0.5 for the estimated probability for both possible bin values.

The bin buffer selector 6 may determine the output bin value 7 based on the input bin value 5 and the associated identifier specifying an estimate for which of the two possible bin values represents the less probable or more probable bin value for the current bin. In an embodiment, the output bin value 7 is set equal to the input bin value 5 if the identifier specifies that the first of the two possible bin values represents the less probable (or more probable) bin value for the current bin, and the output bin value 7 is modified (i.e., it is set to the opposite of the input bin value) if identifier specifies that the second of the two possible bin values represents the less probable (or more probable) bin value for the current bin.

The bin buffer selector 6 may determine the bin buffer 8 to which the output bin 7 is sent based on the associated measure for an estimate of the probability for one of the two possible bin values for the current bin. In an embodiment, the set of possible values for the measure for an estimate of the probability for one of the two possible bin values is finite and the bin buffer selector 6 contains a table that associates exactly one bin buffer 8 with each possible value for the estimate of the probability for one of the two possible bin values, where different values for the measure for an estimate of the probability for one of the two possible bin values can be associated with the same bin buffer 8. In a further embodiment, the range of possible values for the measure for an estimate of the probability for one of the two possible bin values is partitioned into a number of intervals, the bin buffer selector 6 determines the interval index for the current measure for an estimate of the probability for one of the two possible bin values, and the bin buffer selector 6 contains a table that associates exactly one bin buffer 8 with each possible value for the interval index, where different values for the interval index can be associated with the same bin buffer 8. In an embodiment, input bins 5 with opposite measures for an estimate of the probability for one of the two possible bin values (opposite measure are those which represent probability estimates P and 1–P) are fed into the same bin buffer 8. In a further embodiment, the association of the measure for an estimate of the probability for one of the two possible bin values for the current bin with a particular bin buffer is adapted over time, e.g. in order to ensure that the created partial bitstreams have similar bit rates.

The bin buffer selector 6 may determine the bin buffer 8 to which the output bin 7 is sent based on the associated measure for an estimate of the probability for the less probable or more probable bin value for the current bin. In an embodiment, the set of possible values for the measure for an estimate of the probability for the less probable or more probable bin value is finite and the bin buffer selector 6 contains a table that associates exactly one bin buffer 8 with each possible value of the estimate of the probability for the less probable or more probable bin value, where different values for the measure for an estimate of the probability for the less probable or more probable bin value can be associated with the same bin buffer 8. In a further embodiment, the range of possible values for the measure for an estimate of the probability for the less probable or more probable bin value is partitioned into a number of intervals, the bin buffer selector 6 determines the interval index for the current measure for an estimate of the probability for the less probable or more probable bin value, and the bin buffer selector 6 contains a table that associates exactly one bin buffer 8 with each possible value for the interval index, where different values for the interval index can be associated with the same bin buffer 8. In a further embodiment, the association of the measure for an estimate of the probability for the less probable or more probable bin value for the current bin with a particular bin buffer is adapted over time, e.g. in order to ensure that the created partial bitstreams have similar bit rates.

Each of the two or more bin buffers 8 is connected with exactly one bin encoder 10 and each bin encoder is only connected with one bin buffer 8. Each bin encoder 10 reads bins from the associated bin buffer 8 and converts a sequence of bins 9 into a codeword 11, which represents a sequence of bits. The bin buffers 8 represent first-in-first-out buffers; bins that are fed later (in sequential order) into a bin buffer 8 are not encoded before bins that are fed earlier (in sequential order) into the bin buffer. The codewords 11 that are output of a particular bin encoder 10 are written to a particular partial bitstream 12. The overall encoding algorithm converts source symbols 1 into two or more partial bitstreams 12, where the number of partial bitstreams is equal to the number of bin buffers and bin encoders. In an embodiment, a bin encoder 10 converts a variable number of bins 9 into a codeword 11 of a variable number of bits. One advantage of the above- and below-outlined PIPE coding embodiments is that the encoding of bins can be done in parallel (e.g. for different groups of probability measures), which reduces the processing time for several implementations.

Another advantage of PIPE coding is that the bin encoding, which is done by the bin encoders 10, can be specifically designed for different sets of parameters 5. In particular, the bin encoding and encoding can be optimized (in terms of coding efficiency and/or complexity) for different groups of estimated probabilities. On the one hand side, this allows a reduction of the encoding/decoding complexity relative to arithmetic coding algorithms with similar coding efficiency. On the other hand side, it allows an improvement of the coding efficiency relative to VLC coding algorithms with similar encoding/decoding complexity. In an embodiment, the bin encoders 10 implement different encoding algorithms (i.e. mapping of bin sequences onto codewords) for different groups of measures for an estimate of the probability for one of the two possible bin values 5 for the current bin. In a further embodiment, the bin encoders 10 implement different encoding algorithms for different groups of measures for an estimate of the probability for the less probable or more probable bin value for the current bin. In a further embodiment, the bin encoders 10 implement different encoding algorithms for different channel protection codes. In a further embodiment, the bin encoders 10 implement different encoding algorithms for different encryption schemes. In a further embodiment, the bin encoders 10 implement different encoding algorithms for different combinations of channel protection codes and groups of measures for an estimate of the probability for one of the two possible bin values 5 for the current bin. In a further embodiment, the bin encoders 10 implement different encoding algorithms for different combinations of channel protection codes and groups of measures for an estimate of the probability for the less probable or more probable bin value 5 for the current bin. In a further embodiment, the bin encoders 10 implement different encoding algorithms for different combinations of encryption schemes and groups of measures for an estimate of the probability for one of the two possible bin values 5 for the current bin. In a further embodiment, the bin encoders 10 implement different encoding algorithms for different combinations of encryption schemes and groups of measures for an estimate of the probability for the less probable or more probable bin value 5 for the current bin.

The bin encoders 10—or one or more of the bin encoders—may represent binary arithmetic encoding engines. In a further embodiment, one or more of the bin encoders represent a binary arithmetic coding engine, wherein the mapping from the representative LPS/LPB probability pus of a given bin buffer to a corresponding code interval width $R_{LPS}$—i.e. the interval subdivision of the internal state of the binary arithmetic coding engine, which is defined by the current interval width R and the current interval offset L, identifying, for example, the lower bound of the code interval—is realized by using a table lookup. In a further embodiment, for each table-based binary arithmetic coding engine associated to a given bin buffer, K representative interval width values $\{Q_0, \ldots, Q_{K-1}\}$ are used for representing $R_{LPS}$ with the choice of K and the representative interval width values $\{Q_0, \ldots, Q_{K-1}\}$ being dependent on the bin buffer. For a choice of K>1, arithmetic encoding of a bin may involve the substeps of mapping the current interval width R to a quantization index q with values in $\{0, \ldots, K-1\}$ and performing the interval subdivision by accessing the corresponding partial interval width value $Q_q$ from a lookup table with using q as an index. For a choice of K=1, i.e., for the case where only one representative interval width value $Q_0$ is given, this value $Q_0$ may be chosen as a power of two in order to allow decoding of multiple MPS/MPB values entering the corresponding bin buffer within a single renormalization cycle. The resulting codewords of each arithmetic coding engine may be separately transmitted, packetized, or stored, or they may be interleaved for the purpose of transmission or storage as described hereinafter.

That is, a binary arithmetic coding engine 10 could perform the following steps in coding the bins in its bin buffer 8:

1. Receiving valLPS, bin from bin buffer (recall: the respective binary arithmetic coding engine 10 considered here had been chosen to receive "bin" because (or, in other words, "bin" was associated with the respective binary arithmetic coding engine 10) the probability distribution estimate, such as p_state [bin], was associated with that binary arithmetic coding engine 10)

2. Quantization of R:
q_index=Qtab[R>>q] (or some other form of quantization)

3. Determination of Rus and R:
$R_{LPS}$=Rtab [q_index] (note that p_state is not mentioned here, as it is fixed for the binary arithmetic coding engine 10 considered, i.e. p_state [encoder], and Rtab has stored therein pre-calculated values for p[p_state[encoder]]·Q[q_index]
R=R–$R_{LPS}$ [that is, R is preliminarily pre-updated as if "bin" was MPS]

4. Calculation of the new partial interval:
if (bin=1-valMPS) then
L←L+R
R←$R_{LPS}$ 5. Renormalization of L and R, writing bits,
wherein
q_index describes the index of a quantization value read out of Qtab,
p_state describes the current state (fixed for the binary arithmetic coding engine 10),
$R_{LPS}$ describes the interval width corresponding to the LPS and
valMPS describes the value of the bit corresponding to the MPS.

Accordingly, a binary arithmetic decoding engine 22 could perform the following steps in decoding the bins output into bin buffer 20:

1. Receiving request for a bin (recall: the respective binary arithmetic decoding engine 22 considered here had been chosen to decode "bin" because (or, in other words, "bin" was associated with the respective binary arithmetic decoding engine 22) the probability distribution estimate, such as p_state[bin], was associated with that binary arithmetic decoding engine 22)

2. Quantization of R:
q_index=Qtab[R>>q] (or some other form of quantization)

3. Determination of Rus and R:
$R_{LPS}$=Rtab [q_index] (note that p_state is not mentioned here, as it is fixed for the binary arithmetic decoding engine 22 considered, i.e. p_state[encoder], and Rtab has stored therein pre-calculated values for p[p_state[encoder]]·Q[q_index]
R=R–$R_{LPS}$ [that is, R is preliminarily pre-updated as if "bin" was MPS]

4. Determination of bin depending on the position of the partial interval:
if (V≥R) then
bin←valMPS (bin is decoded as LPS; bin buffer selector 18 will obtain the actual bin value by use of this bin information and valMPS)
V←V–R
R←$R_{LPS}$
else
bin←valMPS (bin is decoded as MPS; bin buffer selector 18 will obtain the actual bin value by use of this bin information and valMPS)

5. Renormalization of R, reading out one bit and updating V,
wherein
q_index describes the index of a quantization value read out of Qtab,
p_state describes the current state (fixed for the binary arithmetic decoding engine 22),
$R_{LPS}$ describes the interval width corresponding to the LPS,
valMPS describes the value of the bit corresponding to the MPS, and
V describes a value from the interior of the current partial interval.

The bin encoders 10—or one or more of the bin encoders—may represent entropy encoders that directly map sequences of input bins 9 onto codewords 10. Such mappings can be efficiently implemented and don't necessitate a complex arithmetic coding engine. The inverse mapping of codewords onto sequences of bins (as done in the decoder) should be unique in order to guarantee perfect decoding of the input sequence, but the mapping of bin sequences 9 onto codewords 10 doesn't necessarily need to be unique, i.e., it is possible that a particular sequence of bins can be mapped onto more than one sequence of codewords. In an embodiment, the mapping of sequences of input bins 9 onto codewords 10 is bijective. In a further embodiment, the bin encoders 10—or one or more of the bin encoders—represent entropy encoders that directly map variable-length sequences of input bins 9 onto variable-length codewords 10. In an embodiment, the output codewords represent redundancy-free codes such as general Huffman codes or canonical Huffman codes.

Two examples for the bijective mapping of bin sequences to redundancy-free codes are illustrated in Table 3. In a further embodiment, the output codewords represent redundant codes suitable for error detection and error recovery. In a further embodiment, the output codewords represent encryption codes suitable for encrypting the source symbols.

TABLE 3

Examples for mappings between bin sequences and codewords.

| sequence of bins (bin order is from left to right) | codewords (bits order is from left to right) |
|---|---|
| 0000 0000 | 1 |
| 0000 0001 | 0000 |

TABLE 3-continued

Examples for mappings between bin sequences and codewords.

| sequence of bins (bin order is from left to right) | codewords (bits order is from left to right) |
|---|---|
| 0000 001 | 0001 |
| 0000 01 | 0010 |
| 0000 1 | 0011 |
| 0001 | 0100 |
| 001 | 0101 |
| 01 | 0110 |
| 1 | 0111 |
| 000 | 10 |
| 01 | 11 |
| 001 | 010 |
| 11 | 011 |
| 1000 0 | 0001 |
| 1001 | 0010 |
| 1010 | 0011 |
| 1000 1 | 0000 0 |
| 1011 | 0000 1 |

In a further embodiment, the bin encoders 10—or one or more of the bin encoders—represent entropy encoders that directly map variable-length sequences of input bins 9 onto fixed-length codewords 10. In a further embodiment, the bin encoders 10—or one or more of the bin encoders—represent entropy encoders that directly map fixed-length sequences of input bins 9 onto variable-length codewords 10.

Figure 4:
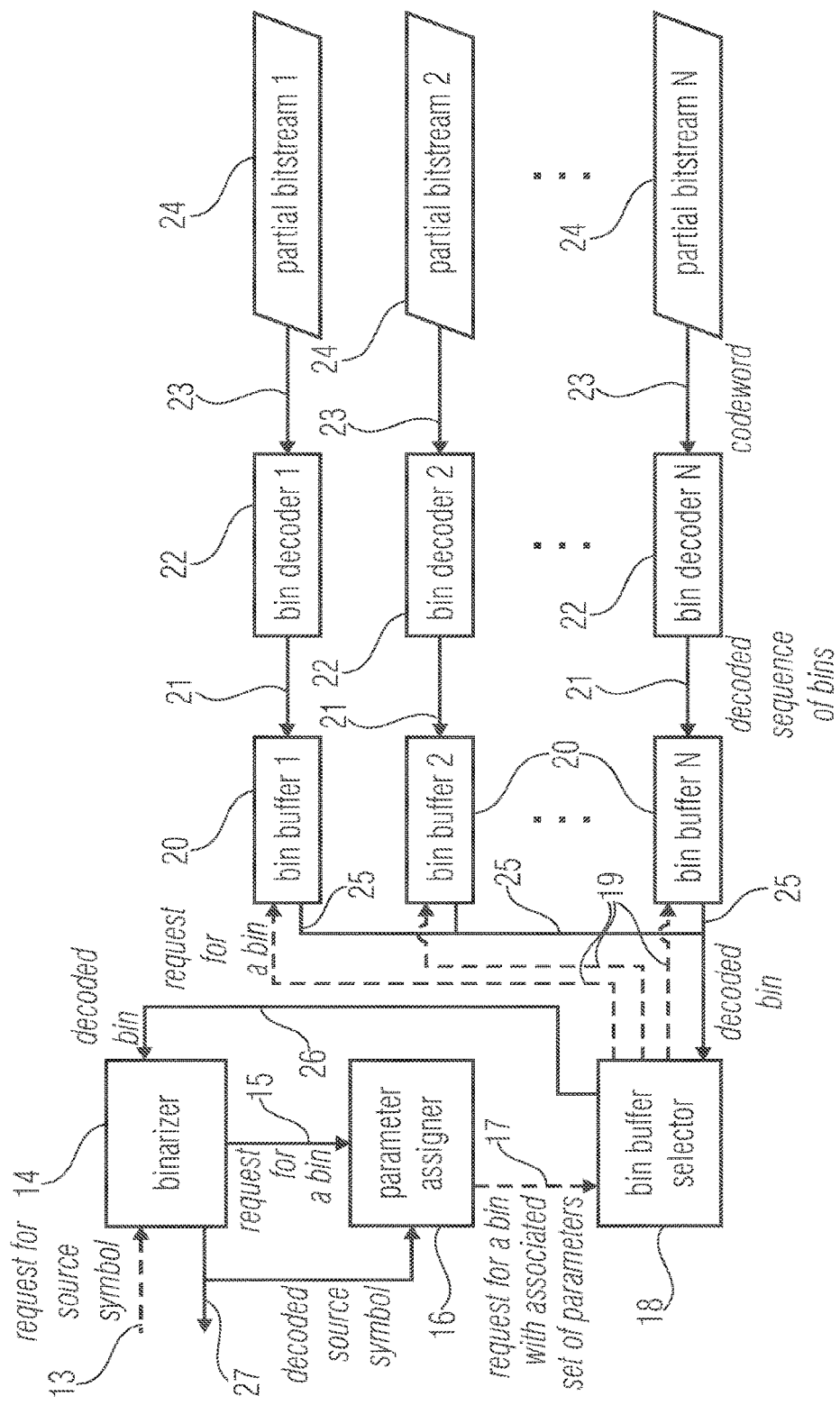
FIG. 4 shows a block diagram of a PIPE decoder suitable for decoding a bitstream generated by the PIPE encoder of FIG. 3, according to an embodiment, which may be used in FIG. 2.

A PIPE decoder according an embodiment is illustrated in FIG. 4. The decoder performs basically the inverse operations of the encoder of FIG. 3, so that the (previously encoded) sequence of source symbols 27 is decoded from a set of two or more partial bitstreams 24. The decoder includes two different process flows: A flow for data requests, which replicates the data flow of the encoder, and a data flow, which represents the inverse of the encoder data flow. In the illustration in FIG. 4, the dashed arrows represent the data request flow, while the solid arrows represent the data flow. The building blocks of the decoder basically replicate the building blocks of the encoder, but implement the inverse operations.

The decoding of a source symbol is triggered by a request for a new decoded source symbol 13 that is sent to the binarizer 14. In an embodiment, each request for a new decoded source symbol 13 is associated with a category of a set of one or more categories. The category that is associated with a request for a source symbol is the same as the category that was associated with the corresponding source symbol during encoding.

The binarizer 14 maps the request for a source symbol 13 into one or more requests for a bin that are sent to the parameter assigner 16. As final response to a request for a bin that is sent to the parameter assigner 16 by the binarizer 14, the binarizer 14 receives a decoded bin 26 from the bin buffer selector 18. The binarizer 14 compares the received sequence of decoded bins 26 with the bin sequences of a particular binarization scheme for the requested source symbol and, if the received sequence of decoded bins 26 matches the binarization of a source symbol, the binarizer empties its bin buffer and outputs the decoded source symbol as final response to the request for a new decoded symbol. If the already received sequence of decoded bins does not match any of the bin sequences for the binarization scheme for the requested source symbol, the binarizer sends another request for a bin to the parameter assigner until the sequence of decoded bins matches one of the bin sequences of the binarization scheme for the requested source symbol. For each request for a source symbol, the decoder uses the same binarization scheme that was used for encoding the corresponding source symbol. The binarization scheme can be different for different source symbol categories. The binarization scheme for a particular source symbol category can depend on the set of possible source symbol values and/or other properties of the source symbols for the particular category.

The parameter assigner assigns a set of one or more parameters to each request for a bin and sends the request for a bin with the associated set of parameters to the bin buffer selector. The set of parameters that are assigned to a requested bin by the parameter assigner is the same that was assigned to the corresponding bin during encoding. The set of parameters may consist of one or more of the parameters that are mentioned in the encoder description.

The parameter assigner 16 may associate each request for a bin with a measure for an estimate of the probability for one of the two possible bin values for the current requested bin. In particular, the parameter assigner 16 may associate each request for a bin with a measure for an estimate of the probability for the less probable or more probable bin value for the current requested bin and an identifier specifying an estimate for which of the two possible bin values represents the less probable or more probable bin value for the current requested bin.

In a further embodiment, the parameter assigner 16 associates each request for a bin 15,17 with a measure for an estimate of the probability for one of the two possible bin values for the current requested bin and one or more further parameters. In a further embodiment, the parameter assigner 16 associates each request for a bin 15,17 with a measure for an estimate of the probability for the less probable or more probable bin value for the current requested bin, an identifier specifying an estimate for which of the two possible bin values represents the less probable or more probable bin value for the current requested bin, and one or more further parameters (which may one or more of the above listed parameters).

In an embodiment, the parameter assigner 16 determines one or more of the above mentioned probability measures (measure for an estimate of the probability for one of the two possible bin values for the current requested bin, measure for an estimate of the probability for the less probable or more probable bin value for the current requested bin, identifier specifying an estimate for which of the two possible bin values represents the less probable or more probable bin value for the current requested bin) based on a set of one or more already decoded symbols. The determination of the probability measures for a particular request for a bin replicates the process at the encoder for the corresponding bin. The decoded symbols that are used for determining the probability measures can include one or more already decoded symbols of the same symbol category, one or more already decoded symbols of the same symbol category that correspond to data sets (such as blocks or groups of samples) of neighboring spatial and/or temporal locations (in relation to the data set associated with the current request for a source symbol), or one or more already decoded symbols of different symbol categories that correspond to data sets of the same and/or neighboring spatial and/or temporal locations (in relation to the data set associated with the current request for a source symbol).

Each request for a bin with an associated set of parameters 17 that is output of the parameter assigner 16 is fed into a bin buffer selector 18. Based on the associated set of parameters 17, the bin buffer selector 18 sends a request for a bin 19 to one of two or more bin buffers 20 and receives a decoded bin 25 from the selected bin buffer 20. The decoded input bin 25 is potentially modified and the decoded output bin 26—with a potentially modified value—is send to the binarizer 14 as final response to the request for a bin with an associated set of parameters 17.

The bin buffer 20 to which the request for a bin is forwarded is selected in the same way as the bin buffer to which the output bin of the bin buffer selector at the encoder side was sent.

In an embodiment, the bin buffer selector 18 determines the bin buffer 20 to which the request for a bin 19 is sent based on the associated measure for an estimate of the probability for one of the two possible bin values for the current requested bin. In an embodiment, the set of possible values for the measure for an estimate of the probability for one of the two possible bin values is finite and the bin buffer selector 18 contains a table that associates exactly one bin buffer 20 with each possible value of the estimate of the probability for one of the two possible bin values, where different values for the measure for an estimate of the probability for one of the two possible bin values can be associated with the same bin buffer 20. In a further embodiment, the range of possible values for the measure for an estimate of the probability for one of the two possible bin values is partitioned into a number of intervals, the bin buffer selector 18 determines the interval index for the current measure for an estimate of the probability for one of the two possible bin values, and the bin buffer selector 18 contains a table that associates exactly one bin buffer 20 with each possible value for the interval index, where different values for the interval index can be associated with the same bin buffer 20. Requests for bins 17 with opposite measures for an estimate of the probability for one of the two possible bin values (opposite measure are those which represent probability estimates P and 1−P) may be forwarded to the same bin buffer 20. Further, the association of the measure for an estimate of the probability for one of the two possible bin values for the current bin request with a particular bin buffer may be adapted over time.

The bin buffer selector 18 may determine the bin buffer 20 to which the request for a bin 19 is sent based on the associated measure for an estimate of the probability for the less probable or more probable bin value for the current requested bin. In an embodiment, the set of possible values for the measure for an estimate of the probability for the less probable or more probable bin value is finite and the bin buffer selector 18 contains a table that associates exactly one bin buffer 20 with each possible value of the estimate of the probability for the less probable or more probable bin value, where different values for the measure for an estimate of the probability for the less probable or more probable bin value can be associated with the same bin buffer 20. In an embodiment, the range of possible values for the measure for an estimate of the probability for the less probable or more probable bin value is partitioned into a number of intervals, the bin buffer selector 18 determines the interval index for the current measure for an estimate of the probability for the less probable or more probable bin value, and the bin buffer selector 18 contains a table that associates exactly one bin buffer 20 with each possible value for the interval index, where different values for the interval index can be associated with the same bin buffer 20. In a further embodiment, the association of the measure for an estimate of the probability for the less probable or more probable bin value for the current bin request with a particular bin buffer is adapted over time.

After receiving a decoded bin 25 from the selected bin buffer 20, the bin buffer selector 18 potentially modifies the input bin 25 and sends the output bin 26—with a potentially modified value—to the binarizer 14. The input/output bin mapping of the bin buffer selector 18 is the inverse of the input/output bin mapping of the bin buffer selector at the encoder side.

The bin buffer selector 18 may be configured to not modify the value of the bin, i.e., the output bin 26 has the same value as the input bin 25.

The bin buffer selector 18 may determine the output bin value 26 based on the input bin value 25 and the measure for an estimate of the probability for one of the two possible bin values for the current requested bin that is associated with the request for a bin 17. In an embodiment, the output bin value 26 is set equal to the input bin value 25 if the measure for the probability for one of the two possible bin values for the current bin request is less than (or less than or equal to) a particular threshold; if the measure for the probability for one of the two possible bin values for the current bin request is greater than or equal to (or greater than) a particular threshold, the output bin value 26 is modified (i.e., it is set to the opposite of the input bin value). In a further embodiment, the output bin value 26 is set equal to the input bin value 25 if the measure for the probability for one of the two possible bin values for the current bin request is greater than (or greater than or equal to) a particular threshold; if the measure for the probability for one of the two possible bin values for the current bin request is less than or equal to (or less than) a particular threshold, the output bin value 26 is modified (i.e., it is set to the opposite of the input bin value). In an embodiment, the value of the threshold corresponds to a value of 0.5 for the estimated probability for both possible bin values.

In a further embodiment, the bin buffer selector 18 determines the output bin value 26 based on the input bin value 25 and the identifier, specifying an estimate for which of the two possible bin values represents the less probable or more probable bin value for the current bin request, that is associated with the request for a bin 17. In an embodiment, the output bin value 26 is set equal to the input bin value 25 if the identifier specifies that the first of the two possible bin values represents the less probable (or more probable) bin value for the current bin request, and the output bin value 26 is modified (i.e., it is set to the opposite of the input bin value) if identifier specifies that the second of the two possible bin values represents the less probable (or more probable) bin value for the current bin request.

As described above, the bin buffer selector sends a request for a bin 19 to one of the two or more bin buffers 20. The bin buffers 20 represent first-in-first-out buffers, which are fed with sequences of decoded bins 21 from the connected bin decoders 22. As response to a request for a bin 19 that is sent to a bin buffer 20 from the bin buffer selector 18, the bin buffer 20 removes the bin of its content that was first fed into the bin buffer 20 and sends it to the bin buffer selector 18. Bins that are earlier sent to the bin buffer 20 are earlier removed and sent to the bin buffer selector 18.

Each of the two or more bin buffers 20 is connected with exactly one bin decoder 22 and each bin decoder is only connected with one bin buffer 20. Each bin decoder 22 reads codewords 23, which represent sequences of bits, from a separate partial bitstream 24. The bin decoder converts a codeword 23 into a sequence of bins 21 that is sent to the connected bin buffer 20. The overall decoding algorithm converts two or more partial bitstreams 24 into a number of decoded source symbols, where the number of partial bitstreams is equal to the number of bin buffers and bin decoders and the decoding of source symbols is triggered by requests for new source symbols. In an embodiment, a bin decoder 22 converts codewords 23 of a variable number of bits into a sequence of a variable number of bins 21. One advantage of above PIPE embodiments is that the decoding of bins from the two or more partial bitstreams can be done in parallel (e.g. for different groups of probability measures), which reduces the processing time for several implementations.

Another advantage of above PIPE decoding embodiments is that the bin decoding, which is done by the bin decoders 22, can be specifically designed for different sets of parameters 17. In particular, the bin encoding and decoding can be optimized (in terms of coding efficiency and/or complexity) for different groups of estimated probabilities. On the one hand side, this allows a reduction of the encoding/decoding complexity relative to arithmetic coding algorithms with similar coding efficiency. On the other hand side, it allows an improvement of the coding efficiency relative to VLC coding algorithms with similar encoding/decoding complexity. In an embodiment, the bin decoders 22 implement different decoding algorithms (i.e. mapping of bin sequences onto codewords) for different groups of measures for an estimate of the probability for one of the two possible bin values 17 for the current bin request. In a further embodiment, the bin decoders 22 implement different decoding algorithms for different groups of measures for an estimate of the probability for the less probable or more probable bin value for the current requested bin. In a further embodiment, the bin decoders 22 implement different decoding algorithms for different channel protection codes. In a further embodiment, the bin decoders 22 implement different decoding algorithms for different encryption schemes. In a further embodiment, the bin decoders 22 implement different decoding algorithms for different combinations of channel protection codes and groups of measures for an estimate of the probability for one of the two possible bin values 17 for the current requested bin. In a further embodiment, the bin decoders 22 implement different decoding algorithms for different combinations of channel protection codes and groups of measures for an estimate of the probability for the less probable or more probable bin value 17 for the current requested bin. In a further embodiment, the bin decoders 22 implement different decoding algorithms for different combinations of encryption schemes and groups of measures for an estimate of the probability for one of the two possible bin values 17 for the current requested bin. In a further embodiment, the bin decoders 22 implement different decoding algorithms for different combinations of encryption schemes and groups of measures for an estimate of the probability for the less probable or more probable bin value 17 for the current requested bin.

The bin decoders 22 do the inverse mapping of the corresponding bin encoders at the encoder side.

In an embodiment, the bin decoders 22—or one or more of the bin decoders—represent binary arithmetic decoding engines.

In a further embodiment, the bin decoders 22—or one or more of the bin decoders—represent entropy decoders that directly map codewords 23 onto sequences of bins 21. Such mappings can be efficiently implemented and don't necessitate a complex arithmetic coding engine. The mapping of codewords onto sequences of bins has to be unique. In an embodiment, the mapping of codewords 23 onto sequences of bins 21 is bijective. In a further embodiment, the bin decoders 10—or one or more of the bin decoders—represent entropy decoders that directly map variable-length codewords 23 into variable-length sequences of bins 21. In an embodiment, the input codewords represent redundancy-free codes such as general huffman codes or canonical huffman codes. Two examples for the bijective mapping of redundancy-free codes to bin sequences are illustrated in Table 3. In a further embodiment, the input codewords represent redundant codes suitable for error detection and error recovery. In a further embodiment, the input codewords represent encryption codes.

The bin decoders 22—or one or more of the bin decoders—may represent entropy decoders that directly map fixed-length codewords 23 onto variable-length sequences of bins 21. Alternatively the bin decoders 22—or one or more of the bin decoders—represent entropy decoders that directly map variable-length codewords 23 onto fixed-length sequences of bins 21.

Thus, FIGS. 3 and 4 showed an embodiment for a PIPE encoder for encoding a sequence of source symbols 1 and a PIPE decoder for reconstructing same. That is, the PIPE encoder of FIG. 3 may be used as the PIPE encoder 104 in FIG. 1a with binarizer 2 acting as symbolizer 122, parameter assigner 4 acting as assigner 114, bin buffer selector 6 acting as selector 120, and the pair of serially connected bin buffer 8 and bin encoder 10 acting as a respective one of the entropy encoders 116 each of which outputs bitstreams 12 corresponding to bitstreams 118 in FIG. 1a. As becomes clear from the comparison of FIG. 3 and FIG. 1, assigner 114 of FIG. 1a may have its input alternatively be connected to the input side of symbolizer 122 rather than the output side of the latter. Similarly, the PIPE decoder of FIG. 4 may be used as PIPE decoder 202 in FIG. 2a with partial bitstreams 24 corresponding to bitstreams 216 in FIG. 2, the pairs of serially connected buffer 20 and bin decoder 22 corresponding to the individual entropy decoders 210, bin buffer selector 18 acting as selector 214, parameter assigner 16 acting as assigner 212 and binarizer 14 acting as desymbolizer 222. Again, a comparison between FIG. 2a and FIG. 4 makes clear that the interconnection between desymbolizer 222, assigner 212 and selector 214 may be configured differently, so that, in accordance with an alternative embodiment, the connections of FIG. 2a are amended to correspond to those shown in FIG. 4.

The PIPE encoder of FIG. 3 comprises an assigner 4 configured to assign a number of parameters 5 to each alphabet symbol of the sequence of alphabet symbols 3. The assignment is based on information contained within previous alphabet symbols of the sequence of alphabet symbols such as the category of the syntax element 1 to the representation—such as binarization—of which the current alphabet symbol belongs and which, according to the syntax structure of the syntax elements 1, is currently be expected which expectation, in turn, is deducible from the history of previous syntax elements 1 and alphabet symbols 3. Further, the encoder comprises a plurality of entropy encoders 10 each of which is configured to convert the alphabet symbols 3 forwarded to the respective entropy encoder into a respective bitstream 12, and a selector 6 configured to forward each alphabet symbol 3 to a selected one of the plurality of entropy encoders 10, the selection depending on the number of parameters 5 assigned to the respective alphabet symbol 3. The PIPE decoder of FIG. 4 comprises a plurality of entropy decoders 22, each of which is configured to convert a respective bitstream 23 into alphabet symbols 21; an assigner 16 configured to assign a number of parameters 17 to each alphabet symbol 15 of a sequence of alphabet symbols to be reconstructed based on information contained within previously reconstructed alphabet symbols of the sequence of alphabet symbols (see 26 and 27 in FIG. 4); and a selector 18 configured to retrieve each alphabet symbol of the sequence of alphabet symbols to be reconstructed from a selected one of the plurality of entropy decoders 22, the selection depending on the number of parameters defined to the respective alphabet symbol. The assigner 16 may be configured such that the number of parameters assigned to each alphabet symbol comprises, or is, a measure for an estimate of a probability of distribution among the possible alphabet symbol values a respective alphabet symbol may assume. The sequence of alphabet symbols to be reconstructed may be of a binary alphabet and the assigner 16 may be configured such that the estimate of the probability distribution consists of a measure for an estimate of a probability of a less probable or more probable bin value of the two possible bin values of the binary alphabet and an identifier specifying an estimate for which of the two possible bin values represents the less probable or more probable bin value. The assigner 16 may further be configured to internally assign a context to each alphabet symbol of the sequence of alphabet symbols 15 to be reconstructed based on the information contained within previously reconstructed alphabet symbols of the sequence of alphabet symbols to be reconstructed with each context having a respective probability distribution estimate associated therewith, and to adapt the probability distribution estimate for each context to an actual symbol statistic based on symbol values of previously reconstructed alphabet symbols to which the respective context is assigned. The context may take into account a spatial relationship or neighborhood of positions to which the syntax elements belong such as in video or picture coding, or even in tables in case of financial applications. Then, the measure for the estimate of the probability distribution for each alphabet symbol may be determined based on the probability distribution estimate associated with the context assigned to the respective alphabet symbol such as by quantizing the probability distribution estimate associated with the context assigned with the respective alphabet symbol to one of a plurality of probability distribution estimate representatives in order to obtain the measure for the estimate of the probability distribution. The selector may be configured such that a surjective association is defined between the plurality of entropy encoders and the plurality of probability distribution estimate representatives, i.e. each entropy encoder has at least one probability distribution estimate representative associated therewith, but more than one probability distribution estimate representative may be associated with one entropy encoder. In accordance with an embodiment, the association may even be bijective. The selector 18 may be configured to change a quantization mapping from a range of the probability distribution estimates to the plurality of probability distribution estimate representatives in a predetermined deterministic way depending on previously reconstructed alphabet symbols of the sequence of alphabet symbols, over time. That is, selector 18 may change the quantization step sizes, i.e. the intervals of probability distributions mapped onto the individual probability indices which, in turn, may be surjectively associated with the individual entropy decoders. The plurality of entropy decoders 22, in turn, may be configured to adapt their way of converting alphabet symbols into bit streams responsive to a change in the quantization mapping. For example, each entropy decoder 22 may be optimized for, i.e. may have an optimal compression rate for, a certain probability distribution estimate within the respective probability distribution estimate quantization interval, and may change its codeword/symbol sequence mapping so as to adapt the position of this certain probability distribution estimate within the respective probability distribution estimate quantization interval upon a change of the latter so as to be optimized. The selector may be configured to change the quantization mapping such that rates by which the alphabet symbols are retrieved from the plurality of entropy decoders, are made less dispersed. As to the binarizer 14 it is noted that same may be left away if the syntax elements are already binary. Further, depending on the type of decoder 22, the existence of the buffers 20 is not necessitated. Further, the buffers may be integrated within the decoders.

So far, more detailed embodiments for the PIPE encoder 104 and the PIPE decoder 202 in FIGS. 1a and 2 have been described above, with respect to FIGS. 3 and 4, which, if readily implemented in the apparatuses of FIGS. 1a and 2, lead to a parallel bitstream output in which the VLC and PIPE partial bitstreams are conveyed in parallel. In the following, possibilities are described, how to combine the PIPE partial bitstreams for being, then, transmitted along VLC bitstream in parallel, or with secondly interleaving both bitstreams, i.e. the VLC bitstream and the interleaved PIPE bitstream.

Termination of Finite Source Symbol Sequences

In an embodiment for the PIPE en-and decoders, the encoding and decoding is done for a finite set of source symbols. Often a certain quantity of data such as a still image, a frame or field of a video sequence, a slice of an image, a slice of a frame or a field of a video sequence, or a set of successive audio samples, etc. is coded. For finite sets of source symbols, in general, the partial bitstreams that are created at the encoder side have to be terminated, i.e., it has to be ensured that all source symbols can be decoded from the transmitted or stored partial bitstreams. After the last bin is inserted into the corresponding bin buffer 8, the bin encoder 10 has to ensure that a complete codeword is written to the partial bitstream 12. If the bin encoder 10 represents a binary arithmetic coding engine, the arithmetic codeword has to be terminated. If the bin encoder 10 represents an entropy encoder that implements a direct mapping of bin sequences onto codewords, the bin sequence that is stored in the bin buffer after writing the last bin to the bin buffer might not represent a bin sequence that is associated with a codeword (i.e., it might represent a prefix of two or more bin sequences that are associated with codewords). In such a case, any of the codewords associated with a bin sequence that contains the bin sequence in the bin buffer as prefix has to be written to the partial bitstream (the bin buffer has to be flushed). This could be done by inserting bins with a particular or an arbitrary value into the bin buffer until a codeword is written. In an embodiment, the bin encoder selects one of the codewords with minimum length (in addition to the property that the associated bin sequence has to contain the bin sequence in the bin buffer as prefix). At the decoder side, the bin decoder 22 may decode more bins than necessitated for the last codeword in a partial bitstream; these bins are not requested by the bin buffer selector 18 and are discarded and ignored. The decoding of the finite set of symbols is controlled by requests for decoded source symbols; if no further source symbol is requested for a quantity of data, the decoding is terminated.

Transmission and Multiplexing of the Partial Bitstreams

The partial bitstreams 12 that are created by the PIPE encoder can be transmitted separately, or they can be multiplexed into a single bitstream, or the codewords of the partial bitstreams can be interleaved in a single bitstream.

In an embodiment, each partial bitstream for a quantity of data is written to one data packet. The quantity of data can be an arbitrary set of source symbols such as a still picture, a field or frame of a video sequence, a slice of a still picture, a slice of a field or frame of a video sequence, or a frame of audio samples, etc.

Figure 5:
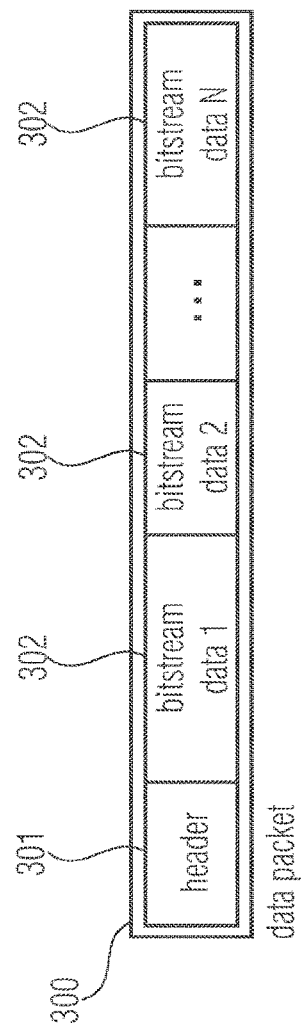
FIG. 5 shows a schematic diagram illustrating a data packet with multiplexed partial bitstreams according to an embodiment.

In another embodiment, two or more of the partial bitstreams for a quantity of data or all partial bitstreams for a quantity of data are multiplexed into one data packet. The structure of a data packet that contains multiplexed partial bitstreams is illustrated in FIG. 5. That is, the data packet shown in FIG. 5 could be part of the intermediate interleaved stream 132 and 234, respectively.

The data packet 300 consists of a header and one partition for the data of each partial bitstream (for the considered quantity of data). The header 300 of the data packet contains indications for the partitioning of the (remainder of the) data packet into segments of bitstream data 302. Beside the indications for the partitioning, the header may contain additional information. In an embodiment, the indications for the partitioning of the data packet are the locations of the beginning of the data segments in units of bits or bytes or multiples of bits or multiples of bytes. In an embodiment, the locations of the beginning of the data segments are coded as absolute values in the header of the data packet, either relative to the beginning of the data packet or relative to the end of the header or relative to the beginning of the previous data packet. In a further embodiment, the locations of the beginning of the data segments are differentially coded, i.e., only the difference between the actual beginning of a data segment and a prediction for the beginning of the data segment is coded. The prediction can be derived based on already known or transmitted information such as the overall size of the data packet, the size of the header, the number of data segments in the data packet, the location of the beginning of preceding data segments. In an embodiment, the location of the beginning of the first data packet is not coded, but inferred based on the size of the data packet header. At the decoder side, the transmitted partition indications are used for deriving the beginning of the data segments. The data segments are then used as partial bitstreams and the data contained in the data segments are fed into the corresponding bin decoders in sequential order.

Figure 6:
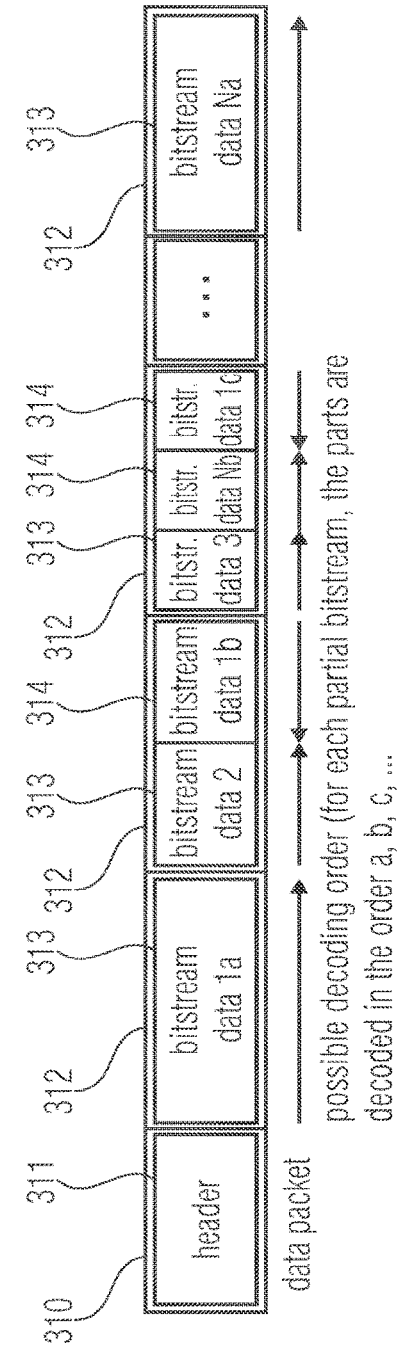
FIG. 6 shows a schematic diagram illustrating a data packet with an alternative segmentation using fixed-size segments according to a further embodiment.

There are several alternatives for multiplexing the partial bitstreams 12 into a data packet. One alternative, which can reduce the necessitated side information, in particular for cases in which the sizes of the partial bitstreams are very similar, is illustrated in FIG. 6. The payload of the data packet, i.e., the data packet 310 without its header 311, is partitioned into segments 312 a predefined way. As an example, the data packet payload can be partitioned into segments of the same size. Then each segment is associated with a partial bitstream or with the first part of a partial bitstream 313. If a partial bitstream is greater than the associated data segment, its remainder 314 is placed into the unused space at the end of other data segments. This can be done in a way that the remaining part of a bitstream is inserted in reverse order (starting from the end of the data segment), which reduces the side information. The association of the remainders of the partial bitstreams to data segments and, when more than one remainder is added to a data segment, the start point for one or more of the remainders have to be signaled inside the bitstream, e.g. in the data packet header.

Interleaving of Variable-Length Codewords

For some applications, the above described multiplexing of the partial bitstreams 12 (for a quantity of source symbols) in one data packet can have the following disadvantages: On the one hand side, for small data packets, the number of bits for the side information that is necessitated for signaling the partitioning can become significant relative to the actual data in the partial bitstreams, which finally reduces the coding efficiency. On the other hand, the multiplexing may not suitable for applications that necessitate a low delay (e.g. for video conferencing applications). With the described multiplexing, the PIPE encoder cannot start the transmission of a data packet before the partial bitstreams have been completely created, since the locations of the beginning of the partitions are not known before. Furthermore, in general, the PIPE decoder has to wait until it receives the beginning of the last data segment before it can start the decoding of a data packet. For applications as video conferencing systems, these delays can add-up to an additional overall delay of the system of several video pictures (in particular for bit rates that are close to the transmission bit rate and for encoders/decoders that necessitate nearly the time interval between two pictures for encoding/decoding a picture), which is critical for such applications. In order to overcome the disadvantages for certain applications, the PIPE encoder can be configured in a way that the codewords that are generated by the two or more bin encoders are interleaved into a single bitstream. The bitstream with the interleaved codewords can be directly send to the decoder (when neglecting a small buffer delay, see below). At the PIPE decoder side, the two or more bin decoders read the codewords directly from the bitstream in decoding order; the decoding can be started with the first received bit. In addition, no side information is necessitated for signaling the multiplexing (or interleaving) of the partial bitstreams.

Figure 7:
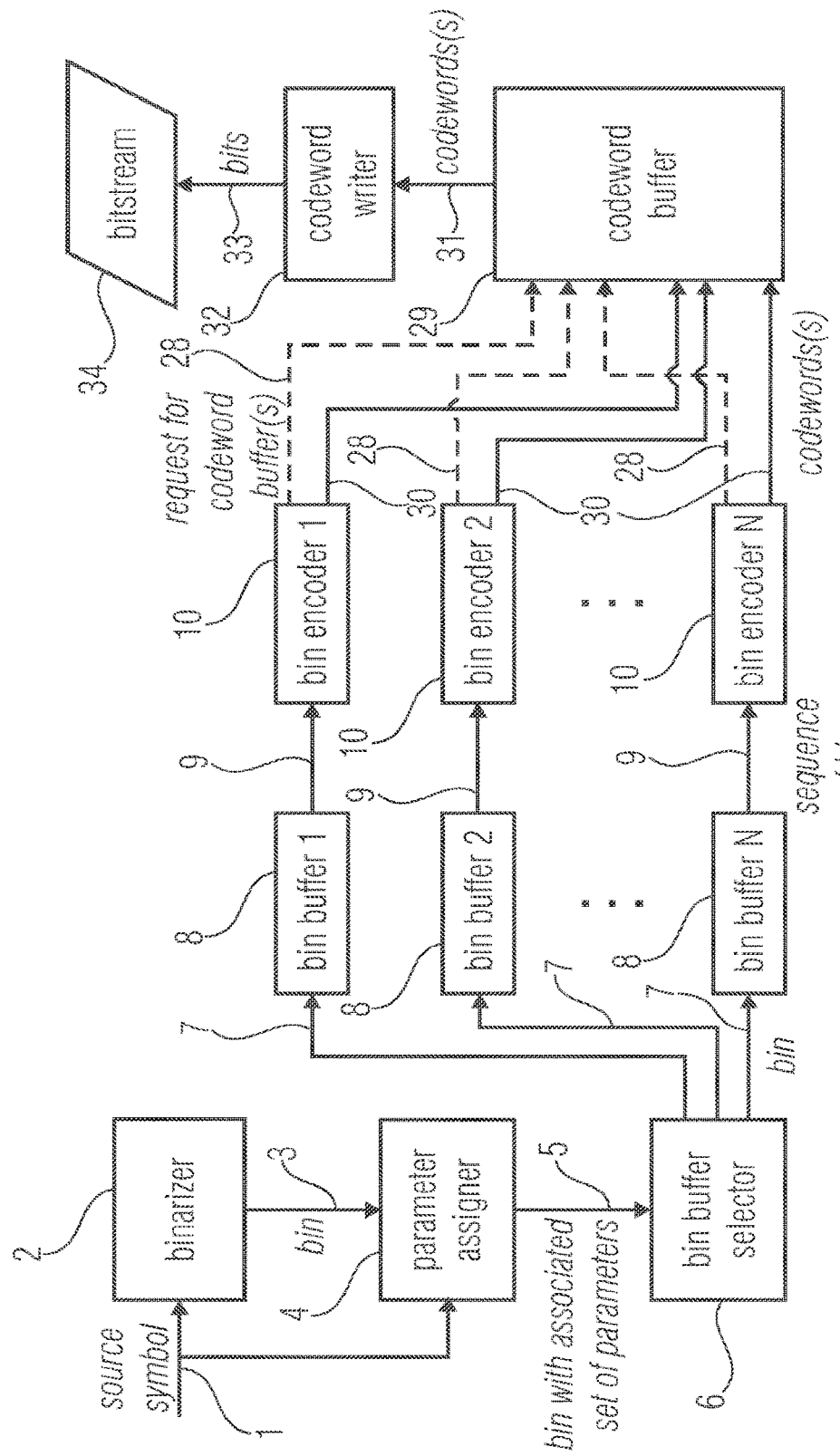
FIG. 7 shows a block diagram of a PIPE encoder according to an embodiment using partial bitstream interleaving.

The basic structure of a PIPE encoder with codeword interleaving is shown in FIG. 7. The bin encoders 10 don't write the codewords directly to the partial bitstreams, but are connected with a single codeword buffer 29, from which codewords are written to the bitstream 34 in coding order. The bin encoders 10 send requests for one or more new codeword buffer entries 28 to the codeword buffer 29 and later send the codewords 30 to the codeword buffer 29, which are stored in the reserved buffer entries. The (in general variable-length) codewords 31 of the codeword buffer 29 are accessed by a codeword writer 32, which writes the corresponding bits 33 to the produced bitstream 34. The codeword buffer 29 operates as a first-in-first-out buffer; codeword entries that are reserved earlier are earlier written to the bitstream.

In a further generalization, multiple codeword buffers and partial bitstreams 12 are possible, where the number of codeword buffers is less than the number of bin encoders. A bin encoder 10 reserves one or more codewords in the codeword buffer 29, whereby the reservation of the one or more codewords in the codeword buffer is triggered by certain events in the connected bin buffer 8. In an embodiment, the codeword buffer 29 is operated in a way that the PIPE decoder can instantaneously decode the bitstream 34 which corresponds to 132 in FIG. 1a and 134 in FIG. 2, respectively. The coding order in which the codewords are written to the bitstream is the same as the order in which the corresponding codewords are reserved in the codeword buffer. In an embodiment, each bin encoder 10 reserves one codeword, with the reservation being triggered by a certain event in the connected bin buffer. In another embodiment, each bin encoder 10 reserves more than one codeword, with the reservation being triggered by a certain event m the connected bin buffer. In further embodiment, the bin encoders 10 reserve a different amount of codewords, where the amount of codewords that are reserved by a particular bin encoder can be dependent on the particular bin encoder and/or other properties of the particular bin encoder/bin buffer (such as the associated probability measure, the number of already written bits, etc.).

In an embodiment, the codeword buffer is operated as follows. If a new bin 7 is sent to a particular bin buffer 8 and the number of already stored bins in the bin buffer is zero and there is currently no codeword reserved in the codeword buffer for the bin encoder that is connected with the particular bin buffer, the connected bin encoder 10 sends a request to the codeword buffer, by which one or more codeword entries are reserved in the codeword buffer 29 for the particular bin encoder. The codeword entries can have a variable number of bits; an upper threshold for the number of bits in a buffer entry is usually given by the maximum codeword size for the corresponding bin encoder. The next codeword or the next codewords that are produced by the bin encoder (for which the codeword entry or codeword entries have been reserved) are stored in the reserved entry or entries of the codeword buffer. If all reserved buffer entries in the codeword buffer for a particular bin encoder are filled with codewords and the next bin is sent to the bin buffer that is connected with the particular bin encoder, one or more new codewords are reserved in the codeword buffer for the particular bin encoder, etc. The codeword buffer 29 represents a first-in-first-out buffer in a certain way. Buffer entries are reserved in sequential order. Codewords for which the corresponding buffer entries have been reserved earlier are earlier written to the bitstream. The codeword writer 32 checks the status of the codeword buffer 29, either continuously or after a codeword 30 is written to the codeword buffer 29. If the first buffer entry contains a complete codeword (i.e., the buffer entry is not reserved, but includes a codeword), the corresponding codeword 31 and the corresponding buffer entry are removed from the codeword buffer 20 and the bits of the codeword 33 are written to the bitstream. This process is repeated until the first buffer entry does not contain a codeword (i.e., it is reserved or free). At the end of the decoding process, i.e., if all source symbols of the considered quantity of data have been processed, the codeword buffer has to be flushed. For that flushing process, the following is applied for each bin buffer/bin encoder as first step: If the bin buffer does contain bins, a bin with a particular or an arbitrary value is added until the resulting bin sequence represents a bin sequence that is associated with a codeword (as noted above, one way of adding bins is to add such bin values that produce the shortest possible codeword—or one of those—that is associated with a bin sequence that contains the for the original content of the bin buffer as prefix), then the codeword is written to the next reserved buffer entry for the corresponding bin encoder (and the corresponding) bin buffer is emptied. If more than one buffer entry has been reserved for one or more bin encoders, the codeword buffer may still contain reserved codeword entries. In that case, these codeword entries are filled with arbitrary, but valid codewords for the corresponding bin encoders. In an embodiment, the shortest valid codeword or one of the shortest valid codewords (if there are multiple) is inserted. Finally, all remaining codewords in the codeword buffer are written to the bitstream.

Two examples for the status of the codeword buffer are illustrated in FIG. 8. In example (a), the codeword buffer contains 2 entries that are filled with a codeword and 5 reserved entries. In addition, the next free buffer entry is marked. The first entry is filled with a codeword (i.e., the bin encoder 2 just wrote a codeword to a previously reserved entry). In the next step, this codeword will be removed from the codeword buffer and written to the bitstream. Then, the first reserved codeword for bin encoder 3 is the first buffer entry, but this entry cannot be removed from the codeword buffer, since it is only reserved, but no codeword has been written to this entry. In the example (b), the codeword buffer contains 3 entries that are filled with a codeword and 4 reserved entries. The first entry is marked as reserved and hence the codeword writer cannot write a codeword to the bitstream. Although 3 codewords are contained in the codeword buffer, the codeword writer has to wait until a codeword is written to the first reserved buffer entry for bin encoder 3. Note that the codewords have to be written in the order in which they were reserved, in order to be able to invert the process at the decoder side (see below).

Figure 9:
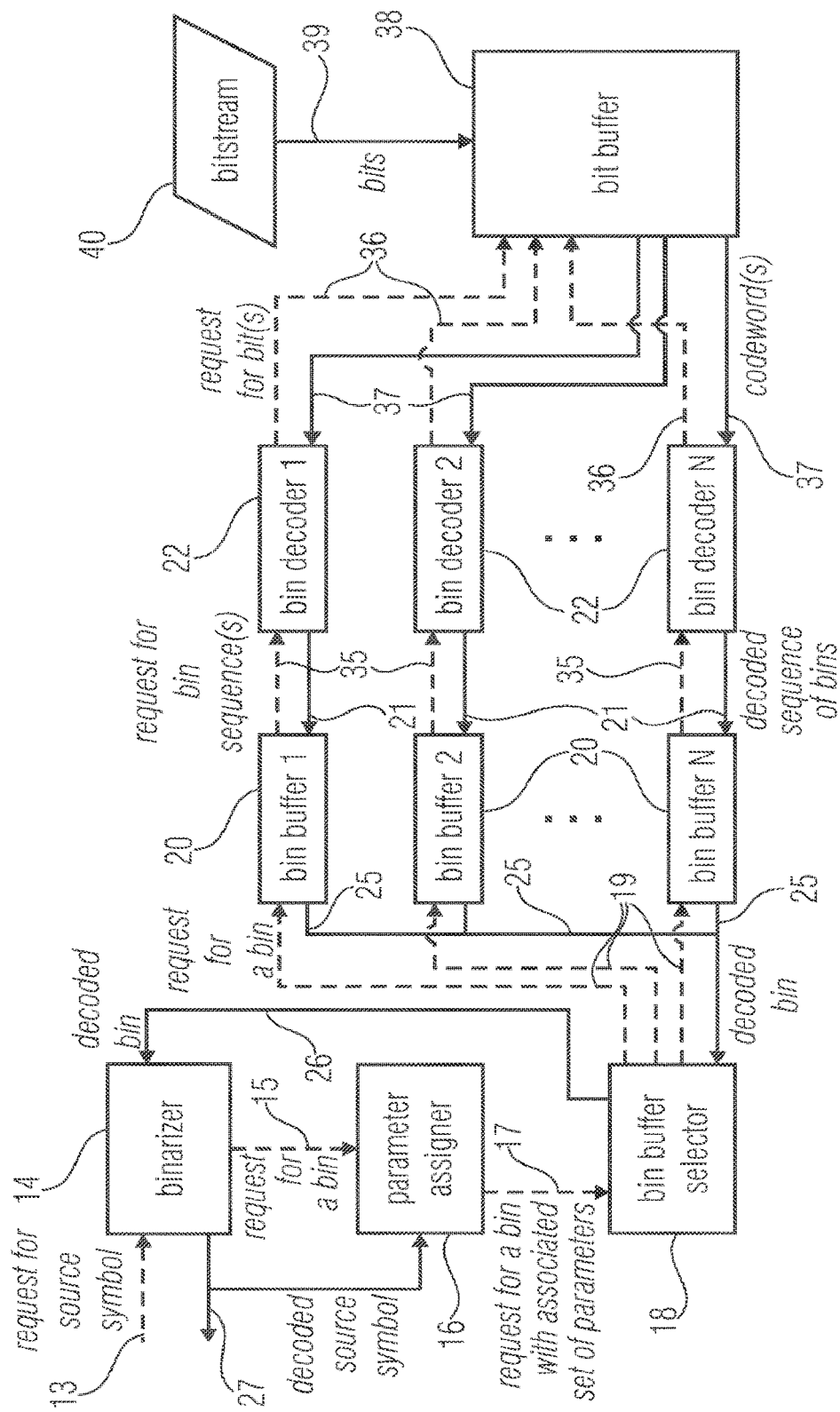
FIG. 9 shows a block diagram of a PIPE decoder according to an embodiment using partial bitstream interleaving.

The basic structure of a PIPE decoder with codeword interleaving is shown in FIG. 9. The bin decoders 10 don't read the codewords directly from separate partial bitstreams, but are connected to a bit buffer 38, from which the codewords 37 are read in coding order. It should be noted that the bit buffer 38 is not absolutely necessitated, since the codewords could also be directly read from the bitstream. The bit buffer 38 is mainly included in the illustration for clearly separate different aspects of the processing chain. The bits 39 of the bitstream 40 with interleaved codewords, which thus corresponds to bitstream 234 in FIG. 2, are sequentially inserted into the bit buffer 38, which represents a first-in-first-out buffer. If a particular bin decoder 22 receives a request for one or more bin sequences 35, the bin decoder 22 reads one or more codewords 37 from the bit buffer 38 via requests for bits 36. The PIPE decoder can instantaneously decode the source symbols. Note that the PIPE encoder (as described above) has to ensure by suitably operating the codeword buffer that the codewords are written in the same order to the bitstream in which they are requested by the bin decoders. At the PIPE decoder, the entire decoding process is triggered by requests for source symbols. Parameters as the number of codewords that are reserved at the encoder side by a particular bin encoder and the number of codewords that are read by the corresponding bin decoder have to be the same.

In a further generalization, multiple codeword buffers and partial bitstreams are possible, where the number of bit buffers is less than the number of bin decoders. A bin decoder 22 reads one or more codewords from the bit buffer 38 at one time instant, whereby the reading of the one or more codewords from the bit buffer is triggered by certain events in the connected bin buffer 20. In an embodiment, the decoder is operated in a way that one or more codewords are read when a request for a bin 19 is sent to a particular bin buffer 20 and the bin buffer doesn't contain any bins. But it is also possible to trigger the reading of codewords by other events, e.g. if the number of bins in the bin buffer is below a predefined threshold. In an embodiment, each bin decoder 22 reads one codeword, with the reading being triggered by a certain event in the connected bin buffer. In another embodiment, each bin decoder 22 reads more than one codeword, with the reading being triggered by a certain event in the connected bin buffer. In a further embodiment, the bin decoders 22 read a different amount of codewords, where the amount of codewords that are read by a particular bin decoder can be dependent on the particular bin decoder and/or other properties of the particular bin decoder/bin buffer (such as the associated probability measure, the number of already read bits, etc.).

In an embodiment, the reading of codewords from the bit buffer is operated as follows. If a new bin request 19 is sent from the bin buffer selector 18 to a particular bin buffer 20 and the number of bins in the bin buffer is zero, the connected bin decoder 22 reads one or more codewords 37 from the bit buffer 38, via bit request 36 to the bit buffer 38. The bin decoder 22 converts the read codewords 37 into sequences of bins 21 and stores these bin sequences in the connected bin buffer 20. As final response to the request for a bin 19, the first inserted bin is removed from the bin buffer 20 and sent to the bin buffer selector 18. As response the further bin requests, the remaining bins in the bin buffer are removed until the bin buffer is empty. An additional bin request triggers the bin decoder to read one or more new codewords from the bit buffer, etc. The bit buffer 38 represents a first-in-first-out buffer of a predefined size and is continuously filled with bits 39 from the bitstream 40. In order to ensure that the codewords are written to the bitstream in the same way as they are requested by the decoding process, the codeword buffer at the encoder side can be operated in the way described above.

Thus, each of the plurality of entropy decoders may be a variable length decoder configured to map codewords of fixed lengths to symbol sequences of variable lengths, and a codeword entry such as the output of the codeword buffer 43 may be provided for receiving a single stream of interleaved codewords. The plurality of entropy decoders 22 may be configured to retrieve the codewords from the codeword entry in a sequential order depending on an order in which the symbols of the sequence of symbols to be reconstructed as retrieved by the selector 18 from the plurality of entropy decoders result in a new symbol sequence to be mapped from a new codeword at the respective entropy decoders.

Interleaving of Variable-Length Codewords with a Low-Delay Constraint

The described codeword interleaving for the PIPE coding does not necessitate that any partitioning information is sent as side information. And since the codewords are interleaved in the bitstream, the delay is in general small. However, it is not guaranteed that a particular delay constraint (e.g. specified by a maximum number of bits that are stored in the codeword buffer) is obeyed. Furthermore, the necessitated buffer size for the codeword buffer can theoretically become very large. When considering the example in FIG. 8(*b*), it might be possible that no further bins are send to bin buffer 3 and hence the bin encoder 3 will not send any new codeword to the codeword buffer until the flushing process at the end of the data packet is applied. Then all codewords for bin encoders 1 and 2 would have to wait until the end of the data packet, before they can be written to the bitstream. This drawback can be circumvented by adding a further mechanism to the PIPE encoding process (and also to the PIPE decoding process as described later). The basic concept of that additional mechanism is that if a measure related to the delay or an upper bound of the delay (see below) exceeds a specified threshold, the first reserved buffer entry is filled by flushing the corresponding bin buffer (using a similar mechanism as at the end of a data packet). By such a mechanism, the number of waiting buffer entries is reduced until the associated delay measure is less than the specified threshold. At the decoder side, the bins that have been inserted at the encoder side in order to obey the delay constraint have to be discarded. For this discarding of bins basically the same mechanism as at the encoder side can be used. In the following two embodiments for such a delay control are described.

In one embodiment, the measure for the delay (or an upper bound of the delay) is the number of active buffer entries in the codeword buffer, where the number of active buffer entries is the number of reserved buffer entries plus the number of buffer entries that contain codewords. Note that the first buffer entry is a reserved buffer entry or a free buffer entry, since if the first buffer entry contains a codeword, this codeword is written to the bitstream. If for example, the maximum allowed buffer delay (as determined by the application) is D bits and the maximum codeword size for all bin encoders is L, a lower bound for the maximum number of codewords that can be contained in the codeword buffer without violating the delay constraint can be calculated by N=D/L. The delay measure D in bits is not necessitated by the system, but the maximum number of codewords N has to be known to both encoder and decoder. In an embodiment, the maximum number of codeword buffer entries N is fixed by the application. In another embodiment, the maximum number of codeword buffer entries N is signaled inside the bitstream, e.g., in the header of the data packet (or slice header) or in a parameter set, which is included in the bitstream. If a bin encoder 10 sends a request for the reservation of one or more new buffer entries to the codeword buffer 29, the following process is executed before a new codeword buffer entry is reserved (i.e., it is executed multiple times if multiple codeword buffer entries are reserved by one request): If the number of currently active buffer entries plus 1 (taking into account the buffer entry that will be reserved next) is greater than the maximum number of codeword buffer entries N, the first buffer entry (which is reserved) is flushed by the process described in the following until the number of currently active buffer entries plus 1 is less than or equal to the maximum number of codeword buffer entries N. The flushing of a reserved buffer entry is similar to the flushing at the end of a data packet: The bin encoder 10 that has reserved the corresponding first buffer entry is flushed by adding bins with particular or arbitrary values to the connected bin buffer 8 until the resulting bin sequence represents a bin sequence that is associated with a codeword, the codeword is then written to the reserved buffer entry and it is finally added to the bitstream (while emptying the bin buffer and removing the previously reserved buffer entry). As mentioned above, one way for adding bins to the bin buffer is to add those bins that produce the shortest possible codeword. At the decoder side, a similar process is executed for discarding the bins that have been added to obey the delay constraint. Therefore, the decoder maintains a counter C that counts the codewords that have been read from the bit buffer (this counter can be maintained in the bit buffer). This counter C is initialized (e.g. with zero) at the beginning of the decoding of a data packet and is increased by one after a codeword is read. In addition, each bin decoder 22 contains a counter Cx, which stores the value of the codeword counter C before the last codeword was read by the corresponding bin decoder 22. I.e., when a particular bin decoder 22 reads a new codeword, its counter Cx is set equal to C as a first step and then the codeword is read from the bit buffer. When a request for a bin 19 is sent to a particular bin buffer 20 and the difference (C−Cx) between the overall codeword counter C and the counter Cx of the connected bin decoder 22 is greater than the maximum number of codeword buffer entries N, all bins that are currently stored in the particular bin buffer 20 are discarded and ignored. Beside that additional step, the decoding is operated as described above. If the bin buffer 20 to which a request for a bin 19 is sent is empty (either because all bins have already been removed or because the low-delay mechanism did discard all bins in the first step after the bin request has been received), the connected bin decoder 22 reads one or more new codewords from the bit buffer 38 etc.

In another embodiment, the measure for the delay (or an upper bound of the delay) is the sum of the maximum codeword lengths for the active buffer entries in the codeword buffer, where the maximum codeword length for a particular buffer entry depends on the bin decoded that is associated with that buffer entry. As illustration, the maximum codeword lengths for the buffer entries are indicated in the examples in 6. Note again that the first buffer entry is a reserved buffer entry or a free buffer entry, since if the first buffer entry contains a codeword, this codeword is written to the bitstream. Let the maximum allowed buffer delay (as determined by the application) be D bits. This maximum buffer delay D has to be known to both encoder and decoder. In an embodiment, the maximum buffer delay D is fixed by the application. In another embodiment, the maximum buffer delay D is signaled inside the bitstream, e.g., in the header of the data packet (or slice header) or in a parameter set, which is included in the bitstream. It can be signaled in units of bits, or bytes, or a multiple of bits, or a multiple of bytes. If a bin encoder 10 sends a request for the reservation of one or more new buffer entries to the codeword buffer 29, the following process is executed before a new codeword buffer entry is reserved (i.e., it is executed multiple times if multiple codeword buffer entries are reserved by one request).

If the sum of the maximum codeword lengths for all currently active buffer entries plus the maximum codeword length for the buffer entry that will be reserved is greater than the maximum buffer delay D, the first buffer entry (which is reserved) is flushed by the process described above until the sum of the maximum codeword lengths for all active buffer entries plus the maximum codeword length for the buffer entry that will be reserved is less than or equal to the maximum buffer delay D. As an example, let's consider the example in FIG. 8(*b*). The sum of the maximum codeword lengths for all currently active buffer entries is 29. Let's assume that the maximum buffer delay D is set equal to 32. If the next buffer entry is reserved by bin encoder 2 for which the maximum codeword length is equal to 3, the first buffer entry is not flushed, since 29+3 is not greater than 32. But if the next buffer entry is reserved by bin encoder 1 for which the maximum codeword length is equal to 7, the first buffer entry is flushed, since 29+7 is greater than 32. The flushing of the reserved buffer entry is done as described above (by adding bin with particular or arbitrary values to the corresponding bin buffer).

At the decoder side, a similar process is executed for discarding the bins that have been added to obey the delay constraint. Therefore, the decoder maintains a counter C that counts the maximum codeword length for the codewords that have been read from the bit buffer (this counter can be maintained in the bit buffer). Note that the maximum codeword lengths that are associated with different bin decoders can be different. The counter C is initialized (e.g. with zero) at the beginning of the decoding of a data packet and it is increased after a codeword is read. This counter is not increased by the actual length of the read codewords, but by its maximum length. I.e., if a codeword is read by a particular bin decoder and the maximum codeword length that is associated with the codeword table used by the particular bin decoder is Lx (a different bin decoder can be associated with a different maximum codeword length), the counter C is increased by Lx. In addition to the overall counter C, each bin decoder 22 contains a counter Cx, which stores the value of the codeword counter C before the last codeword was read by the corresponding bin decoder 22. I.e., when a particular bin decoder 22 reads a new codeword, its counter Cx is set equal to C as a first step and then the codeword is read from the bit buffer. When a request for a bin 19 is sent to a particular bin buffer 20 and the difference (C−Cx) between the overall counter C and the counter Cx of the connected bin decoder 22 is greater than the maximum buffer delay D, all bins that are currently stored in the particular bin buffer 20 are discarded and ignored. Beside that additional step, the decoding is operated as described above. If the bin buffer 20 to which a request for a bin 19 is sent is empty (either because all bins have already been removed or because the low-delay mechanism did discard all bins in the first step after the bin request has been received), the connected bin decoder 22 reads one or more new codewords from the bit buffer 38 etc.

Thus, the plurality of entropy decoders 22 and the selector 18 may be configured to intermittently discard suffixes of symbol sequences so as to not participate in forming the sequence of symbols to be reconstructed 29. The intermittently discarding may be performed at events where a number of codewords having been retrieved from the codeword entry by the plurality of entropy decoders between two consecutive codeword retrievals of a respective entropy decoder from the codeword entry, fulfils a predetermined criterion. The plurality of entropy encoders and the codeword buffer may, in turn, be configured to intermittently extend currently forwarded but not yet mapped symbols to valid symbol sequences by don't-care symbols having the currently forwarded but not yet mapped symbols as prefix, map the thus extended symbol sequences into codewords, enter the thus obtained codewords into the reserved codeword entries and flush the codeword entries. The intermittently extending, entering and flushing may take place at events where a number of reserved codeword entries plus a number of codeword entries having codewords entered therein fulfils a predetermined criterion. The predetermined criteria may take the maximum lengths of codewords of the plurality of encoder/decoder pairs into account.

Figure 10:
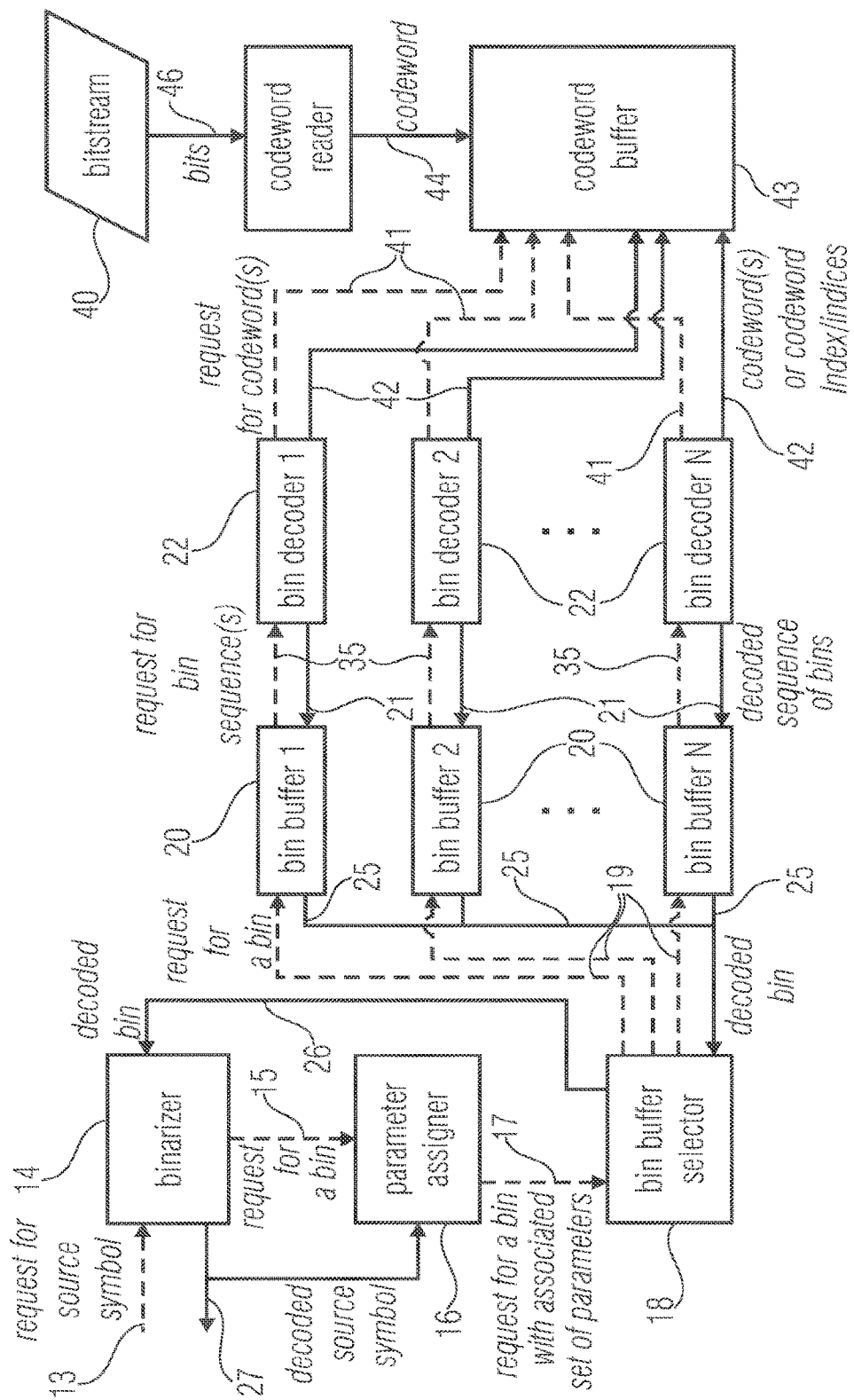
FIG. 10 shows a block diagram of a PIPE decoder according to an embodiment using codeword interleaving using a single set of codewords.

For some architectures, the above described embodiment for the codeword interleaving might result in a drawback in terms of the decoding complexity. As illustrated in FIG. 9, all bin decoders 22 read codewords (in the general case, variable-length codewords) from a single bit buffer 38. The reading of the codewords cannot be done in parallel, since the codeword has to be read in the correct order. That means, a particular bin decoder has to wait until other bin decoders finish the reading of codewords. And when the complexity of the reading of the variable-length codewords is significant in relation to the remainder of the (partially parallelized) decoding process, this access of the variable-length codewords can be a bottleneck for the entire decoding process. There are some variations of the described embodiments that can be employed for reducing the complexity of the access from the single bit buffer, a few of them will be described in the following. In one embodiment, there exists a single set of codewords (representing for instance a redundancy-free prefix code) and the set of codewords that is used for each bin decoder 22 is a subset of the single codeword set. Note that different bin decoders 22 can use different subsets of the single codeword set. Even if the codeword sets that are used by some of the bin decoders 22 are the same, their association with bin sequences is different for different bin decoders 22. In a particular embodiment, the same set of codewords is used for all bin decoders 22. If we have a single codeword set that includes the codeword sets for all bin decoders as subsets, the parsing of the codewords can be done outside the bin decoders, which can reduce the complexity of the codeword access. The PIPE encoding process is not changed in relation to the above described process. The modified PIPE decoding process is illustrated in FIG. 10. A single codeword reader is fed with bits 46 from the bitstream 40 and parses the—in general variable-length—codewords. The read codewords 44 are inserted into a codeword buffer 43, which represents a first-in-first-out buffer. A bin decoder 22 sends a request for one or more codewords 41 to the codeword buffer 43 and as response to this request, the one or more codewords are removed from the codeword buffer (in sequential order) and send to the corresponding bin decoder 22. Note that with this embodiment, the potentially complex codeword parsing can be done in a background process and it doesn't need to wait for the bin decoders. The bin decoders access already parsed codewords, the potentially complex codeword parsing is no more part of a request to the overall buffer. Instead already parsed codewords are send to the bin decoders, which can also be implemented in a way that only codeword indices are send to the bin decoders.

Interleaving of Fixed-Length Bit Sequences

A further way of reducing the PIPE decoder complexity can be achieved when the bin decoders 22 don't read variable-length codewords from the global bit buffer 38, but instead they read fixed-length sequences of bits from the global bit buffer 38 and add these fixed-length sequences of bits to a local bit buffer, where each bin decoder 22 is connected with a separate local bit buffer. The variable-length codewords are then read from the local bit buffer. Hence, the parsing of variable-length codewords can be done in parallel, only the access of fixed-length sequences of bits has to be done in a synchronized way, but such an access of fixed-length sequences of bits is usually very fast, so that the overall decoding complexity can be reduced for some architectures. The fixed number of bins that are sent to a particular local bit buffer can be different for different local bit buffer and it can also vary over time, depending on certain parameters as events in the bin decoder, bin buffer, or bit buffer. However, the number of bits that are read by a particular access does not depend on the actual bits that are read during the particular access, which is the important difference to the reading of variable-length codewords. The reading of the fixed-length sequences of bits is triggered by certain events in the bin buffers, bin decoders, or local bit buffers. As an example, it is possible to request the reading of a new fixed-length sequence of bits when the number of bits that are present in a connected bit buffer falls below a predefined threshold, where different threshold values can be used for different bit buffers. At the encoder, it has to be insured that the fixed-length sequences of bins are inserted in the same order into the bitstream, in which they are read from the bitstream at the decoder side. It is also possible to combine this interleaving of fixed-length sequences with a low-delay control similar to the ones explained above. In the following, an embodiment for the interleaving of fixed-length sequences of bits is described.

Figure 11:
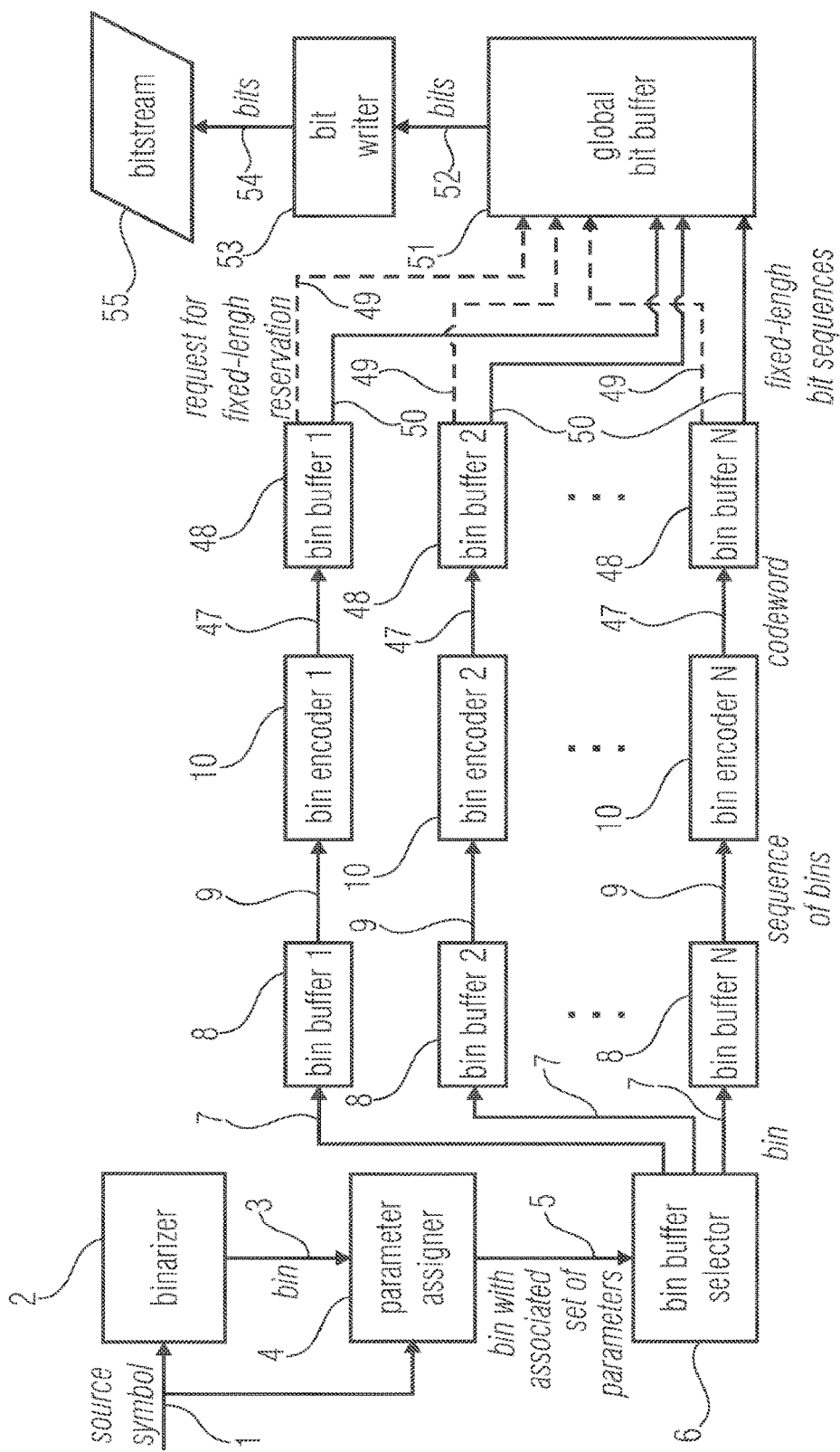
FIG. 11 shows a block diagram of a PIPE encoder according to an embodiment using interleaving of fixed-length bit sequences.

FIG. 11 shows an illustration of the PIPE encoder structure for the embodiment that interleaves fixed-length sequences of bits for two or more bin encoders. In contrast to the embodiment depicted in FIG. 7, the bin encoders 10 are not connected with a single codeword buffer. Instead, each bin encoder 10 is connected with a separate bit buffer 48, which stores bits for the corresponding partial bitstream. All bit buffers 48 are connected to a global bit buffer 51. The global bit buffer 51 is connected to a bit writer 53, which removes the bits 52 in coding/decoding order from the global bit buffer and writes the removed bits 54 to the bitstream 55. On a certain events in a particular bit buffer 48 or the connected bin encoder 10 or bin buffer 8, the bit buffer 48 sends a request 49 to the global bit buffer 51 by which a certain number of bits is reserved in the global bit buffer 51. The requests for the reservation of fixed-length bit sequences 49 are processed in sequential order. The global bit buffer 51 represents a first-in-first-out buffer in a certain way; bits that are reserved earlier are earlier written to the bitstream. It should be noted that different bit buffers 48 can reserved a different amount of bits, which can also vary over time based on already coded symbols; but the number of bits that are reserved by a particular request is known at the time at which the request is sent to the global bit buffer.

In a particular, the bit buffers 48 and the global bit buffer 51 are operated as described in the following. The amount of bits that is reserved by a particular bit buffer 48 is denoted as Nx. This number of bits Nx can be different for different bit buffers 48 and it can also vary over time. In an embodiment, the number of bits Nx that are reserved by a particular bit buffer 48 is fixed over time. The reservations for a fixed number Nx of bits 49 are triggered based on the number of bits Mx in the bit buffers 48, the number of bits Nx for the reservation requests, and the associated maximum codeword length Lx. Note that each bin encoder 10 can be associated with a different maximum codeword length Lx. If a bin 7 is sent to a particular bin buffer 8, and the particular bin buffer 8 is empty, and not more than one sequence of Nx bits is reserved in the global bit buffer for the bit buffer 48 that is connected with the particular bin buffer (via a bin encoder), and the difference Nx−Mx between the number Nx of bits that are reserved by a reservation request of the bit buffer 48 that is connected (via a bin encoder) with the particular bin buffer 8 and the number of bits Mx that are currently present in this bit buffer 48 is less than the maximum codeword length Lx that is associated with the corresponding bin encoder 10, the connected bit buffer 49 sends a request 49 for the reservation of Nx bits to the global bit buffer 51. The global bit buffer 51 reserves Nx bits for the particular bit buffer 48 and increases its pointer for the next reservation. After the Nx bits have been reserved in the global bit buffer, the bin 7 is stored in bin buffer 8. If this single bin does already represent a bin sequence that is associated with a codeword, the bin encoder 10 removes this bin from the bin buffer 8 and writes the corresponding codeword 47 to the connected bit buffer 48. Otherwise (this single bin does already represent a bin sequence that is associated with a codeword), further bins 7 are accepted by the particular bin buffer 8 until the bin buffer 8 contains a bin sequence that is associated with a codeword. In this case, the connected bin encoder 10 removes the bin sequence 9 from the bin buffer 8 and writes the corresponding codeword 47 to the connected bit buffer 48. If the resulting number of bits Mx in the bit buffer 48 is greater than or equal to the number of reserved bits Nx, the Nx bits that were first written to the bit buffer 48 are inserted into the previously reserved space in the global bit buffer 51. For the next bin 7 that is sent to the particular bin buffer 8, the same process as specified above is executed; i.e., it is checked first whether a new number of Nx bits has to be reserved in the global bit buffer (if Nx−Mx is less than Lx) and then the bin is inserted into the bin buffer 8, etc. The bit writer writes the fixed-length bit sequences of the global bit buffer in the order in which they have been reserved. If the first fixed-length entry in the global bit buffer 51 contains a fixed-length bit sequence that has been actually inserted in the global bit buffer (i.e., it is not only reserved), the bit writer 53 removes the bits for this bit sequence 52 from the global bit buffer 51 and writes the bits 54 to the bitstream. This process is repeated until the first fixed-length entry in the global bit buffer represents a reserved or a free entry. If the first fixed-length entry in the global bit buffer represents a reserved entry, the bit writer 53 waits until this entry is filled with actual bits before it writes further bits 54 to the bitstream 55.

At the end of a data packet, the bin buffers are flushed as described above. In addition, the bit buffers have to be flushed by adding bits with a particular or an arbitrary value until all reserved buffer entries in the global bit buffer are filled and written to the bitstream.

In FIG. 12, two examples for the possible status of the global bit buffer 51 are illustrated. In example (a), a case is illustrated in which different bit buffers/bin encoders reserve a different number of bits. The global bit buffer contains 3 entries with actually written fixed-length bit sequences and 4 entries with reserved fixed-length bit sequences. The first fixed-length entry already contains actual bits (which must have been just inserted by bit buffer/bin encoder 2); this entry (i.e., the corresponding 8 bits) can be removed and written to the bitstream. The next entry reserves 10 bits for bin encoder 3, but actual bits haven't been inserted yet. This entry cannot be written to the bitstream; it has to be waited until the actual bits are inserted. In the second example (b), all bit buffers/bin encoders reserved the same number of bits (8 bits). The global bit buffer contains 4 reservations for 8 bit sequences and 3 actually written 8 bit sequences. The first entry contains a reservation for 8 bits for bin encoder 3. Before any new bits can be written to the bitstream, the bit writer has to wait until bit buffer/bin encoder 3 writes the actual values of the 8 bits into this reserved entry.

Figure 13:
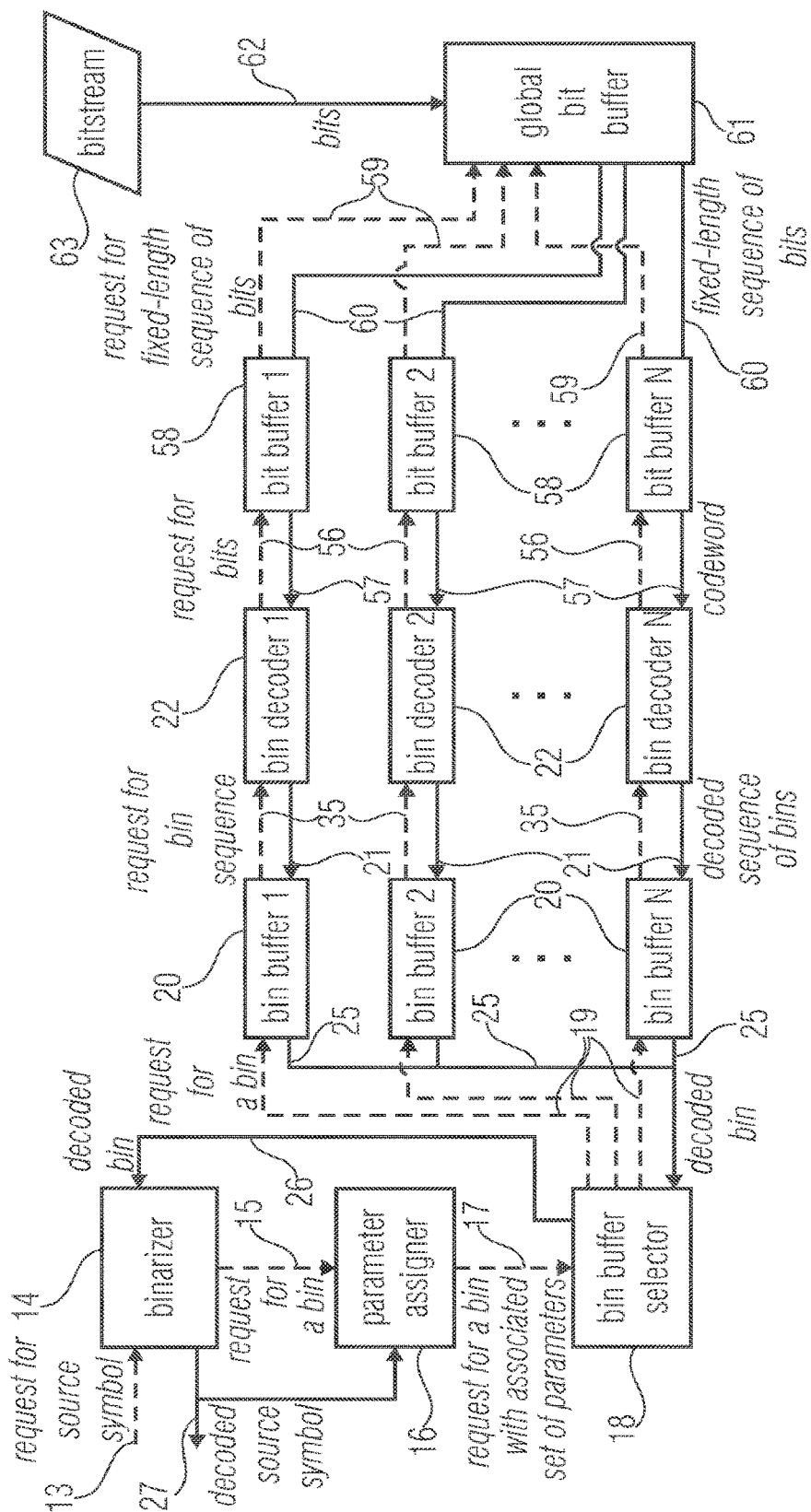
FIG. 13 shows a block diagram of a PIPE decoder according to an embodiment using interleaving of fixed-length bit sequences.

FIG. 13 shows an illustration of the PIPE decoder structure for the embodiment of the invention that interleaves fixed-length sequences of bits. In contrast to the embodiment depicted in FIG. 9, the bin decoders 22 are not connected with a single bit buffer. Instead, each bin decoder 22 is connected with a separate bit buffer 58, which stores bits from the corresponding partial bitstream. All bit buffers 58 are connected to a global bit buffer 61. The bits 62 from the bitstream 63 are inserted into the global bit buffer 61. On a certain events in a particular bit buffer 58 or the connected bin decoder 22 or bin buffer 20, the bit buffer 58 sends a request 59 to the global bit buffer 61 by which a fixed-length sequence of bits 60 is removed from the global bit buffer 61 and inserted into the particular bit buffer 58. The requests for the fixed-length bit sequences 59 are processed in sequential order. The global bit buffer 61 represents a first-in-first-out buffer; bits that are earlier inserted into the global bit buffer are earlier removed. It should be noted that different bit buffers 58 can request a different amount of bits, which can also vary over time based on already decoded symbols; but the number of bits that are requested by a particular request is known at the time at which the request is sent to the global bit buffer. It should be noted that the global bit buffer 61 is not absolutely necessitated, since the codewords could also be directly read from the bitstream. The global bit buffer 61 is mainly included in the illustration for clearly separate different aspects of the processing chain.

In an embodiment, the bit buffers 58 and the global bit buffer 61 are operated as described in the following. The amount of bits that is requested and read by a particular bit buffer 58 is denoted as Nx, it is equal to the amount of bits that is written to the global bit buffer by the corresponding bit buffer at the encoder side. This number of bits Nx can be different for different bit buffers 58 and it can also vary over time. In an embodiment of the invention, the number of bits Nx that are requested and read by a particular bit buffer 58 is fixed over time. The reading of a fixed number Nx of bits 60 is triggered based on the number of bits Mx in the bit buffer 58 and the associated maximum codeword length Lx. Note that each bin decoder 22 can be associated with a different maximum codeword length Lx. If a request for a bin 19 is sent to a particular bin buffer 20, and the particular bin buffer 20 is empty, and the number Mx of bits in the bit buffer 58 that is connected (via a bin decoder) with the particular bin buffer 20 is less than the maximum codeword length Lx that is associated with the corresponding bin decoder 22, the connected bit buffer 58 sends a request 59 for a new sequences of Nx bits to the global bit buffer 61. As response to this request, the first Nx bits are removed from to global bit buffer 61 and this sequence of Nx bits 60 is sent to the bit buffer 58 from which the request was sent. Finally, this sequence of Nx bits is added to the corresponding bit buffer 58. Then the next codeword 57 is read from this bit buffer, and the connected bin decoder 22 inserts the associated bin sequence 21 into the connected bin buffer 20. As final response to the original request for a bin 19, the first bin is removed from the bin buffer 20 and this decoded bin 25 is sent to the bin buffer selector 18. When the next bin request 19 is sent to the particular bin buffer 20 and the bin buffer is not empty, the next bit is removed from the bin buffer 20. If the bin buffer is empty but the number Mx of bits in the connected bit buffer 58 is greater than or equal to the associated maximum codeword length Lx, the next codeword is read from the bit buffer and a new bin sequence is inserted in the bin buffer, from which the first bit is removed and sent to the bin buffer selector. If the bin buffer is empty and the number Mx of bits in the connected bit buffer 58 is less than the associated maximum codeword length Lx, the next sequence of Nx bits is read from the global bit buffer 61 and inserted into the connected local bit buffer 58, the next codeword is read from the bit buffer, a new bin sequence is inserted in the bin buffer, and the first bin of the sequence is removed and sent to the bin buffer selector. This process is repeated until all source symbols are decoded.

At the end of a data packet, more bins and/or bits than necessitated for decoding the requested source symbols might be inserted into the bin buffer and/or bit buffer. The remaining bins in the bin buffer and the remaining bits in the bit buffer are discarded and ignored.

Interleaving of Fixed-Length Bit Sequences with a Low-Delay Constraint

The described embodiment for an PIPE encoder and decoder with interleaving of fixed-length bit sequences can also be combined with the scheme for controlling the encoder buffer delay, which is described above. The PIPE coding concept is the same as in the embodiment with delay control described above. If a measure related to the delay or an upper bound of the delay (see below) exceeds a specified threshold, the first reserved buffer entry is filled by flushing the corresponding bin buffer (using a similar mechanism as at the end of a data packet) and potentially writing additional bits for filling all bits of the reserved fixed-length buffer entry. By such a mechanism, the number of waiting buffer entries is reduced until the associated delay measure is less than the specified threshold. At the decoder side, the bins and bits that have been inserted at the encoder side in order to obey the delay constraint have to be discarded. For this discarding of bins and bits basically the same mechanism as at the encoder side can be used.

In an embodiment, the measure for the delay (or an upper bound of the delay) is the number of bits in the active buffer entries in the global bit buffer, where the number of active buffer entries is the number of reserved fixed-length buffer entries plus the number of fixed-length buffer entries that contain already written bits. Note that the first buffer entry is a reserved fixed-length buffer entry or a free buffer entry, since if the first buffer entry contains written bits, these bits are written to the bitstream. Let the maximum allowed buffer delay (as determined by the application) be D bits. This maximum buffer delay D has to be known to both encoder and decoder. In an embodiment of the invention, the maximum buffer delay D is fixed by the application. In another embodiment of the invention, the maximum buffer delay D is signaled inside the bitstream, e.g., in the header of the data packet (or slice header) or in a parameter set, which is included in the bitstream. It can be signaled in units of bits, or bytes, or a multiple of bits, or a multiple of bytes. If a bin encoder 10 sends a request for the reservation of a new fixed-length bit sequence to the global bit buffer 51, the following process is executed before a new fixed-length buffer entry is reserved.

If the number of bits in the active buffer entries in the global bit buffer plus the number of bits that will be reserved by the current reservation request is greater than the maximum buffer delay D, the first buffer entry (which is reserved) is flushed by the process described in the following until the number of bits in the active buffer entries in the global bit buffer plus the number of bits that will be reserved by the current reservation request is less than or equal to the maximum buffer delay D. The flushing of a reserved fixed-length buffer entry is similar to the flushing at the end of a data packet: The bin encoder 10 that is connected with the bit buffer 48 that has reserved the corresponding first buffer entry is flushed by adding bins with particular or arbitrary values to the connected bin buffer 8 until the resulting bin sequence represents a bin sequence that is associated with a codeword, the codeword is then inserted into the corresponding bit buffer 48. As mentioned above, one way for adding bins to the bin buffer is to add those bins that produce the shortest possible codeword. If, after the writing of the codeword to the connected bit buffer and a potential insertion of a fixed-length bit sequence into the global bit buffer, there are still bits in the bit buffer (i.e., the written codeword did not completely fill the reserved fixed-length sequence of bits), further bits with particular or arbitrary values are added to the bit buffer until all bits are removed from the bit buffer and written to the reserved buffer entry. Finally, at the end of this process, the completed buffer entry (the first fixed-length entry in the global bit buffer) is removed from the global bit buffer and written to the bitstream.

At the decoder side, a similar process is executed for discarding the bins and bits that have been added to obey the delay constraint. Therefore, the decoder maintains a counter C that counts the bits that have been read from the global bit buffer (this counter can be maintained in the global bit buffer). The counter C is initialized (e.g. with zero) at the beginning of the decoding of a data packet and it is increased after a fixed-length sequence of is read. If a fixed-length sequence of Nx bits is read from the global bit buffer 61, the counter C is increased by Nx. In addition to the overall counter C, each bit buffer 58 contains a counter Cx, which stores the value of the bit counter C before the last fixed-length bit sequence was read into the corresponding bit buffer 58. When a particular bit buffer 58 reads a new fixed-length bit sequence, its counter Cx is set equal to C as a first step and then the fixed-length bit sequence is read from the global bit buffer 61. When a request for a bin 19 is sent to a particular bin buffer 20 and the difference (C−Cx) between the overall counter C and the counter Cx of the connected bit buffer 58 is greater than the maximum buffer delay D, all bins that are currently stored in the particular bin buffer 20 and all bits that are stored in the connected bit buffer 58 are discarded and ignored. Beside that additional step, the decoding is operated as described above. If the bin buffer 20 to which a request for a bin 19 is sent is empty (either because all bins have already been removed or because the low-delay mechanism did discard all bins in the first step after the bin request has been received), the connected bin decoder 22 attempts to read a new codeword from the connected bit buffer 58. If the number of bits in the bit buffer 58 is less than the maximum codeword length, a new fixed-length bit sequence is read from the global bit buffer 61, before the codeword is read, etc.

The embodiments just having been described with respect to FIGS. 7 to 13 related to possibilities to achieve an interleaved bitstream path between PIPE encoder 104 on the one hand and PIPE decoder 202 on the other hand. As has been described above with respect to FIGS. 1 and 2, entropy encoding and decoding apparatus may be connected to each other by two separate channels, one of which conveys VLC bitstream 112 and the other one of which conveys the interleaved PIPE encoded bitstream. However, there are also possibilities to interleave even both the VLC bitstream 112 as well as the PIPE encoded bitstreams 118, and such possibilities will be described later on with respect to FIGS. 20 to 24. However, before that, mathematical background is provided with regard to the PIPE coding scheme as well as details regarding how to optimally subdivide the probability interval with assigning the resulting individual partial intervals to the individual entropy encoders 116 and entropy decoders 210, respectively.

As already noted, in PIPE coding the event space of the input sequence of discrete symbols is mapped onto a small set of binary probability intervals. The probability models for the source symbols can be fixed or adaptive while entropy coding using the probability intervals remains fixed and is decoupled from the modeling stage. Each of the probability intervals can be coded using a very simple entropy code that has the complexity level of Huffman codes. The excess rate of the probability interval partitioning entropy (PIPE) code is similar to that of pure arithmetic coding.

Entropy coding, in general, can be considered as the most generic form of lossless data compression. Lossless compression aims to represent discrete data with fewer bits than needed for the original data representation but without any loss of information. Discrete data can be given in the form of text, graphics, images, video, audio, speech, facsimile, medical data, meteorological data, financial data, or any other form of digital data. In many coding applications, the original source data are first mapped onto so-called coding symbols and these coding symbols are then entropy coded. The mapping onto coding symbols can include quantization, in which case the overall coding scheme is lossy. A coding symbol s can take any value of an M-ary (M≥2) alphabet $A=\{a_0, \ldots, a_{M-1}\}$. For the purpose of coding the symbol s, the alphabet is associated with an estimated probability mass function (pmf) $\{p_s(a_0), \ldots, p_s(a_{M-1})\}$ and all dependencies between coding symbols that are not considered in this pmf are neglected. For these abstract settings, the entropy $$H_s = -\sum_{i=0}^{M-1} p_s(a_i)\log_2 p_s(a_i) \quad (B1)$$

is the greatest lower bound for the expected codeword length in bits per symbol, for coding the symbols s, that can be achieved with entropy coding techniques. For decades, Huffman coding and arithmetic coding have dominated practical entropy coding. They are well-known examples of practical codes capable of approximating the entropy limit (in a certain sense).

For a fixed probability distribution, Huffman codes are relatively easy to construct. The most attractive property of Huffman codes is that their implementation can be efficiently realized by the use of variable-length code (VLC) tables. However, when dealing with time-varying source statistics, i.e., changing symbol probabilities, the adaptation of the Huffman code and its corresponding VLC tables is quite demanding, both in terms of algorithmic complexity as well as in terms of implementation costs. Also, in the case of having a dominant alphabet value with $p_s(a_i)>0.5$, the redundancy of the corresponding Huffman code (without using any alphabet extension such as run length coding) may be quite substantial. Another shortcoming of Huffman codes is given by the fact that in case of dealing with higher-order probability modeling, multiple sets of VLC tables may be necessitated.

Arithmetic coding, on the other hand, while being substantially more complex than VLC, offers the advantage of a more consistent and adequate handling when coping with adaptive and higher-order probability modeling as well as with the case of highly skewed probability distributions. Actually, this characteristic basically results from the fact that arithmetic coding provides a mechanism, at least conceptually, to map any given value of probability estimate in a more or less direct way to a portion of the resulting codeword. Being provided with such an interface, arithmetic coding allows for a clean separation between the tasks of probability modeling and probability estimation, on the one hand, and the actual entropy coding, i.e., mapping of symbols to codewords, on the other hand.

Differing from the just-discussed conventional entropy coding schemes, PIPE coding uses probability interval partitioning, the mathematical background of which is described in more detail below.

Consider the sequence of coding symbols $\{s_0, \ldots, s_{N-1}\}$. Each symbol is drawn from an alphabet $s_i \in A_i$. The alphabets $\{a_0^i, a_1^i, \ldots\}$ contain two or more letters each being associated with a probability estimate $p_s(a_m^i)$. The probability estimates $p_s(a_m^i)$ are known to encoder and decoder and may be fixed or variable. It is assumed that variable probabilities are simultaneously estimated at encoder and decoder. The alphabets $A_i$ may either be identical for the sequence of symbols or different symbol types are associated with different alphabets. In the latter case, it is assumed that the decoder knows the alphabet of each symbol in the sequence. This assumption is justified as practical source codec descriptions contain a syntax that stipulates the order of symbols and their alphabets.

The sequence of symbols $\{s_0, \ldots, s_{N-1}\}$ is converted into a sequence of binary symbols, which are also referred to as bins. For each symbol the binarization $$b^i = \{b_0^i \ldots\} = \gamma_b^i(s_i) \quad (B2)$$

represents a bijective mapping of the alphabet letters $a_m^i$ onto ordered sets of bins $b_m^i$. The binarization mapping $\gamma_b^i$ can be different for different symbols $s_i$ or symbol categories. Each bin sequence $i$ for a particular symbol $s_i$ consists of one or more bins $b_k^i$. At the decoder side, a symbols $s_i$ can be reconstructed by the inverse mapping $s_i = (\gamma_b^i)^{-1}(b^i)$ given the sequence of bins $b^i$. As a result of the binarization, a sequence of bins $\{b_0, \ldots, b_{B-1}\}$ is obtained that represents the sequence of source symbols $\{s_0, \ldots, s_{N-1}\}$.

All bins $b_j$ are associated with the same binary alphabet $B=\{0,1\}$, but the corresponding binary pmfs $\{p_0^j, p_1^j\}$, with $p_1^j = p_0^j$, are usually different. A binary pmf $\{p_0^j, p_1^j\}$ can be described by the less probable bin (LPB) value $b_{LPB}^j$ and its probability $p_{LPB}^j$ (with $p_{LPB}^j \leq 0.5$). This binary probability description $\{b_{LPB}^j, p_{LPB}^j\}$ can be directly derived from the probability estimates $p_s(a_m^i)$ for the symbol alphabets given the binarization mappings $\gamma_b^i$. It is also possible (and often advantageous) to directly estimate $\{b_{LPB}^j, p_{LPB}^j\}$ simultaneously at encoder and decoder side. Therefore, the bins can be associated with a probability model (which is also referred to as context) based on the syntax and previously coded symbols or bins. And for each probability model, the probability description $\{b_{LPB}^j, p_{LPB}^j\}$ can be estimated based on the values of the bins that are coded with the probability model. An example for such an binary probability modeling is described with respect to CABAC of H.264.

Since the binary entropy function $$H(p) = -p\log_2(p) - (1-p)\log_2(1-p) \quad (B3)$$

is symmetric around $p=0.5$, the same binary coder can be used for coding all bins that are associated with the same LPB probability $p_{LPB}^j$, independent of the value of $b_{LPB}^j$. Therefore, the sequence of bins $\{b_0, \ldots, b_{B-1}\}$ is converted into a sequence of coding bins $\{b_0^c, \ldots, b_{B-1}^c\}$. For each bin $b_j$, the corresponding bijective mapping $\gamma_c^j$ is specified by $$b_j^c = \gamma_c^j(b_j) = b_j \oplus b_{LPB}^j \quad (B4)$$

where $\oplus$ denotes the exclusive or operator. At the decoder side, the bins $b_j$ can be reconstructed given the coding bins $b_j^c$ and the corresponding LPB value $b_{LPB}^j$ by the inverse mapping $b_j = (\gamma_c^j)^{-1}(b_j^c) = b_j^c \oplus b_{LPB}^j$. A coding bin $b_j^c = 0$ specifies that the value of corresponding bin $b_j$ is equal to the LPB value $b_{LPB}^j$ and a coding bin $b_j^c = 1$ specifies that the value of the corresponding bin $b_j$ is equal to the more probable bin (MPB) value $1 - b_{LPB}^j$.

The sequence of coding bins $\{b_0^c, \ldots, b_{B-1}^c\}$ does uniquely represent the sequence of source symbols $\{s_0, \ldots, s_{N-1}\}$ and the corresponding probability estimates, which can be employed for entropy coding, are completely described by the LPB probabilities $p_{LPB}^j$ (with $p_{LPB}^j \leq 0.5$). Hence, only probabilities in the half-open interval $(0, 0.5]$ need to be considered for designing the binary entropy coder for the coding bins $b_j^c$.

For the actual binary entropy coding, the sequence of coding bins $\{b_0^c, \ldots, b_{B-1}^c\}$ is projected onto a small number of probability intervals $I_k$. The LPB probability interval $(0, 0.5]$ is partitioned into K intervals $I_k = (p_k, p_{k+1}]$ $$\bigcup_{k=0}^{K-1} I_k = (0, 0.5] \text{ and } I_k \cap I_j = \emptyset \text{ for } k \neq j \quad (B5)$$

The set of K intervals is characterized by K−1 intervals borders $p_k$ with $k=1, \ldots, K-1$. Without loss of generality we assume $p_k < p_{k+1}$ for $k=0, \ldots, K$. The outer interval borders are fixed and given by $p_0 = 0$ and $p_K = 0.5$. A simple non-adaptive binary entropy coder is designed for each interval $I_k$. All coding bin $b_j^c$ with associated LPB probabilities $p_{LPB}^j$ ∈$I_k$ are assigned to the interval $I_k$ and are coded with the corresponding fixed entropy coder.

In the following description, all bins represent coding bins $b_j^c$ and all probabilities p are LPB probabilities $p_{LPB}^j$.

For investigating the impact of the probability interval discretization on the coding efficiency, we assume that we can design an optimal entropy coder for a fixed probability that achieves the entropy bound. Each probability interval $I_k=(p_k, p_{k+1}]$ is associated with a representative probability $p_{I_k} \in I_k$ and the corresponding optimal entropy coder shall achieve the entropy limit for this representative probability. Under these assumption, the rate for coding a bin with probability p using the optimal entropy coder for the interval representative $p_{I_k}$ is given by $$R(p, p_{I_k}) = -p\log_2(p_{I_k}) - (1-p)\log_2(1-p_{I_k}) = H(p_{I_k}) + (p - p_{I_k})H'(p_{I_k}) \quad (B6)$$

where H(p) represents the binary entropy function 3 and $$H'(p) = \log_2\left(\frac{1-p}{p}\right) \quad (B7)$$

is its first derivative. We further assume that the distribution of the probabilities in the interval (0,0.5] is given by f(p), with $\int_0^{0.5} f(p)dp = 1$. Then, the expected rate, in bits per bin, for a given set of K intervals $\{I_k\}$ with corresponding representative probabilities $\{p_{I_k}\}$ can be written as $$R = R(\{I_k\}, \{p_{I_k}\}) = \sum_{k=0}^{K-1}\left(\int_{p_k}^{p_{k+1}} R(p, p_{I_k})f(p)dp\right) \quad (B8)$$

The first partial derivative with respect to any representative probability $p_{I_k}$, with k=0, . . . , K-1, is given by $$\frac{\partial}{\partial p_{I_k}}R = \frac{p_{I_k}\int_{p_k}^{p_{k+1}} f(p)dp - \int_{p_k}^{p_{K+1}} pf(p)dp}{p_{I_k}(1-p_{I_k})\ln 2} \quad (B9)$$

The equation $$\frac{\partial}{\partial p_{I_k}}R = 0$$

has a single solution $$p_{I_k}^* = \frac{\int_{p_k}^{p_{k+1}} pf(p)dp}{\int_{p_k}^{p_{k+1}} f(p)dp} \quad (B10)$$

for the representative probability $p_{I_k}$ inside the domain of definition $I_k$. The second partial derivative for this solution $$\frac{\partial^2}{\partial p_{I_k}^2}R(p_{I_k}^*) = \frac{\int_{p_k}^{p_{k+1}} f(p)dp}{p_{I_k}^*(1-p_{I_k}^*)\ln 2} \quad (B11)$$

is greater than zero if $$\int_{p_k}^{p_{k+1}} f(p)dp > 0 \quad (B12)$$

Hence, if condition B12 is fulfilled, the value $b_{I_k}^*$ given in eq. B10 is the representative probability for an interval $I_k$ that minimizes the expected overall rate R given the interval boundaries $p_k$ and $p_{k+1}$. Otherwise, no bin is projected to the interval $I_k$ and the representative probability $p_{I_k} \in I_k$ can be arbitrarily chosen without any impact on the overall rate R; but such a configuration should be avoided, since the interval $I_k$ would not be employed for entropy coding.

For finding a condition for optimal interval borders, we investigate the first derivatives of the expected overall rate R with respect to the interval borders $p_k$ with k=1, . . . , K-1. If f(p)>0 for all p∈$[p_{I_{k-1}}, p_{I_k})$, the equation $$\frac{\partial}{\partial p_k}R = 0$$

has a single solution $$p_k^* = \frac{H(p_{I_k}) - p_{I_k}H'(p_{I_k}) - H(p_{I_{k-1}}) + p_{I_{k-1}}H'(p_{I_{k-1}})}{H'(p_{I_{k-1}}) - H'(p_{I_K})} \quad (B13)$$

for the interval border $p_k$ inside the domain of definition $[p_{I_{k-1}}, p_{I_k})$ and the second partial derivative for this solution $$\frac{\partial^2}{\partial p_k^2}R(p_k^*) = f(p_k^*)(H'(p_{I_{k-1}}) - H'(p_{I_k})) \quad (B14)$$

is greater than zero, so that $p_k^*$ is the interval border $p_k$ ∈$[p_{I_{k-1}}, p_{I_k})$, that minimizes the expected overall rate R given the interval representatives $p_{I_{k-1}}$ and $p_{I_k}$. If there exist probabilities p∈$[p_{I_{k-1}}, p_{I_k})$ with f(p)=0, the equation $$\frac{\partial}{\partial p_k}R = 0$$

has multiple solutions, but $p_k^*$ as given in eq. B13 is still optimal even though further optimal solutions may exist. Given the number of intervals K and the probability distribution f(p), the interval borders $p_k$, with k=1, . . . ,K-1, and the interval representatives $p_{I_k}$, with k=0, . . . ,K-1, that minimize the expected overall rate R can be obtained by solving the equation system given by eqs. B10 and B13 subject to the conditions B12 for k=K-1. This can be achieved with the following iterative algorithm.

Algorithm 1:

1) Partition the interval (0,0.5] into K arbitrary intervals $I_k=(p_k, p_{k+1}]$ with $p_0=0$, $p_K=0.5$, and $p_k<p_{k+1}$ for all k=0, . . . , K-1 in a way that the conditions B12 are obeyed for all k=0, . . . , K-1.

Figure 14:
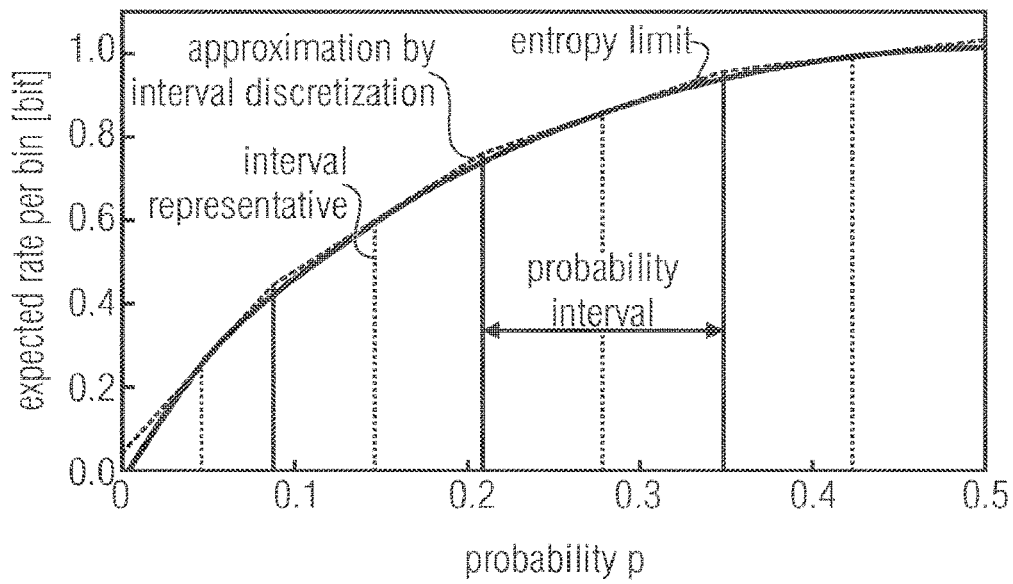
FIG. 14 shows a graph for illustrating an optimal probability interval discretization into K=4 intervals assuming a uniform probability distribution in $^{(0,0.5]}$.

2) Update the representatives $p_{I_k}$ with k=0, ..., K−1 according to eq. B10
3) Update the interval borders $p_k$ with k=1, ..., K−1 according to eq. B13
4) Repeat the previous two steps until convergence FIG. 14 shows an example for the optimal interval discretization using the described algorithm. For this example, we assumed a uniform probability distribution f(p)=2 for 0<p≤0.5 and partitioned the probability interval (0, 0.5] into K=4 intervals. It can be seen that the probability interval discretization leads to a piecewise linear approximation A(p) of the binary entropy function H(p) with A(p)≥H (p) for all p ∈(0, 0.5].

As measure for the impact of the interval discretization on the coding efficiency the expected overall rate increase relative to the entropy limit $$\bar{\rho} = \frac{R}{\int_0^{0.5} H(p)f(p)dp} - 1 \tag{B15}$$

can be used. For the particular example of FIG. 14, the expectation value of the entropy $\bar{H} = \int_0^{0.5} H(p) dp$ is equal to 1/(2 ln 2) bit per bin and the rate overhead $\bar{\rho}$ is equal to 1.01%. Table 4 lists rate overheads $\bar{\rho}_{uni}$ and $\bar{\rho}_{lin}$ for the uniform probability distribution and a linear increasing probability distribution f(p)=8p with p∈(0, 0.5], respectively, for selected numbers of intervals K.

TABLE 4

Rate overhead vs. the number of probability intervals for the uniform and a linear increasing probability distribution

| K | 1 | 2 | 4 | 8 | 12 | 16 |
|---|---|---|---|---|----|----|
| $\bar{\rho}_{uni}$ [%] | 12.47 | 3.67 | 1.01 | 0.27 | 0.12 | 0.07 |
| $\bar{\rho}_{lin}$ [%] | 5.68 | 1.77 | 0.50 | 0.14 | 0.06 | 0.04 |

The investigations in this section showed that the discretization of the LPB probability interval (0, 0.5] into a small number of intervals with a fixed probability (e.g., 8 to 10 intervals) has a very small impact on the coding efficiency.

The above discussed entropy coding for probability intervals, enables thus of individual coders using fixed probabilities.

In the following, we first show how an simple code can be designed for fixed probabilities. Given these results, we develop an algorithms that jointly optimizes the code design and the partitioning of the LPB probability interval (0, 0.5].

The entropy coding for fixed probabilities $p=p_{I_k}$ can be done using arithmetic coding or variable length coding. For the latter case, the following approach appears to be simple and very efficient.

Figure 15:
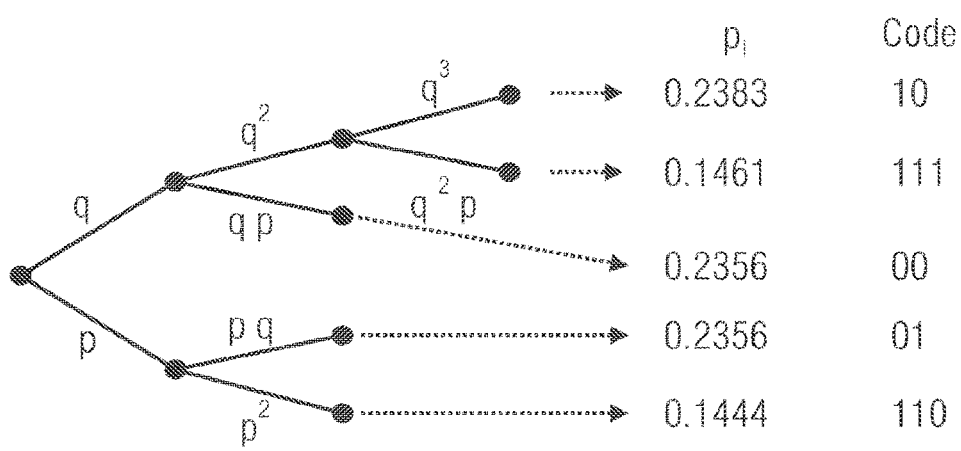
FIG. 15 shows a schematic diagram illustrating a tree of binary events for an LPB probability of p=0.38 and an associated variable length code obtained by the Huffman algorithm.

We consider a binary entropy coding scheme by which a variable number of bins is mapped onto variable length codewords. For unique decodability, the inverse mapping of a codeword to a bin sequence has to be unique. And since we want to design a code that approaches the entropy limit as close as possible, we constrain our considerations to bijective mappings. Such a bijective mapping can be represented by a binary tree where all leaf nodes are associated with codewords, as depicted in FIG. 15. The tree edges represent binary events. In the example of FIG. 15, the lower edges represent the LPB bin value and the upper edges represent the MPB bin value. The binary tree represents a prefix code for the bins if it is a full binary tree, i.e., if every node is either a leaf or has two descendants. Each leaf node is associated with a probability based on the given LPB probability p. The root node has the probability $p_{root}=1$. The probability for all other nodes is obtained by multiplying the probability of the corresponding ancestor with p for the LPB descendants and q=1−p for the MPB descendants. Each leaf node $L_l$ is characterized by the number of LPB edges $a_l$ and the number MPB edges $b_l$ from the root node to the leaf node. For a particular LPB probability p, the probability $p_l$ for a leaf node $L_l=\{a_l, b_l\}$ is equal to $$p_l = p^{a_l}(1-p)^{b_l} \tag{B16}$$

The binary tree T is fully characterized by the number of leaf nodes L and the associated pairs $\{a_l,b_l\}$ with l=0, ..., L−1.

Given a full binary tree T and a LPB probability p, the optimal assignment of codewords to the leaf nodes can be obtained by the Huffman algorithm. The resulting variable number of bits to variable length codewords (V2V) mapping C is characterized by the number of codewords L, which is identical to the number of leaf nodes, and the tuples $\{a_l, b_l, l_l\}$ for l=0, ..., L−1, where h represents the codeword length that is associated with the corresponding leaf node $L_l=\{a_l,b_l\}$. It should be noted that there are multiple possibilities for the codeword assignment given the codeword lengths $\{l_l\}$ and the actual codeword assignment is not important as long as the codewords represent a uniquely decodable prefix code. The expected rate R(p, C) in bits per bin for a given code C and an LPB probability p is the ratio of the expected codeword length and the expected number of bins per codeword $$R(p, C) = \frac{\sum_{l=0}^{L-1} p_l l_l}{\sum_{l=0}^{L-1} p_l(a_l + b_l)} = \frac{\sum_{l=0}^{L-1} p^{a_l}(1-p)^{b_l} l_l}{\sum_{l=0}^{L-1} p^{a_l}(1-p)^{b_l}(a_1 + b_l)} \tag{B17}$$

The code design is often limited by factors as the maximum number of codewords L, the maximum number of bins per codeword, or the maximum codeword length, or it is restricted to codes of particular structures (e.g., for allowing optimized parsing). If we assume that the set $S_C$ of usable codes for a particular application is given, the optimum code $C^* \in S_C$ for a particular LPB probability p can be found by minimizing the expected rate R(p, C)

$$C^*(p) = \arg\min_{\forall C \in S_C} R(p, C) \tag{B18}$$

Figure 16:
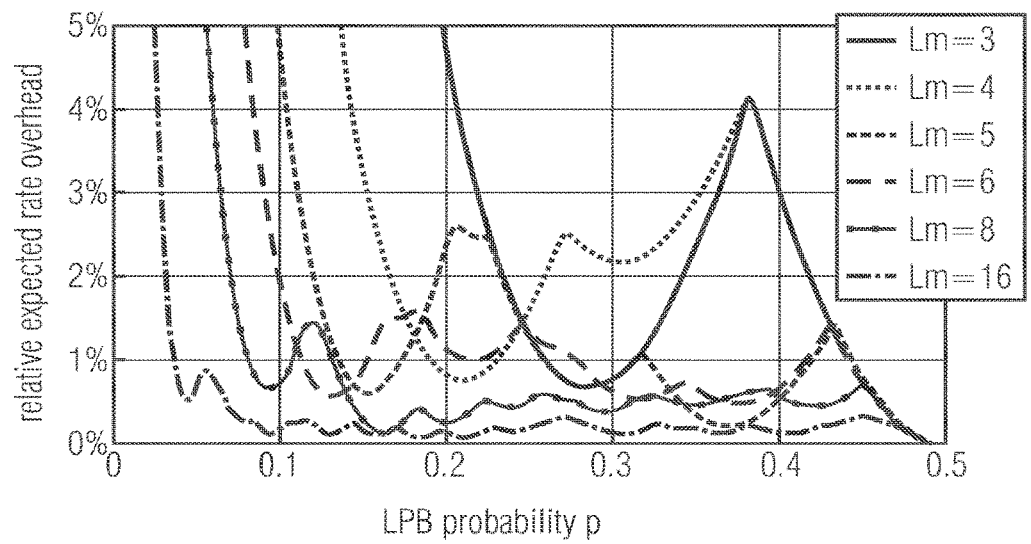
FIG. 16 shows a graph from which the relative bit rate increase p(p,C) for optimal codes C given a maximum number of table entries Lm may be gathered.

As faster alternative, the minimization can also proceed over a given set of binary trees $S_T$ and for each tree only one V2V code C that is obtained by the Huffman algorithm is considered. As an example, we designed V2V codes for various LPB probabilities p by considering all binary trees T for which the number of leaf nodes L is less than or equal to a given maximum $L_m$. In FIG. 16, the relative rate increase ρ(p, C*(p))=R (p, C*(p))/H(p) is plotted over the LPB probability p for selected maximum table sizes $L_m$. The rate increase ρ(p) can usually be reduced by allowing larger table sizes. For larger LPB probabilities, a small table size L of 8 to 16 codewords is usually sufficient for keeping the rate increase ρ(p) reasonably small, but for smaller LPB probabilities (e.g., p<0.1), larger table sizes L are necessitated.

In the previous sections, we considered the optimal probability discretization assuming optimal codes and the code design for fixed LPB probabilities. But since, in general, we cannot achieve the entropy limit with real V2V codes of limited table sizes, the code design and the partitioning of the LPB probability interval (0, 0.5] have to be jointly considered for obtaining an optimized entropy coding design.

For a given interval $I_k=(p_k, p_{k+1}]$, a code $C_k$ of a given set $S_C$ in an optimal code $C_k^*$ if it minimizes the expected rate $R=\int_{p_k}^{p_{k+1}} R(p, C_k) f(p) dp$ for the given interval.

$$C_k^* = \arg\min_{\forall C_k \in S_C} \int_{p_k}^{p_{k+1}} R(p, C_k) f(p) dp \quad \text{(B19)}$$

For practical designs, the minimization of the integral in eq. B19 can be simplified, with a minor impact on the coding efficiency, by first determining an optimal representative probability $p_{I_k}^*$ for the interval $I_k$ according to eq. B10 and then choosing the optimal code $C_k^*$ of the given set $S_c$ for the representative probability $p_{I_k}^*$ according to eq. B18.

Optimal interval borders $p_k$, with $k=1, \ldots, K-1$, given the set of codes $C_k$, with $k=0, \ldots, K-1$, can be derived by minimizing the expected overall rate $$R = R(\{p_k\}, \{C_k\}) = \sum_{k=0}^{k-1} \left( \int_{p_k}^{p_{K+1}} R(p, C_k) f(p) dp \right) \quad \text{(B20)}$$

Setting the first derivatives with respect to the interval borders equal to zero, $$\frac{\partial}{\partial p_k} R = 0,$$

for $k=1, \ldots, K-1$, yields $$p_k^* = p_k \text{ with } R(p_k, C_{k-1}) = R(p_k, C_k) \quad \text{(B21)}$$

Similarly as for eq. B13, it can be shown that $p_k^*$ is an optimal solution, but depending on the probability distribution $f(p)$ further optimal solutions might exist. Hence, an optimal interval border $p_k^*$ between two intervals $I_{k-1}$ and $I_k$ with given associated codes $C_{k-1}$ and $C_k$, respectively, is the intersection point of the functions $R(p, C_{k-1})$ and $R(p, C_k)$.

Consequently, the following interactive algorithm can be used for jointly deriving the probability interval partitioning and the associated codes given the number K of probability intervals, the set of possible codes $S_c$, and the probability distribution $f(p)$, with $p \in (0, 0.5]$.

Algorithm 2:
1) Derive initial probability interval boundaries $P_k$, with $k=0, \ldots, K$, using algorithm 1 specified in sec. 3
2) Derive representatives $PI_k$ for the probability intervals $I_k$, with $k=0, \ldots, K-1$, according to eq. B10
3) Derive codes $C_k \in S_c$ for the interval representatives $PI_k$, with $k=0, \ldots, K-1$, according to eq. B18
4) Update the interval borders $P_k$, with $k=1, \ldots, K-1$, according to eq. B21
5) Repeat the previous three steps until convergence The steps 2 and 3 in algorithm 2 could also be replaced by a direct derivation of the codes $C_k \in S_c$, with $k=0, \ldots, K-1$, based on the interval borders $P_k$, with $k=0, \ldots, K$, according to eq. B19. And, as mentioned in sec. 4.1, the minimization in step 3 can also proceed over a given set of binary trees $S_T$ where for each binary tree T only one V2V code $C_k$ obtained by the Huffman algorithm is considered.

As an example, we jointly derived the partitioning into K=12 probability intervals and corresponding V2V codes using algorithm 2. At this, the minimization in step 3 of the algorithm was replaced with an equivalent minimization over a given set of binary trees $S_T$ where the evaluated code C for each tree T was obtained by the Huffman algorithm. We considered trees T with a maximum number of $L_m=65$ leaf nodes and hence codes C with up to 65 table entries. All binary trees T with up to 16 leaf nodes have been evaluated in the minimization; for trees with more than 16 leaf nodes, we employed a suboptimal search given the best results for trees with a smaller number of leaf nodes.

Figure 17:
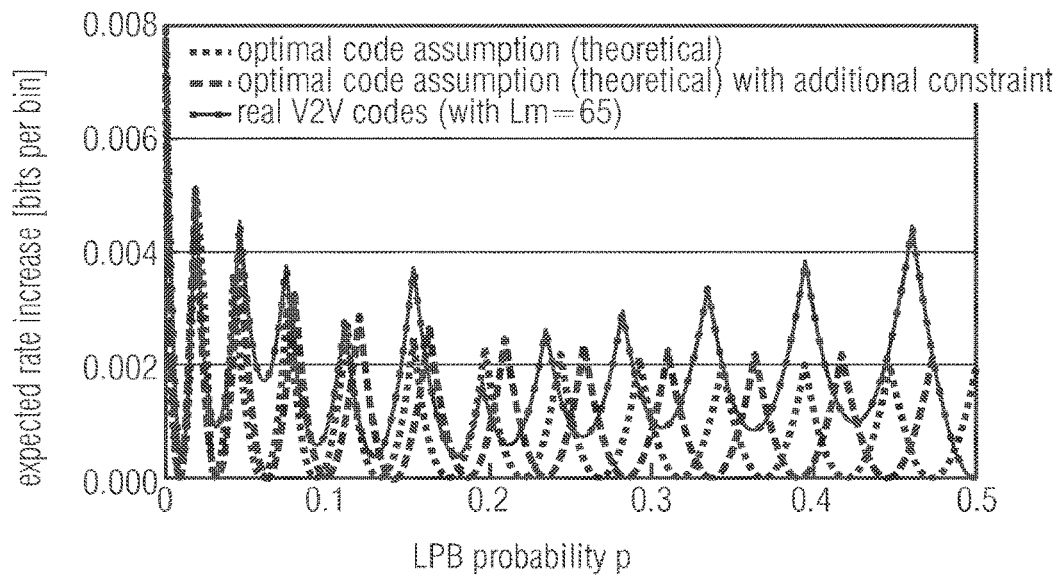
FIG. 17 shows a graph illustrating the rate increase for the theoretically optimal probability interval partitioning into K=12 intervals and a real design with V2V codes with a maximum number of $L_m$=65 table entries.

In FIG. 17 the expected rate increase relative to the entropy limit $\Delta R(p)=R(p)-H(p)$ for the code design example is plotted over the LPB probability p. As comparison, we also plotted the expected rate increase $\Delta R$ for the theoretically optimal probability interval discretization (as developed in sec. 3) and the theoretically optimal probability discretization with the additional constraint $PI_{k-1}=0.5$ inside the diagram. It can be seen that the joint probability interval discretization and V2V code design leads to a shifting of the interval borders (the interval borders $P_k$, with $k=1, \ldots, K-1$, are given by the local maxima of the $\Delta R(p)$ curves). The relative expected overall rate increase relative to the entropy limit for the design example with real V2V codes is $\bar{p}=0.24\%$, when assuming a uniform probability distribution $f(p)$. The corresponding relative rate increases for the theoretically optimal probability interval discretization and the theoretically optimal probability discretization with the additional constraint $PI_{k-1}=0.5$ are $\bar{p}=0.12\%$ and $\bar{p}=0.13\%$, respectively.

Codeword termination can be done as follows. When coding a finite sequence of symbols $\{s_0, \ldots, s_{N-1}\}$, each of the K binary encoders processes a finite sequence of coding bins $$b_k^c = \left\{ b_o^c, \ldots, b_{B}^c k - 1 \right\} k$$

=with $k=0, \ldots, K-1$. And it has been to be ensured that, for each of the K binary encoders, all coding bins of the sequence $$b_k^c = \left\{ b_o^c, \ldots, b_{B}^c k - 1 \right\} k$$

can be reconstructed given the codeword or sequence of codewords $$c_k\left(b_k^c\right).$$

When employing arithmetic coding, the arithmetic codeword for the sequence of coding bins has to be terminated in a way, that all coding bins can be decoded given the codeword. For the V2V codes described above, the bins at the end of the sequence $b_k^c$ not represent a vin sequence that is associated with a codeword. In such a case, any codeword that contains the remaining bin sequence as prefix can be written. The overhead can be minimized, if the corresponding codeword that has the minimum length (or one of these codewords) is chosen. At the decoder side, the additionally read bins at the end of the bin sequence, which can be identified given the bitstream syntax and binarization schemes, are discarded.

A simple code design example is presented below. For illustration purposes, we consider the simple example of a source {s} with three letters and fixed associated probabilities of $p_s(a_0)=0.7$, $p_s(a_1)=0.18$, and $p_s(a_2)=0.12$. The corresponding ternary choice tree can be converted into a full binary tree as shown in FIG. 18.

A binarization for the full binary tree in FIG. 18 is given in Tab. 5. The ternary symbol pmf $p_s$ is converted into two binary pmfs $p_{b_0}=(0.7, 0.3)$ and $p_{b_1}=(0.6, 0.4)$. For each symbol s in the bit stream, the bin $b_0$ is present. When $b_0$ is equal to 0, also $b_1$ is present. Note that the binarization given in Tab. 2 is identical to an optimal single-letter Huffman code for the source s.

TABLE 5

Binarization of a three letter source. The LPB probabilities $p_{LPB}$ are 0.3 for the first bin and 0.4 for the second bin

| Symbol $a_i$ | Probability $p(a_i)$ | Bin $b_0$ | Bin $b_1$ |
| --- | --- | --- | --- |
| $a_0$ | 0.7 | 1 | |
| $a_1$ | 0.18 | 0 | 1 |
| $a_2$ | 0.12 | 0 | 0 |
| LPB Prob. | $P_{LPB} = p(b_i = 0)$ | 0.3 | 0.4 |

The entropy for the source s is $$H(0.7, 0.18, 0.12) = \quad (B22)$$
$$H(0.7, 0.3) + 0.3H(0.6, 0.4) = 1.1726 \text{ bit/symbol}$$

The average code word length of the single-letter Huffman code is given as $$\bar{l}_{HC} = \sum_{i=0}^{M-1} p_i l_i^{HC} = 1.3 \text{ bit/symbol} \quad (B23)$$

corresponding to a redundancy of $p_{HC}=0.1274$ bit/symbol or 10.87% expected rate overhead. For the particular binarization example with fixed pmfs, the bins $b_0$ and $b_1$ already represent coding bins, since for both bins the LPB value $b'_{LPB}$ is equal to 0. The distribution f(s) of the LPB probabilities is discrete, with f(p)=0 except for p=0.3 and p=0.4. Consequently, the optimal probability discretization leads to K=2 intervals with the representatives $p_{I_0}=0.3$ and $p_{I_1}=0.4$. The interval border $p_1$ between these intervals can be arbitrarily chosen in [0.3,0.4).

For encoding the source, he sequence of source symbols is binarized into a sequence of bins. The bin $b_0$ is transmitted for every source symbol. The bin $b_1$ is only transmitted when $b_0=0$. The bins $b_0$ and $b_1$ are coded separately with constant LPB probabilities of $p_{I_0}=0.3$ and $p_{I_1}=0.4$, respectively.

An efficient coding of a binary alphabet with fixed probability can be achieved by a simple V2V mapping. Examples for V2V mappings with small coding tables for the LPB probabilities $p_{LPB}=0.3$ and $p_{LPB}=0.4$ are given in Tab. 6 and Tab. 7, respectively. The V2V mapping for $p_{LPB}=0.3$ yields a redundancy of 0.0069 bit/bin or 0.788%. For the LPB probability of $p_{LPB}=0.4$, the redundancy is 0.0053 bit/bin or 0.548%.

TABLE 6

Bin tree and codes for an LPB probability of
$p_{LPB}$ = 0.3. The redundancy of this code is 0.788%

| Bin Tree | Probability | Codes |
| --- | --- | --- |
| '11' | $0.7^2 = 0.49$ | '1' |
| '01' | $0.7 \cdot 0.3 = 0.21$ | '01' |
| '0' | 0.3 | '00' |

TABLE 7

Bin tree and codes for an LPB probability of
$p_{LPB}$ = 0.4. The redundancy of this code is 0.548%

| Bin Tree | Probability | Code Tree |
| --- | --- | --- |
| '111' | $0.6^3 = 0.216$ | '11' |
| '110' | $0.6^2 \cdot 0.4 = 0.144$ | '001' |
| '10' | $0.6 \cdot 0.4 = 0.24$ | '11' |
| '01' | $0.4 \cdot 0.6 = 0.24$ | '01' |
| '00' | $0.4^2 = 0.16$ | '000' |

The overall expected rate incurred by the new coding method is $$\bar{\vartheta}_{NC}=\bar{\vartheta}_{b_0}+0.3\cdot\bar{\vartheta}_{b_1} \quad (B24)$$

The overall redundancy is 0.73% relative to the entropy limit, which represents a significant improvement in comparison to the single-letter Huffman code.

It could be argued that a similar coding efficiency improvement could be obtained by creating a run-length code. For the above example, we could construct a run-length code for the most probable symbol by considering runs of up to two symbols. Each of the events {$a_0a_0, a_0a_1, a_0a_2, a_1, a_2$} would be associated with a separate codeword. Such a code yields a redundancy of 1.34% relative to the entropy limit. Actually, the V2V codes can be considered as a generalization of run-length codes for binary symbols (the V2V code in Tab. 3 does effectively represent a run-length code). For a single symbol alphabet with fixed probabilities, a similar coding efficiency as for the presented approach can also be achieved by creating a code that maps a variable number of source symbols to variable length codewords. The main advantage of the presented approach is its flexibility in mapping arbitrary source symbol sequences with fixed or adaptive probability estimates to a small number of simple binary coders that are operated with fixed LPB probabilities.

How to achieve an unique decodability is considered next. With the presented entropy coding scheme, the coding of a sequence of source symbols $s=\{s_0, \ldots, s_{N-1}\}$ consists of the following three basic steps:
- symbol binarization $b=\{b_0, \ldots b_{B-1}\}=\gamma_b(s)$ yielding a sequence of bins $b=\{b_0, \ldots, b_{B-1}\}$
- conversion of the sequence of bins into a sequence of coding bins $$b^c = \left\{b_o^c, \ldots, b_{B-1}^c\right\} = \gamma_c(b)$$

binary entropy coding of the sequence of coding bins $$b^c = \left\{b_o^c, \ldots, b_{B-1}^c\right\}$$

using
probability interval discretization and K fixed binary coders
The symbol sequence $s=\{s_0, \ldots, s_{N-1}\}$ is uniquely decodable, if the sequence of coding bins $$b^c = \left\{b_o^c, \ldots, b_{B-1}^c\right\}$$

is uniquely decodable and the mappings $\gamma_b$ and $\gamma_c$ are invertible.
Let $\gamma_e$ notify the encoder mapping of a sequence of one or more coding bins $b^c=\{b_0^c, \ldots\}$ onto a sequence of one or more codewords $c(b^c)=\{c_0, \ldots\}$ $$c(b^c)=\gamma_e(b^c) \tag{B25}$$

For unique decodability of a sequence of coding bins $b^c$ given the sequence of codewords $c(b^c)$, the encoder mapping $\gamma_e$ has to have the property that a unique codeword $c(b^c)$ is assigned to each possible sequence of coding bins $b^c$:

$$\forall b_i^c, b_j^c \, b_i^c \neq b_j^c \rightarrow c(b_i^c) \neq c(b_j^c) \tag{B26}$$

This property is fulfilled when arithmetic codes or prefix codes are used. It is particularly fulfilled for the V2V codes described in sec. 4.1 (including the codeword termination described in sec. 4.3), since the V2V codes represent prefix codes for variable numbers of bins.

However, in the presented entropy coding approach, the sequence of coding bins $b^c$ is partitioned into K sub-sequences $$b_k^c,$$

with $k=0, \ldots, K-1,$ $$\{b_0^c, \ldots, b_{k-1}^c\} \Gamma_p(b^c) \tag{B27}$$

and to each of the sub-sequences $b_k^c$, a sequence of codewords $c_k(b_k^c)$ is assigned using a particular encoder mapping $\gamma_e^k$. Consequently, the condition on unique decodability has to be extended. A sequence of coding bins $b^c$ is uniquely decodable given K sequences of codewords $c_k(b_k^c)$, with $k=0, \ldots, K-1$, if each sub-sequence of coding bins $b_k^c$ is uniquely decodable given the corresponding codeword Ck(bkc) and the partitioning rule $\gamma_p$ is known to the decoder. The partitioning rule $\gamma_p$ is given by the LPB probability interval discretization $\{I_k\}$ and the LPB probabilities $p^i_{LPB}$ that are associated with the coding bins $b_j^c$ with $j=0, \ldots, B-1$. Hence, the LPB probability interval discretization $\{I_k\}$ has to be known at the decoder side and the LPB probability $p^i_{LPB}$ for each coding bin $b_j^c$, with $j=0, \ldots, B-1$, has to derived in the same way at encoder and decoder side.

For the mapping $\gamma_c$ of a sequence of bins onto a sequence of coding bins $^c$, each single $b_j$, with $j=0, \ldots, B-1$, is converted by the binary mapping by $b_j^c = \gamma_c^j(b_j) = b_j \oplus b^j_{LPB}$. At the decoder side, the bin sequence can be derived by the binary mappings $$b_j = (\gamma_c^j)^{-1}(b_j^c) = b_j^c \oplus b^j_{LPB} \tag{B28}$$

with $j=0, \ldots, B-1$. If the LPB value $b^j_{LPB}$ for each bin $b_j$ is derived in the same way at encoder and decoder side, these mappings $(\gamma_c^j)^{-1}$ represent the inverses of the corresponding encoder mappings $\gamma_c^j$, since $$b_j^c \oplus b_{LPB}^j = b_j \oplus b_{LPB}^j \oplus b_{LPB}^j = b_j \oplus 0 = b_j \tag{B29}$$

and hence, the conversion $\gamma_b$ of a sequence of bins b into a sequence of coding bins $b^c$ is invertible.

Finally, we investigate the invertibility of the binarization $b=\gamma_b(s)$ by which each symbol $s_i$, with $i=0, \ldots, N-1$, is mapped onto a bin sequence $b^i = \gamma_c^j(s_i)$. A symbol $s_i$ can be uniquely decoded given the corresponding bin sequence $b^i$ if the binarization mapping $\gamma_b^i$ assigns a different bin sequence $b_m^j$ to each letter $a_m^i$ the alphabet $A_i$; for the symbol $s_i$. However, this condition is not sufficient, since the partitioning of the bin sequence $b=\{b_0, \ldots, b_{B-1}\}$ into bin sequences $b^i$ that correspond to the symbols $s_i$, with $i=0, \ldots, N-1$, is not known to the decoder. A sufficient condition is given, when for each symbol $s_i$, the bin sequences $b_m^j$ that are associated with the letters $a_m^i$ the corresponding alphabet $A_i$ form a prefix code and the binarization mappings $\gamma_b^i$ for each symbol $s_i$, with $i=0, \ldots, N-1$, are known at the decoder side.

The conditions of unique decodability for the presented entropy coding approach can be summarized as follows:
the binarization mappings $\gamma_b^i$ represent prefix codes and are known to the decoder (in symbol coding order)
the probability models $(b^j_{LPB}, p^j_{LPB})$ for all bins $b_j$ are derived in the same way at encoder and decoder side
the partitioning of the LPB probability interval $(0,0.5]$ into K intervals $I_k$, with $k=0, \ldots, K-1$, is known to the decoder
the mapping $\gamma_e^k$ for each probability interval $I_k$, with $k=0, \ldots, K-1$, represents a uniquely decodable code In the following, we describe examples for the overall encoder and decoder design in more detail. We concentrate on coding schemes, in which the probability models $\{b_{LPB}, p_{LPB}\}$ for the bins are directly estimated at encoder and decoder side and the K binary coders use V2V mappings described above. Each source symbol s shall be associated with a symbol category $c_s$ which determines the type of the symbol including its range of values. The order of symbols and associated symbol categories shall be given by the syntax, which is presumed to be known at encoder and decoder side.

Figure 19:
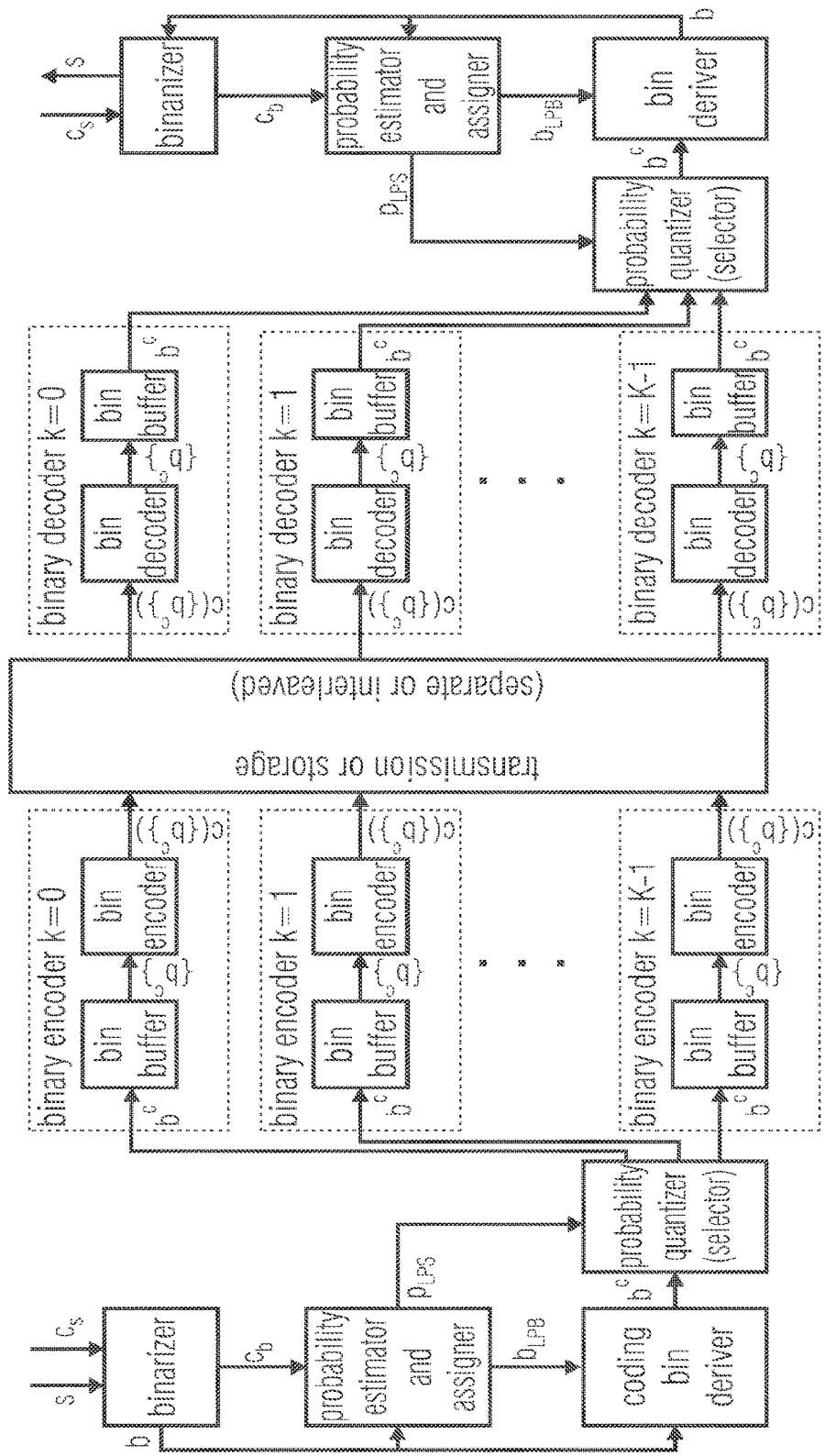
FIG. 19 shows a block diagram of a system comprising an encoder (left part) and decoder (right part) according to an embodiment.

The block diagram for an example PIPE encoder and PIPE decoder design is illustrated in FIG. 19. At the encoder side, the symbols s with associated symbol categories $c_s$ are fed into the binarizer, which converts each symbol s into a sequence of bins $b_s = \gamma_b^{c_s}(s)$.

The used binarization scheme $\gamma_b^{c_s}$ is determined based on the symbol category $c_s$. In addition, the binarizer associates each bin b of a bin sequence $_s$ with a probability model indication $c_b$, which specifies the probability model that is used for coding the bin b. The probability model indication $c_b$ can be derived based on the symbol category $c_s$, the bin number of the current bin inside the bin sequence $_s$, and/or the values of already coded bins and symbols.

The probability estimator and assigner maintains multiple probability models, which are characterized by pairs of values $\{b_{LPB}, p_{LPB}\}$. It received bins b and associated probability model indications $c_b$ from the binarizer, and forwards the LPB value $b_{LPB}$ and the LPB probability $p_{LPB}$ of the indicated probability model to the coding bin deriver and the probability quantizer, respectively. Thereafter, the corresponding probability model $\{b_{LPB}, p_{LPB}\}$ is updated using the value of the received bin b.

The coding bin deriver receives bins b and associated LPB values $b_{LPB}$ from the binarizer and the probability estimator and assigner, respectively, and sends coding bins $b^c$, which are derived by $b^c = b \oplus D\, b_{LPB}$, to the probability quantizer. The probability quantizer forwards each coding bin $b^c$ to one of the K binary encoders. It contains information about the LPB probability interval quantization $\{I_k\}$. The LPB probability $p_{LPB}$, which is associated with a coding bin $b_c$ and received from the probability estimator and assigner, is compared to the interval borders $\{p_k\}$ and probability interval index k, for which $p_{LPB} \in I_k$, is derived. Then, the coding bin $b^c$ is forwarded to the associated binary encoder.

Each of the K binary encoders consists of a bin buffer and a bin encoder. The bin buffer receives coding bins $b^c$ from the probability quantizer and stores them in coding order. The bin encoder implements a particular V2V mapping and compares the bin sequence in the bin buffer with the bin sequences that are associated with codewords. If the bin sequence in the bin buffer is equal to one of those bin sequences, the bin encoder removes the bin sequence $\{b^c\}$ from the bin buffer and writes the associated codeword ($\{b^c\}$) to the corresponding codeword stream. At the end of the encoding process for a symbol sequence, for all binary encoders for which the bin buffers are not empty, a terminating codeword is written as described in sec. 4.3.

The K resulting codeword streams can be separately transmitted, packetized, or stored, or they can be interleaved (cp. sec. 6.2) for the purpose of transmission or storage.

At the decoder side, each of the K binary decoders consisting of a bin decoder and a bin buffer receives one codeword stream. The bin decoder reads codewords ($\{b^c\}$) from the codeword stream and inserts the associated bin sequence $\{b^c\}$, in coding order, into the bin buffer.

The decoding of the symbol sequence is driven by the underlying syntax. Requests for a symbol s are sent together with the symbol category $c_s$ to the binarizer. The binarizer converts these symbol requests into request for bins. A request for a bin is associated with a probability model indication $c_b$, which is derived in the same way as in the encoder, and sent to the probability estimator and assigner. The probability estimator and assigner is operated similar to its counterpart at the encoder side. Based on the probability model indication $c_b$, it identifies a probability model and forwards its LPB value $b_{LPB}$ and LPB probability $p_{LPB}$ to the bin deriver and the probability quantizer, respectively.

The probability quantizer determines one of the K binary decoders based on the LPB probability $p_{LPB}$, in the same way as the binary encoder is determined at the encoder side, removes the first coding bin $b^c$, in coding order, from the corresponding bin buffer, and forwards it to the bin deriver. The bin deriver receives coding bins $b_c$ and associated LPB values $b_{LPB}$ from the probability quantizer and probability estimator and assigner, respectively, and determines the bin values $b = b^c \oplus b_{LPB}$. As final response to a bin request sent by the binarizer, the bin deriver send the decoded bin value b to the binarizer and the probability estimator and assigner.

In the probability estimator and assigner, the value of the decoded bin b is used to update the probability model $\{b_{LPB}, p_{LPB}\}$, which was chosen by the associated value $c_b$, in the same way as at the encoder side. Finally, the binarizer adds the received bin b to the bin sequence $_s$ which has been already received for a symbol request and compares this bin sequence $_s$ with the bin sequences that are associated with symbol values by the binarization scheme $\gamma_b^{c_s}$. If the bin sequence $_s$ matches one of those bin sequences, the corresponding decoded symbol s is output as final response to the symbol request. Otherwise, the binarizer sends further bin requests until the symbol s is decoded.

The decoding of a symbol sequence is terminated if no further symbol requests, which are driven by the syntax, are received. The coding bins $b^c$ that may be contained in the bin buffers at the end of the entropy decoding process (as a result of termination codewords) are discarded.

After having described certain embodiments for the PIPE encoder and the PIPE decoder in FIGS. 1 and 2 with respect to FIGS. 3 to 13 and having provided mathematical background regarding PIPE coding in general with respect to FIGS. 14 to 19, with respect to FIGS. 20 to 24, more detailed embodiments for entropy encoding and decoding apparatuses are described. The following embodiments of FIGS. 22 to 24 interleave not only the PIPE encoded bitstreams among each other, but interleave the VLC bitstream and the PIPE encoded bitstreams altogether. In comparison thereto, the embodiments for PIPE encoders and PIPE decoders with interleaving for the PIPE encoded bitstreams, namely the embodiments of FIGS. 7 to 13, merely provided for a separate interleaving of the PIPE encoded bitstreams. As already mentioned above, even these embodiments may serve as a basis for achieving a completely interleaved bitstream by use of another interleaver/deinterleaver pair 134 and 228, respectively (see FIGS. 1 and 2), such as, for example, by using bitstream interleaving as shown in FIGS. 5 and 6. However, the embodiments described next perform the interleaving at once on both the VLC bitstream as well as the PIPE encoded bitstreams with using, in other words, the one-stage interleaver/deinterleaver 128 and 230, respectively.

Figure 20:
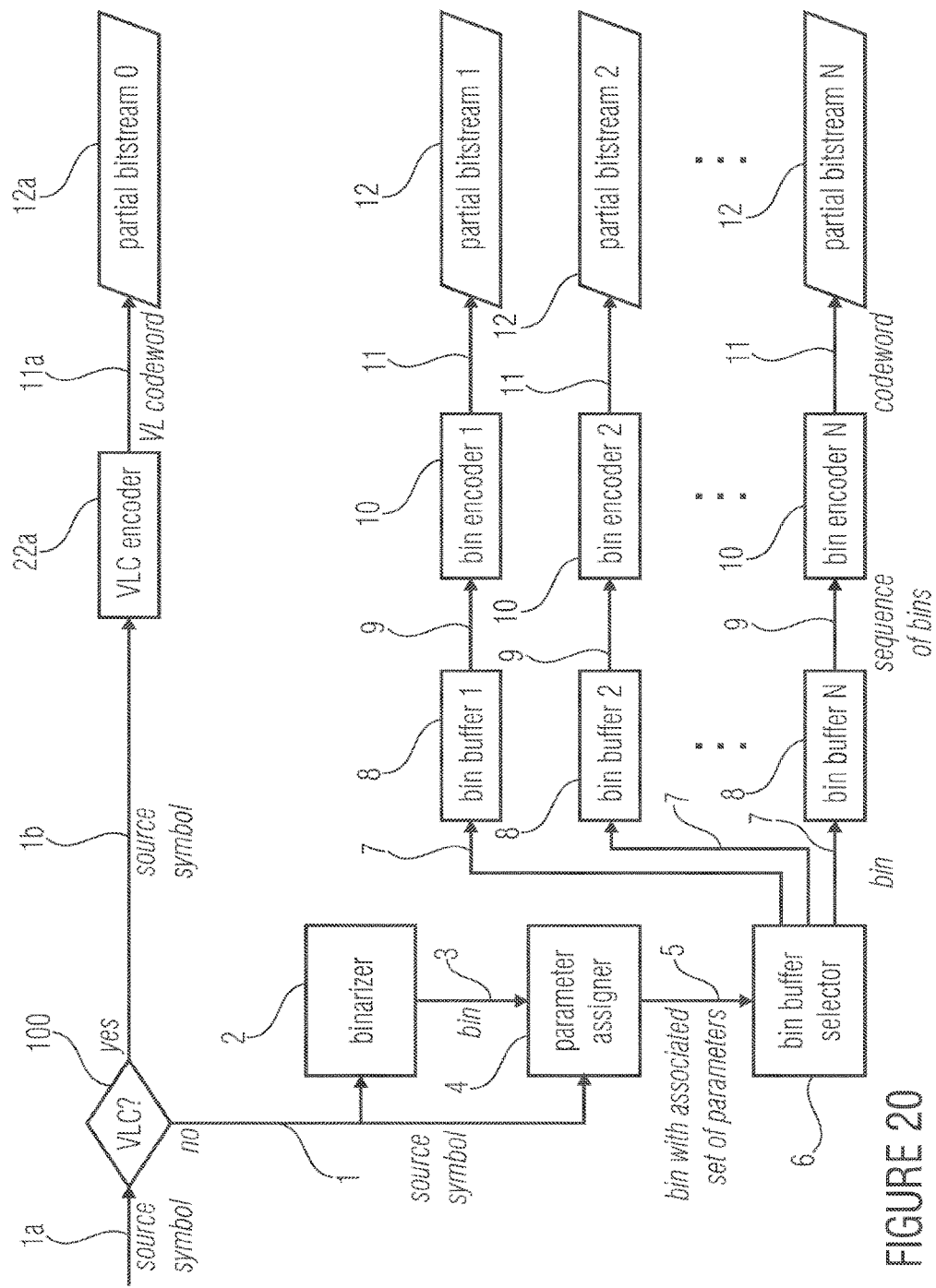
FIG. 20 shows a block diagram of an entropy encoding apparatus according to an embodiment.
Figure 21:
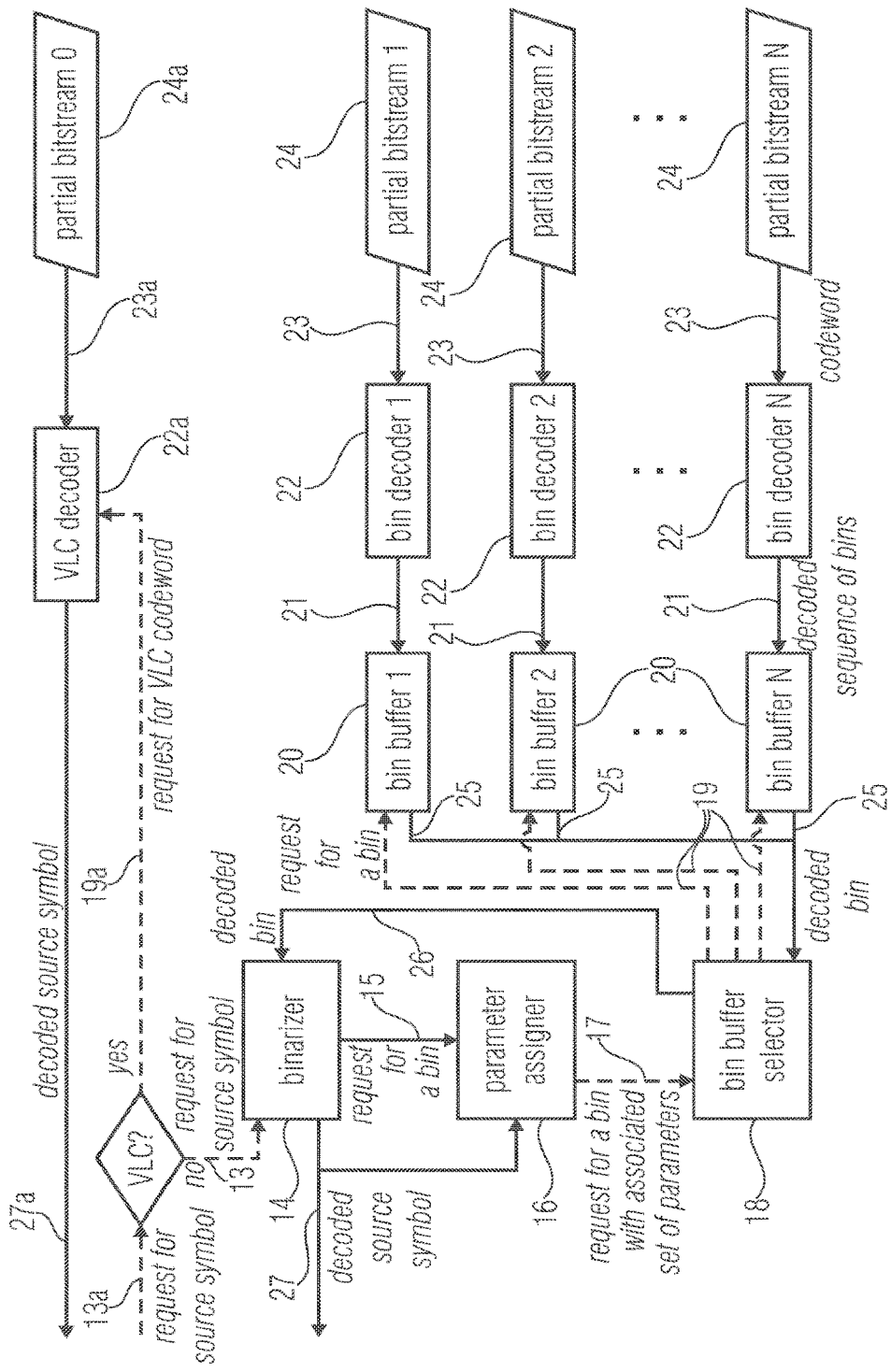
FIG. 21 shows a block diagram of an entropy decoding apparatus according to an embodiment.

Before describing in detail the embodiments where VLC and PIPE coded symbols are interleaved inside a bitstream, in order to achieve a more suitable tradeoff between complexity and coding efficiency, a basic structure thereof without interleaving is described with respect to FIGS. 20 and 21.

The structure of the entropy encoding apparatus of FIG. 1a is shown in FIG. 20. The entropy encoding apparatus converts a stream of source symbols 1a, corresponding to the combination of VLC encoded and PIPE encoded source symbols of FIGS. 1 and 2, namely 106 and 218, respectively, into a set of two or more partial bitstreams 12, 12a, with bitstream 12a corresponding to bitstreams 112 and 206 of FIGS. 1 and 2.

As already noted above, each source symbol 1a may have associated therewith an indication that specifies whether the source symbol is coded using standard VLC codes within VLC encoder 22a, which corresponds to VLC encoder 102 in FIG. 1, or as to whether the source symbol is to be coded with a PIPE coding concept. As already described above with respect to FIGS. 1 and 2, this indication may not be transmitted explicitly to the decoding side. Rather, the associated indication may stem from the type or category of the source symbol itself.

The VLC coded symbols 1b are coded with standard VLC codes, which in turn, may depend on the just-mentioned symbol category or symbol type using a VLC encoder 22a. The corresponding codewords 11a are written to a distinct partial bitstream 12a. The non-VLC code symbols 1 are coded using PIPE coding as described above with respect to FIGS. 1 and 3, for example, whereupon multiple partial bitstreams 12 are obtained. Some of the source symbols 1a may have already been binarized in a way that the binarization consists of two parts as already mentioned above with respect to FIG. 1a. One of these parts may be coded with the PIPE approach and written to the corresponding partial bitstreams 12. The other part of the bin sequence may be coded with the standard VLC codes and written to the corresponding partial bitstream 12a.

The basic entropy decoding apparatus fitting to the embodiment of FIG. 20 is shown in FIG. 21.

The decoder performs basically the inverse operations of the encoder of FIG. 20, so that the previously encoded sequence of source symbols 27, 27a is decoded from a set of two or more partial bitstreams (24,24a). The decoder includes two different process flows: A flow for data requests, which replicates the data flow of the encoder, and a data flow, which represents the inverse of the encoder data flow. In the illustration in FIG. 21 the dashed arrows represent the data request flow, while the solid arrows represent the data flow. The building blocks of the decoder basically replicate the building blocks of the encoder, but implement the inverse operations.

In an embodiment of the invention, each symbol request 13a is associated with an indication that specifies whether the source symbol is coded using standard VLC codes or with the PIPE coding concept. As already mentioned above with respect to FIG. 20, this indication may stem from the parsing rules or the syntax of the syntax elements represented by the source symbol itself. For example, with respect to FIGS. 1 and 2, it has been described that different syntax element types may be associated with the differing coding schemes, namely VLC coding or PIPE coding. The same may apply for different portions of binarizations, or more generally, other symbolizations of the syntax elements. If a symbol is VLC coded, the request is passed to the VLC decoder 22a and a VLC codeword 23a is read from a distinct partial bitstream 24a. The corresponding decoding symbol 27a is output. If a symbol is coded with PIPE, the symbol 27 is decoded from a set of partial bitstreams 24 as described above with respect to FIG. 4, for example.

In another embodiment of the invention, some of the source symbols are binarized in a way that the binarization consists of two parts. One of these parts is coded with the PIPE approach is correspondingly decoded from the associated partial bitstreams 24. And the other part of the bin sequence is coded with standard VLC codes and is decoded with a VLC decoder 22a that reads the corresponding codewords 23a from a distinct partial bitstream 24a.

Transmission and Multiplexing of the Partial Bitstreams (VLC Coded and PIPE Coded)

The partial bitstreams 12, 12a that are created by the encoder can be transmitted separately, or they can be multiplexed into a single bitstream, or the codewords of the partial bitstreams can be interleaved in a single bitstream.

In an embodiment of the invention, each partial bitstream for a quantity of data is written to one data packet. The quantity of data can be an arbitrary set of source symbols such as a still picture, a field or frame of a video sequence, a slice of a still picture, a slice of a field or frame of a video sequence, or a frame of audio samples, etc.

In another embodiment of the invention, two or more of the partial bitstreams 12, 12a for a quantity of data or all partial bitstreams for a quantity of data are multiplexed into one data packet. The structure of a data packet that contains multiplexed partial bitstreams may be as illustrated in FIG. 5.

The data packet 300 consists of a header and one partition for the data of each partial bitstream (for the considered quantity of data). The header 301 of the data packet contains indications for the partitioning of the (remainder of the) data packet into segments of bitstream data 302. Beside the indications for the partitioning, the header may contain additional information. In an embodiment of the invention, the indications for the partitioning of the data packet are the locations of the beginning of the data segments in units of bits or bytes or multiples of bits or multiples of bytes. In an embodiment of the invention, the locations of the beginning of the data segments are coded as absolute values in the header of the data packet, either relative to the beginning of the data packet or relative to the end of the header or relative to the beginning of the previous data packet. In a further embodiment of the invention, the locations of the beginning of the data segments are differentially coded, i.e., only the difference between the actual beginning of a data segment and a prediction for the beginning of the data segment is coded. The prediction can be derived based on already known or transmitted information such as the overall size of the data packet, the size of the header, the number of data segments in the data packet, the location of the beginning of preceding data segments. In an embodiment of the invention, the location of the beginning of the first data packet is not coded, but inferred based on the size of the data packet header. At the decoder side, the transmitted partition indications are used for deriving the beginning of the data segments. The data segments are then used as partial bitstreams 12, 12a and the data contained in the data segments are fed into the corresponding bin decoders and VLC decoders in sequential order.

Interleaving of Codewords (VLC and PIPE Codewords)

For some applications, the above described multiplexing of the partial bitstreams (for a quantity of source symbols) in one data packet can have the following disadvantages: On the one hand side, for small data packets, the number of bits for the side information that is necessitated for signaling the partitioning can become significant relative to the actual data in the partial bitstreams, which finally reduces the coding efficiency. On the other hand, the multiplexing may not suitable for applications that necessitate a low delay (e.g. for video conferencing applications). With the described multiplexing, the encoder cannot start the transmission of a data packet before the partial bitstreams have been completely created, since the locations of the beginning of the partitions are not known before. Furthermore, in general, the decoder has to wait until it receives the beginning of the last data segment before it can start the decoding of a data packet. For applications as video conferencing systems, these delays can add-up to an additional overall delay of the system of several video pictures (in particular for bit rates that are close to the transmission bit rate and for encoders/decoders that necessitate nearly the time interval between two pictures for encoding/decoding a picture), which is critical for such applications. In order to overcome the disadvantages for certain applications, the encoder of an embodiment of the invention can be configured in a way that the codewords that are generated by the two or more bin encoders and the VLC encoder are interleaved into a single bitstream. The bitstream with the interleaved codewords can be directly send to the decoder (when neglecting a small buffer delay, see below). At the decoder side, the two or more bin decoders and the VLC decoder read the codewords directly from the bitstream in decoding order; the decoding can be started with the first received bit. In addition, no side information is necessitated for signaling the multiplexing (or interleaving) of the partial bitstreams.

The basic structure of an encoder with codeword interleaving is shown in FIG. 22. The bin encoders 10 and the VLC encoder 10a don't write the codewords directly to the partial bitstreams, but are connected with a single codeword buffer 29, from which codewords are written to the bitstream 34 in coding order. The bin encoders 10 send requests for one or more new codeword buffer entries 28 to the codeword buffer 29 and later send the codewords 30 to the codeword buffer 29, which are stored in the reserved buffer entries. The VLC encoder 10a directly writes the VLC codewords 30a to the codeword buffer 29. The (in general variable-length) codewords 31 of the codeword buffer 29 are accessed by a codeword writer 32, which writes the corresponding bits 33 to the produced bitstream 34. The codeword buffer 29 operates as a first-in-first-out buffer; codeword entries that are reserved earlier are earlier written to the bitstream.

In an embodiment of the invention, the codeword buffer is operated as follows. If a new bin 7 is sent to a particular bin buffer 8 and the number of already stored bins in the bin buffer is zero and there is currently no codeword reserved in the codeword buffer for the bin encoder that is connected with the particular bin buffer, the connected bin encoder 10 sends a request to the codeword buffer, by which one or more codeword entries are reserved in the codeword buffer 29 for the particular bin encoder 10. The codeword entries can have a variable number of bits; an upper threshold for the number of bits in a buffer entry is usually given by the maximum codeword size for the corresponding bin encoder. The next codeword or the next codewords that are produced by the bin encoder (for which the codeword entry or codeword entries have been reserved) are stored in the reserved entry or entries of the codeword buffer. If all reserved buffer entries in the codeword buffer for a particular bin encoder are filled with codewords and the next bin is sent to the bin buffer that is connected with the particular bin encoder, one or more new codewords are reserved in the codeword buffer for the particular bin encoder, etc. The VLC encoder 10a directly writes the VLC codewords 30a to the next free entry of the codeword buffer 29, i.e. for the VLC encoder the codeword reservation and the writing of the codeword is done at once. The codeword buffer 29 represents a first-in-first-out buffer in a certain way. Buffer entries are reserved in sequential order. Codewords for which the corresponding buffer entries have been reserved earlier are earlier written to the bitstream. The codeword writer 32 checks the status of the codeword buffer 29, either continuously or after a codeword 30 is written to the codeword buffer 29. If the first buffer entry contains a complete codeword (i.e., the buffer entry is not reserved, but includes a codeword), the corresponding codeword 31 and the corresponding buffer entry are removed from the codeword buffer 20 and the bits of the codeword 33 are written to the bitstream. This process is repeated until the first buffer entry does not contain a codeword (i.e., it is reserved or free). At the end of the decoding process, i.e., if all source symbols of the considered quantity of data have been processed, the codeword buffer has to be flushed. For that flushing process, the following is applied for each bin buffer/bin encoder as first step: If the bin buffer does contain bins, a bin with a particular or an arbitrary value is added until the resulting bin sequence represents a bin sequence that is associated with a codeword (as noted above, one way of adding bins is to add such bin values that produce the shortest possible codeword—or one of those—that is associated with a bin sequence that contains the for the original content of the bin buffer as prefix), then the codeword is written to the next reserved buffer entry for the corresponding bin encoder (and the corresponding) bin buffer is emptied. If more than one buffer entry has been reserved for one or more bin encoders, the codeword buffer may still contain reserved codeword entries. In that case, these codeword entries are filled with arbitrary, but valid codewords for the corresponding bin encoders. In an embodiment of the invention, the shortest valid codeword or one of the shortest valid codewords (if there are multiple) is inserted. The VLC encoder does not necessitate any termination Finally, all remaining codewords in the codeword buffer are written to the bitstream.

Two examples for the status of the codeword buffer are illustrated in FIG. 23. In example (a), the codeword buffer contains 4 entries that are filled with a codeword (two of them are VLC entries) and 3 reserved entries. In addition, the next free buffer entry is marked. The first entry is filled with a codeword (i.e., the bin encoder 2 just wrote a codeword to a previously reserved entry). In the next step, this codeword will be removed from the codeword buffer and written to the bitstream. Then, the first reserved codeword for bin encoder 3 is the first buffer entry, but this entry cannot be removed from the codeword buffer, since it is only reserved, but no codeword has been written to this entry. In the example (b), the codeword buffer contains 4 entries that are filled with a codeword (one of them is a VLC buffer entry) and 4 reserved entries. The first entry is marked as reserved and hence the codeword writer cannot write a codeword to the bitstream. Although 4 codewords are contained in the codeword buffer, the codeword writer has to wait until a codeword is written to the first reserved buffer entry for bin encoder 3. Note that the codewords have to be written in the order in which they were reserved, in order to be able to invert the process at the decoder side (see below). And further note that a VLC buffer entry is completed, since the reserving and writing of the codeword is done at once.

The basic structure of a decoder with codeword interleaving is shown in FIG. 24. The bin decoders 22 and the VLC decoder 2a don't read the codewords directly from separate partial bitstreams, but are connected to a bit buffer 38, from which the codewords 37, 37a are read in coding order. It should be noted that the bit buffer 38 is not absolutely necessitated, since the codewords could also be directly read from the bitstream. The bit buffer 38 is mainly included in the illustration for clearly separate different aspects of the processing chain. The bits 39 of the bitstream 40 with interleaved codewords are sequentially inserted into the bit buffer 38, which represents a first-in-first-out buffer. If a particular bin decoder 22 receives a request for one or more bin sequences 35, the bin decoder 22 reads one or more codewords 37 from the bit buffer 38 via requests for bits 36. The decoder can instantaneously decode the source symbols. Similarly, if the VLC decoder 22a receives a request for a new symbol 19a it reads the corresponding VLC codeword 37a from the bit buffer 38 and returns the decoded symbol 27a. Note that the encoder (as described above) has to ensure by suitably operating the codeword buffer that the codewords are written in the same order to the bitstream in which they are requested by the bin decoders. At the decoder, the entire decoding process is triggered by requests for source symbols. Parameters as the number of codewords that are reserved at the encoder side by a particular bin encoder and the number of codewords that are read by the corresponding bin decoder have to be the same.

Interleaving of Variable-Length Codewords with a Low-Delay Constraint

The described codeword interleaving does not necessitate that any partitioning information is sent as side information. And since the codewords are interleaved in the bitstream, the delay is in general small. However, it is not guaranteed that a particular delay constraint (e.g. specified by a maximum number of bits that are stored in the codeword buffer) is obeyed. Furthermore, the necessitated buffer size for the codeword buffer can theoretically become very large. When considering the example in FIG. 23(b), it might be possible that no further bins are send to bin buffer 3 and hence the bin encoder 3 will not send any new codeword to the codeword buffer until the flushing process at the end of the data packet is applied. Then all codewords for bin encoders 1 and 2 would have to wait until the end of the data packet, before they can be written to the bitstream. This drawback can be circumvented by adding a further mechanism to the encoding process (and also to the decoding process as described later). The basic concept of that additional mechanism is that if a measure related to the delay or an upper bound of the delay (see below) exceeds a specified threshold, the first reserved buffer entry is filled by flushing the corresponding bin buffer (using a similar mechanism as at the end of a data packet). By such a mechanism, the number of waiting buffer entries is reduced until the associated delay measure is less than the specified threshold. At the decoder side, the bins that have been inserted at the encoder side in order to obey the delay constraint have to be discarded. For this discarding of bins basically the same mechanism as at the encoder side can be used.

After having described in detail possibilities for interleaving the bitstreams of VLC and PIPE coding, in the following, the description again focuses on the already above mentioned syntax elements decomposed into source symbols as mentioned with respect to FIGS. 1b, 1c and 2b. For illustration purposes, the following description assumes that the thus decomposed syntax elements are absolute transform coefficient level. However, this is just an example, and other types of syntax elements may handled likewise. In particular, in the following the coding of absolute levels by partitioning and using different entropy codes in block-based image and video coders is described.

For example, the pictures of a video sequence are usually decomposed into blocks. The blocks or the colour components of the blocks are predicted by either motion compensated prediction or intra prediction. The blocks can have different sizes and can be either quadratic or rectangular. All samples of a block or a colour component of a block are predicted using the same set of prediction parameters, such as reference indices (identifying a reference picture in the already coded set of pictures), motion parameters (specifying a measure for the movement of a blocks between a reference picture and the current picture), parameters for specifying the interpolation filter, intra prediction modes, etc. The motion parameters can be represented by displacement vectors with a horizontal and vertical component or by higher order motion parameters such as affine motion parameters consisting of 6 components. It is also possible that more than one set of prediction parameters (such as reference indices and motion parameters) are associated with a single block. In that case, for each set of prediction parameters, a single intermediate prediction signal for the block or the colour component of a block is generated, and the final prediction signal is built by a weighted sum of the intermediate prediction signals. The weighting parameters and potentially also a constant offset (which is added to the weighted sum) can either be fixed for a picture, or a reference picture, or a set of reference pictures, or they can be included in the set of prediction parameters for the corresponding block. Similarly, still images are also often decomposed into blocks, and the blocks are predicted by an intra-prediction method (which can be a spatial intra prediction method or a simple intra prediction method that predicts the DC component of the block). In a corner case, the prediction signal can also be zero.

The difference between the original blocks or the colour components of the original blocks and the corresponding prediction signals, also referred to as the residual signal, is usually transformed and quantized. A two-dimensional transform is applied to the residual signal and the resulting transform coefficients are quantized. For this transform coding, the blocks or the colour components of the blocks, for which a particular set of prediction parameters has been used, can be further split before applying the transform. The transform blocks can be equal to or smaller than the blocks that are used for prediction. It is also possible that a transform block includes more than one of the blocks that are used for prediction. Different transform blocks in a still image or a picture of a video sequence can have different sizes and the transform blocks can represent quadratic or rectangular blocks.

All these prediction and residual parameters may form the stream of syntax elements 138 and 226, respectively.

The resulting quantized transform coefficients, also referred to as transform coefficient levels, may then transmitted using entropy coding by any of the above coding schemes. To this end, a block of transform coefficients levels may be mapped onto a vector (i.e., an ordered set) of transform coefficient values using a scan, where different scans can be used for different blocks. Often a zig-zag scan is used. For blocks that contain only samples of one field of an interlaced frame (these blocks can be blocks in coded fields or field blocks in coded frames), it is also common to use a different scan specifically designed for field blocks. A possible coding scheme for encoding the resulting ordered sequence of transform coefficients is run-level coding. Usually, a large number of the transform coefficient levels are zero, and a set of successive transform coefficient levels that are equal to zero can be efficiently represented by coding the number of successive transform coefficient levels that are equal to zero (the run) by a respective syntax element. For the remaining (non-zero) transform coefficients, the actual level is coded in form of respective syntax elements. There are various alternatives of run-level codes. The run before a non-zero coefficient and the level of the non-zero transform coefficient can be coded together using a single syntax element. Often, special syntax elements for the end-of-block, which is sent after the last non-zero transform coefficient, are included. Or it is possible to first encode the number of non-zero transform coefficient levels, and depending on this number, the levels and runs are coded.

A somewhat different approach is used in the highly efficient CABAC entropy coding in H.264/AVC. Here, the coding of transform coefficient levels is split into three steps. In the first step, a binary syntax element coded_block_flag is transmitted for each transform block, which signals whether the transform block contains significant transform coefficient levels (i.e., transform coefficients that are non-zero). If this syntax element indicates that significant transform coefficient levels are present, a binary-valued significance map is coded, which specifies which of the transform coefficient levels have non-zero values. And then, in a reverse scan order, the values of the non-zero transform coefficient levels are coded. The significance map is coded into the syntax element stream 138 as follows. For each coefficient in the scan order, a binary syntax element significant_coeff_flag is coded, which specifies whether the corresponding transform coefficient level is not equal to zero. If the significant_coeff_flag bin is equal to one, i.e., if a non-zero transform coefficient level exists at this scanning position, a further binary syntax element last_significant_coeff_flag is coded. This bin indicates if the current significant transform coefficient level is the last significant transform coefficient level inside the block or if further significant transform coefficient levels follow in scanning order. If last_significant_coeff_flag indicates that no further significant transform coefficients follow, no further syntax elements are coded for specifying the significance map for the block. In the next step, the values of the significant transform coefficient levels are coded, whose locations inside the block are already determined by the significance map. The values of significant transform coefficient levels are coded in reverse scanning order by using the following three syntax elements. The binary syntax element coeff_abs_greater_one indicates if the absolute value of the significant transform coefficient level is greater than one. If the binary syntax element coeff_abs_greater_one indicates that the absolute value is greater than one, a further syntax element coeff_abs_level_minus_two is sent, which specifies the absolute value of the transform coefficient level minus two. This is the kind of syntax element the processing of which is performed according to FIGS. 1b, 1c and 1b in the following embodiment. Finally, the binary syntax element coeff_sign_flag, which specifies the sign of the transform coefficient value, is coded for each significant transform coefficient level. It should be noted again that the syntax elements that are related to the significance map are coded in scanning order, whereas the syntax elements that are related to the actual values of the transform coefficients levels are coded in reverse scanning order allowing the usage of more suitable context models. It is also possible that an adaptive scan pattern is used for the significance map as in the first Test-Model of H.265/HEVC. Another concept is used for coding of the absolute transform coefficient levels for transform blocks larger than 4×4 in the first Test-Model of H.265/HEVC. In case of transform blocks larger than 4×4, the larger transform block is partitioned into 4×4 blocks and the 4×4 blocks are coded in the scan order while for each 4×4 blocks the reverse scan order is used.

In the CABAC entropy coding in H.264/AVC, all syntax elements for the transform coefficient levels are coded using a binary probability modelling. The non-binary syntax element coeff_abs_level_minus_two, for example, is first binarized, i.e., it is mapped onto a sequence of binary decisions (bins), and these bins are sequentially coded. The binary syntax elements significant_coeff_flag, last_significant_coeff_flag, coeff_abs_greater_one, and coeff_sign_flag are directly coded. Each coded bin (including the binary syntax elements) is associated with a context. A context represents a probability model for a class of coded bins. A measure related to the probability for one of the two possible bin values is estimated for each context based on the values of the bins that have been already coded with the corresponding context. For several bins related to the transform coding, the context that is used for coding is selected based on already transmitted syntax elements or based on the position inside a block.

After coding the significance map, the block is processed in reverse scan order. As mentioned before, another concept is used in the first Test-Model of H.265/HEVC. Transform blocks larger than 4×4 are partitioned into 4×4 blocks and the resulting 4×4 blocks are processed in scan order, while the coefficients of the 4×4 blocks are coded in reverse scan order. The following description is valid for all 4×4 blocks in the first Test-Model of H.265/HEVC and H.264/AVC and also for 8×8 blocks in H.264/AVC and this description may also apply to the construction of the stream of syntax elements 138 and 226, respectively.

If a scan position is significant, i.e., the coefficient is different from zero, the binary syntax element coeff_abs_greater_one is transmitted within the stream 138. Initially (within a block), the second context model of the corresponding context model set is selected for the coeff_abs_greater_one syntax element. If the coded value of any coeff_abs_greater_one syntax element inside the block is equal to one (i.e., the absolute coefficient is greater than 2), the context modelling switches back to the first context model of the set and uses this context model up to the end of the block. Otherwise (all coded values of coeff_abs_greater_one inside the block are zero and the corresponding absolute coefficient levels are equal to one), the context model is chosen depending on the number of the coeff_abs_greater_one syntax elements equal to zero that have already been processed in the reverse scan of the considered block. The context model selection for the syntax element coeff_abs_greater_one can be summarized by the following equation, where the current context model index $C_{t+1}$ is selected based on the previous context model index $C_t$ and the value of the previously coded syntax element coeff_abs_greater_one, which is represented by $bin_t$ in the equation. For the first syntax element coeff_abs_greater_one inside a block, the context model index is set equal to $C_1=1$.

$$C_{t+1}(C_t, bin_t) = \begin{cases} 0 & bin_t = 1 \\ \min(C_t+1, 4) & bin_t = 0 \end{cases}$$

The second syntax element for coding the absolute transform coefficient levels, coeff_abs_level_minus_two is only coded, when the coeff_abs_greater_one syntax element for the same scan position IS equal to one. The non-binary syntax element coeff_abs_level_minus_two is binarised into a sequence of bins and for the first bin of this binarisation; a context model index is selected as described in the following. The remaining bins of the binarisation are coded with fixed contexts. The context for the first bin of the binarisation is selected as follows. For the first coeff_abs_level_minus_two syntax element, the first context model of the set of context models for the first bin of the coeff_abs_level_minus_two syntax element is selected, the corresponding context model index is set equal to $C_1=0$. For each further first bin of the coeff_abs_level_minus_two syntax element, the context modelling switches to the next context model in the set, where the number of context models in set is limited to 5. The context model selection can be expressed by the following formula, where the current context model index $C_{t+1}$ is selected based on the previous context model index $C_t$.

$$C_{t+1}(C_t) = \min(C_t+1, 4)$$

As mentioned before, for the first syntax element coeff_abs_remain_minus_two inside a block, the context model index is set equal to $C_t=0$. Note, that different sets of context models bay be defined for the syntax elements coeff_abs_greater_one and coeff_abs_remain_minus_two. Also note that for the first Test-Model of H.265/HEVC, transform blocks larger than 4×4 may be partitioned into 4×4 blocks. The partitioned 4×4 blocks may be processed in scanning order and for each partitioned 4×4 block, a context set may be derived based on the number of coefficients greater than one in the previous 4×4 block. For the first 4×4 block of a transform block larger than 4×4 and for origin 4×4 transform blocks a separate context set may be used.

That is, when ever in the following description context based coding is used for any of the source symbols into which coeff_abs_greater_one and coeff_abs_remain_minus_two is decomposed according to the following embodiments, then this context derivation may be used by assigner 114 and 212 and VLC en/decoder 102 and 202, for example.

In order to reduce the complexity in terms of number of bins processed by CABAC or PIPE compared to the start-of-the-art techniques and also in terms of computation complexity or also to increase the coding efficiency, the below outlined embodiment describes an approach for coding absolute levels by using different variable length codes for different partitions $140_1$ to $140_3$ in image and video encoders and decoders. The embodiments outlined below can be, however, applied to all kind of absolute levels for image and video coders, like motion vector differences or coefficients of the adaptive loop filter. While the coding of transform coefficients levels is performed as outlined below the coding of the significance map may remain as in the first Test-Model of H.265/HEVC or as has been described above, or the coding of the significance map can also be done as in H.264/AVC or otherwise.

As described above, the coding of the absolute transform levels is performed in multiple partitions $140_{1-3}$. The coding scheme has exemplary been illustrated in FIG. 1b with three partitions $140_{1-3}$. The bounds 142 and 144 of the scheme are variable resulting in variable partition sizes. The coding scheme is done as follows.

A first entropy code is used to code the first component or source symbol, i.e. absolute transform coefficient level (z) in case same is smaller than limit1, or limit1 in case same is not. If the absolute transform coefficient level is greater than or equal to the bound limit1 of the first partition $140_1$, than the bound limit1 (142) of the first partition ($140_1$) is subtracted from the absolute transform coefficient level and the resulting value z' is coded with a second entropy code. If the remaining absolute transform coefficient level z' is greater than or equal to a bound limit2-limit1 for the second partition $140_2$, than the bound limit2-limit1 of the second partition is again subtracted from the absolute transform coefficient level z' and the resulting value is coded with a third entropy code. Generally speaking, when the bound of a partition is reached, the entropy code for the next partition to the bound is used to code the value resulting from absolute transform coefficient levels minus the bound of the corresponding partition.

The entropy codes can be simple variable length codes as run-length codes or lookup tables (e.g. Huffman code) or more complex entropy codes employing probability models like CABAC or PIPE. The number of partitions and the bound of the partitions may be variable or depending on the actual syntax element. The partitioning concept shown in FIG. 1b has the following benefits. In the following, we use the absolute transform coefficients as an example, but it should be understood the they can be replaced with any other syntax element. As an example, the probability distribution of the absolute transform coefficient levels may be approximately a geometric distribution. Therefore, entropy codes optimized for geometric distributions may be employed for coding the absolute transform coefficient levels. But such a model is not locally optimal, even if context modeling and probability model selection is employed. For example, for a transform block, the local absolute transform coefficient levels follow a distribution which is not geometrical at all if it contains the same amount of very low and middle range transform coefficient levels, while the model may hold true (with a certain accuracy) for a specific amount of blocks in image or video due to the law of large numbers. For such a case, the geometrical distribution is not a suitable model. Also, when considering absolute transform coefficient levels with large values, the distribution of these large values are often uniform. The partitioning concept allows different probability models for different absolute transform coefficient levels. For lower absolute values, more complex entropy codes can be applied for higher efficiency, while for large absolute levels less complex entropy codes can be employed for reducing the complexity.

As mentioned before, entropy codes suitable for the different partitions are used. In an embodiment of the invention, three types of entropy codes are employed. The first entropy code uses PIPE. However, it should be noted that, according to an alternative, an entropy coding method like CABAC or any other arithmetic coder may be used alternatively. That is, the first symbols $s_1$ (see FIG. 2b) may be coded via the PIPE coding path. Subdivider 100 and recombiner 220 act accordingly.

For the second type, Golomb codes and some truncated variants including subsets (e.g. Golomb-Rice codes) may be used. That is, the second symbols $s_2$ (see FIG. 2b) may be coded via such VLC codes in VLC en/decoder 102/202. Subdivider 100 and recombiner 220 act accordingly.

Exponential-Golomb codes are used as the third type. That is, the third symbols s3 (see FIG. 2b) may be coded via such VLC codes in VLC en/decoder 102/202. Subdivider 100 and recombiner 220 act accordingly. Different VLC codes and different combinations of VLC and PIPE or VLC and arithmetic codes are possible.

While the first code is more complex but yields better compression performance, the second entropy codes represent a reasonable trade-off between complexity and performance. The last entropy codes, e.g. Exponential-Golomb codes, are very low complex. In the following, the coding of the different partitions is described.

If a partition such as partition 1401, such as the symbol Si, is to be entropy coded using an entropy coder employing probability models like PIPE coder 104 (again, CABAC or any other arithmetic coder may be used in an alternative not described further here), subdivider 120 directs same towards PIPE encoder 104. Firstly, the non-binary valued absolute transform coefficient levels may be binarised in symbolizer 122 using a binarisation method. The binarisation maps the non-binary valued absolute transform coefficient levels to a sequence of binary bins. Each bin of the bin string is coded with a context chosen by assigner 114. The context modeling can be done for the first bin and fixed for the following bins of the bin sequence as coeff_abs_level_minus_two in H.264/AVC or a different context modeling may be used for each bin of the bin string. Note that the binarisation can be a variable-length code like Golomb codes or Exponential-Golomb codes or other variable-length codes.

Next, a partition such as partition $140_2$ or symbols 52 may be coded with a Golomb code, here in VLC encoder 102 and respectively decoded in VLC decoder. Golomb codes are a set of entropy codes designed for geometrical distributed source. If the order of the Golomb code is zero, the Golomb code is also known as unary code. The unary code is related to the binarisation of coeff_abs_level_minus_two in H.264/AVC. Golomb codes are constructed as follows. For a specific Golomb parameter k, the value n is divided by the Golomb parameter k using integer division and the remainder r is calculated.

$$p = \left\lfloor \frac{n}{k} \right\rfloor$$

$$r = n - pk$$

After deriving the parameters specified by the formulas above, the value n can be coded with two parts. The first part, also referred as prefix part, is a unary code. The resulting value p+1 specifies the number of ones and a terminating zero or vice versa. The remainder value, also referred as remainder part and denoted by r, is represented with a truncated binary code. In accordance with a specific embodiment, the Golomb-Rice codes are employed for coding the source symbols such as source symbols $s_2$ the Golomb-Rice codes being a subset of Golomb codes. Also, when using such entropy codes for partitions $140_{1-3}$ containing a bound, such as partition $140_2$ the alphabet of the respective source symbols (such as source symbols $s_2$) is limited and the Golomb-Rice code can be modified so that the coding efficiency can be improved. The parameter of the Golomb-Rice code can be fixed or variable. If the parameter is variable, the parameter may be estimated as a part of context modelling stage. For example, if a source symbol 52 enters VLC encoder 102, the latter may determine the parameter of the Golomb-Rice code from a context of $s_2$. The Golomb-Rice codes are Golomb codes with parameters to the power of two. So they are based on division and multiplication by two and therefore they can be implemented efficiently in a binary architecture with shift and addition operations. The relation between the Golomb-Rice parameter and the Golomb parameter is therefore $k_{GOLOMB} = 2^{kRICE}$. In case of Golomb-Rice code, the remainder part is exactly the binary representation of the remainder value. For the Golomb-Rice parameter of zero, the resulting code is identical to the unary code and does not have a remainder part. For the parameter equal to one, the remainder part consists of one bin with two input symbols sharing the same unary prefix. In the following, some example tables for selected Golomb-Rice parameters are illustrated.

prefix and therefore a prefix group contains eight values for the parameter three. For a limited source alphabet and a given Golomb-Rice code, the last bin of the prefix can be left out for values in the last prefix group resulting in a prefix code with fixed length.

For example, the range may be nine and the Golomb-Rice parameter is two. For this example case, the number of values which can be represented with a same prefix is four. The maximum value is nine, which also indicates that the border is exceeded and the next entropy code of the next partition has to be used. In this example case, the values from 0-3 have the prefix 0, the values from 4-7 have the prefix 10 and 8-9 the prefix 110. Because the values 8-9 formed the last prefix group, their trailing zero can leave out and the values 8-9 can be represented by 11. In other words, imagine, a source symbol $s_2$ entered VLC encoder 102 with the number of possible values of $s_2$ being 9 (=limit2-limit1+1) and the Golomb-Rice parameter for that source symbol being two. Then, a respective Golomb-Rice codeword would be output by VLC encoder 102 for that source symbol, which has a prefix as just described. For the remainder part of the codeword, the truncated code may be derived as follows by VLC encoder 102. Normally, the parameter of the Golomb-Rice codes indicates the number of bins of the remainder part. In a truncated case, not all bins of the remainder need to be coded. For a truncated case, all values with fixed prefix (e.g. a bin of the prefix is left out) are counted. Note that the counted value is smaller than or equal to the maximum number of values for a prefix because the code is truncated. If a truncation of the remainder part is possible, the derivation of the truncated remainder part for the last prefix group can proceed in the following steps. First, the largest number l to the power of two smaller or equal than the counted number is derived. Then, in the second step, the smallest number h to the power of two greater than the counted number is derived. The first value l describes the number of values in the prefix group with a remainder of h bins. All remainders of these values begins with a 0 followed by the binary representation of the

| Value | Prefix k = 0 | Rem. | Prefix k = 1 | Rem. | Prefix k = 2 | Rem. | Prefix k = 3 | Rem. |
|---|---|---|---|---|---|---|---|---|
| 0 | 0 | | 0 | 0 | 0 | 00 | 0 | 000 |
| 1 | 10 | | 0 | 1 | 0 | 01 | 0 | 001 |
| 2 | 110 | | 10 | 0 | 0 | 10 | 0 | 010 |
| 3 | 1110 | | 10 | 1 | 0 | 11 | 0 | 011 |
| 4 | 11110 | | 110 | 0 | 10 | 00 | 0 | 100 |
| 5 | 111110 | | 110 | 1 | 10 | 01 | 0 | 101 |
| 6 | 1111110 | | 1110 | 0 | 10 | 10 | 0 | 110 |
| 7 | 11111110 | | 1110 | 1 | 10 | 11 | 0 | 111 |
| 8 | 111111110 | | 11110 | 0 | 110 | 00 | 10 | 000 |
| 9 | 1111111110 | | 11110 | 1 | 110 | 01 | 10 | 001 |
| 10 | 11111111110 | | 111110 | 0 | 110 | 10 | 10 | 010 |
| 11 | 111111111110 | | 111110 | 1 | 110 | 11 | 10 | 011 |
| 12 | 1111111111110 | | 1111110 | 0 | 1110 | 00 | 10 | 100 |
| 13 | 11111111111110 | | 1111110 | 1 | 1110 | 01 | 10 | 101 |

Given the range of the partition such as for example limit2-limit1 in case of partition $140_2$ and the parameter of the Golomb-Rice code, the truncation can be done as follows. The Golomb-Rice parameter describes the number of bins necessitated to represent the remainder part and the two to the power of the parameter value describes the number of values, which can be represented with the same prefix. These values form a prefix group. For example, for the parameter zero, only one prefix can represent one specific value, while for the parameter three, eight input values share the same remainder limited to the number of values in the remainder group. For the remaining values of the last prefix group, now treated as a new prefix group, the same procedure is done except for the resulting values formed the first remainder group, the remainder begins with a 1. This procedure is done until all remainders are derived. As an example, the range is 14 and the parameter is three. The first prefix group contains values from 0-7 and the second prefix group values from 8-13. The second prefix group contains six values. The parameters are l=2 and h=3. So, the first four values of the prefix groups are represented by a remainder with three bins (a trailing zero and the binary representation to distinguish the four values). For the last two values, the same procedure is done again. The parameters are l=1 and h=2. The remainder of the last two values now can be represented as 10 and 11. Another example to demonstrate the method is a Golomb-Rice parameter of four and a range of ten. For this example, the parameters are l=3 and h=4. With these parameters, the truncated remainder part for the first eight values are represents by four bins. The remaining two values have the same remainder part as in the previous example before. If the range is nine for the previous example, the parameter for the second run is l=0 and h=1. The remainder part of the only one value that remains is 1.

The third type of entropy codes may be Exponential-Golomb codes. They may be employed for equal probable distributions (e.g. with parameter zero) such as source symbols s3. That is, the VLC encoder/decoder pair may responsible for their coding. As mentioned before, larger absolute transform coefficient levels are often uniformly distributed. More precisely, the zero-order Exponential-Golomb code may be used to code the last partition $140_3$. The beginning and therefore the border 144 to the previous partition $140_2$ may be variable. The position of border 144 may be controlled by VLC en/decoder 102/200 in dependency of preciously encoded/decoded source symbols 106, 108 and/or 110 or syntax elements 138 (or 218, 204 and/or 208 or syntax elements 226).

In an embodiment, the number of partitions is three as shown in FIG. 1b and the bounds 142 and 144 may be variable. For the first partition $140_1$, PIPE coding may be employed as discussed above. However, alternatively CABAC may be used as well. In that case, PIPE en/decoder pair would be replaced by a binary arithmetic coding en/decoder pair. The truncated Golomb-Rice codes may be used for the second partition $140_2$ and the zero-order Exponential-Golomb code may be used for the last partition $140_3$.

In another embodiment, the number of partitions $140_{1-3}$ is three and the first bound 142 is fixed, while the second bound 144 is variable. For the first partition $140_1$, CABAC or PIPE is employed. The truncated Golomb-Rice codes may be used for the second partition $140_2$ and the zero-order Exponential-Golomb code may be used for the last partition $140_3$.

In another embodiment, the number of partitions is equal to two. The first partition $140_1$ could use CABAC or PIPE. The second partition could use Golomb-Rice codes such as $140_2$.

In another embodiment, the number of partitions is equal to three while both borders 142 and 144 are variable. For instance, for the first partition $140_1$, CABAC or PIPE is employed, while the second partition $140_2$ may use the truncated Golomb-Rice code and the third partition $140_3$ uses zero-order Exponential-Golomb code.

In an embodiment, the bound 142 of the first partition $140_1$ using CABAC or PIPE, which employs adaptive probability models, is two. In this embodiment, the context modeling for the first bin may be done as described for coeff_abs_greater_one as described above and the context modeling for the second bin may be done as described for coeff_abs_level_minus_two in H.264/AVC as has also been described above. The latter context determination would be determined by assigners 114 and 212, respectively. In another embodiment, the bound 142 of the first partition $140_1$ using entropy coding that employs probability modeling (e.g. PIPE or CABAC) is two. For this embodiment, the context modeling for both the first and the second bin may be done as described for coeff_abs_greater_one in H.264/AVC as described above. The context set evaluation as described for coeff_abs_greater_one may be done separately for the second bin.

In an embodiment, the bound 142 of the first partition $140_1$ using entropy coding employing probability modeling (e.g. CABAC or PIPE) may be equal to one. For the only bin (or alphabet symbol) of the bin string of the respective source symbol, the context modeling may be done as described for coeff_abs_greater_one in H.264/AVC previously described.

In an embodiment, the bound 142 of the first partition $140_1$ using entropy coding employing probability modeling (e.g. CABAC or PIPE) may be three. The context modeling of the first and second bins of the bin string of the respective source symbol may be done as coeff_abs_greater_one in H.264/AVC. The context modeling for the third bin may be done as coeff_abs_level_minus_two in H.264/AVC. The context set evaluation as described for coeff_abs_greater_one may be done separately for the second bin.

In an embodiment, a set of truncated Golomb-Rice codes may be used as entropy codes of the second partition $140_2$. The bound 144 of the second partition specifying the beginning of the third partition $140_3$ depending on the entropy code parameter may be variable. Also in this embodiment, the Golomb-Rice parameter may be limited by three and the parameter selection maybe done as the context modeling for coeff_abs_level_minus_two in H.264/AVC. The range limit-limit2 may be variable and may depend on the Golomb-Rice parameter. If the parameter is zero, the range is 8. For the parameter one, the range is 10. In case of parameter two, the range is 12 and for the parameter three, the range is equal to 16. In this embodiment, the Golomb-Rice parameter is set to zero at the beginning of a block of transform coefficients. For each coded transform coefficient level in the block larger or equal than the first bound, the corresponding Golomb-Rice code used. After coding (or decoding) a level, the following evaluation is made to update the Golomb-Rice parameter for coding (or decoding) of the next level greater or equal than the first bound. Note that the Golomb-Rice parameter cannot be decreased by using this form of adaptation.

The parameter adaptation rule can be summarized as follows, where $k_{t+1}$ denotes the Golomb-Rice parameter to be used for coding of the next level valuer and value denotes the previously coded value with corresponding Golomb-Rice parameter $k_t$ $$k_{t+1} = \begin{cases} 0 & value_t \in [0, 1] \wedge k_t < 1 \\ 1 & value_t \in [2, 3] \wedge k_t < 2 \\ 2 & value_t \in [4, 5] \wedge k_t < 3 \\ 3 & value_t > 5 \wedge k_t < 4 \\ k_t & \text{otherwise} \end{cases} \quad (QQ)$$

In an embodiment, a set of truncated Golomb-Rice codes may be used as entropy codes of the second partition $140_2$. The bound 144 of the second partition 1402 specifying the beginning of the third partition $140_3$ depending on the entropy code parameter may be variable. Also in this embodiment, the Golomb-Rice parameter may be limited by three and the parameter selection may be done as context modeling for coeff_abs_level_minus_two in H.264/AVC. The range may be variable and depend on the Golomb-Rice parameter. If the parameter is zero, the range is 8. For the parameter one, the range is 10. In case of parameter two, the range is 12 and for the parameter three, the range is equal to 16. In this embodiment, the Golomb-Rice parameter is set to zero at the beginning of the block. The Golomb-Rice parameter adaptation is performed as described by equation (QQ). Note that the parameter cannot be decreased by using this form of adaptation.

In another embodiment, a set of truncated Golomb-Rice codes may be used as entropy codes of the second partition $140_2$. The bound 144 of the second partition $140_2$ specifying the beginning of the third partition $140_3$ depending on the entropy code parameter may be fixed. Also in this embodiment, the Golomb-Rice parameter may be limited to three and the parameter selection may be done as context modeling for coeff_abs_level_minus_two in H.264/AVC. The range of the second partition $140_2$ may be fixed to 14. In this embodiment, the Golomb-Rice parameter may be set to zero at the beginning of the block. The Golomb-Rice parameter adaptation is performed as described by equation (QQ). Note that the parameter cannot be decreased by using this form of adaptation.

In another embodiment, a set of truncated Golomb-Rice codes may be used as entropy codes of the second partition $140_2$. The bound 144 of the second partition $140_2$ specifying the beginning of the third partition $140_3$ depending on the entropy code parameter may be variable. Also in this embodiment, the Golomb-Rice parameter may be limited to three and the parameter selection may be done as context modeling for coeff_abs_level_minus_two in H.264/AVC. The range may be variable and depend on the Golomb-Rice parameter. If the parameter may be zero, the range may be 8. For the parameter one, the range may be 10. In case of parameter two, the range may be 12 and for the parameter three, the range may be equal to 16. In this embodiment, the Golomb-Rice parameter may be set to zero for at the beginning of the block. The Golomb-Rice parameter adaptation is performed as described by equation (QQ). Note that the parameter cannot be decreased by using this form of adaptation. And also note that a direct switching, e.g. from zero to three, is possible. In this embodiment, the prefix part of the Golomb-Rice codes is coded with entropy codes employing probability models. The context modeling can be done as for coeff_abs_level_minus_two in H.264/AVC.

In another embodiment, a fixed Golomb-Rice parameter may be used to code all transform coefficient levels in current transform block. In this embodiment, the best parameter of the previous block may be calculated and used for the current transform block. For this embodiment, the range may be fixed by 14.

In another embodiment, a fixed Golomb-Rice parameter may be used to code all transform coefficient levels in current transform block. In this embodiment, the best parameter of the previous block may be calculated and used for the current transform block. For this embodiment, the range may be variable as described before.

In another embodiment, it is evaluated if the already coded (or decoded) neighborhood of the current scan index contains absolute transform coefficient levels larger than the previous bound. For this embodiment, the best parameter may be derived by using neighbors in a local causal template.

Thus, above-mentioned embodiments inter alias described, an entropy encoding apparatus comprising a decomposer 136 configured to convert a sequence 138 of syntax elements into a sequence 106 of source symbols 106 by individually decomposing at least a subgroup of the syntax elements into a respective number n of source symbols $s_i$ with i=1 ... n, the respective number n of source symbols depending on as to which of a sequence of n partitions $140_{1-3}$ into which a value range of the respective syntax elements is sub-divided, a value z of the respective syntax elements falls into, so that a sum of values of the respective number of source symbols $s_i$ yields z, and, if n>1, for all i=1 ... n−1, the value of $s_i$ corresponds to a range of the $i^{th}$ partition; a subdivider 100 configured to subdivide the sequence 106 of source symbols into a first subsequence 108 of source symbols and a second subsequence 110 of source symbols such that all source symbols $s_x$ with x being member of a first subset of {1 ... n} are contained within the first subsequence 108 and all source symbols $s_y$ with y being member of a second subset of {1 ... n} being disjoint to the first subset, are contained within the second subsequence 110; a VLC encoder 102 configured to symbol-wisely encode the source symbols of the first subsequence 108; and a PIPE or arithmetic encoder 104 configured to encode the second subsequence 110 of source symbols.

The values z of the subgroup of the syntax elements may be absolute values. The second subset may be {1} with the sequence of n partitions being arranged such that a pth partition covers higher values of the value range than a qth partition for all p,q∈{1 ... n} with p>q. n may be 3. The first subset may be {2,3} with the a VLC encoder (102) configured to use a Golomb-Rice code to symbol-wisely encode the source symbols $s_2$, and a Exp-Golomb Code to symbol-wisely encode the source symbols s3. More generally, 2 may be element of the first subset with the a VLC encoder (102) being configured to use a Golomb-Rice code to symbol-wisely encode the source symbols 52 and adapt a Golomb-Rice parameter, i.e. k, of the Golomb-Rice code according to previously encoded source symbols. The decomposer may be configured to adapt one or more of the limits between the partitions according to previously encoded source symbols. Both adaptations may be combined. That is, positions of the limits limiting the second partition may be adapted such that they are spaced apart from each other such that the length of the Golomb-Rice code, i.e. the number of codewords thereof, corresponds to (or prescribes) the length of the width of the second partition. The limit between separating the first from the second partition may be defined otherwise such as being fixed by definition or adapted in accordance with other context dependency, in what case the adaptation of k may define the position of the limit separating the second and third partition via the length of the Golomb-Rice code and the width of the second partition, respectively. By coupling the adaptation of k so that the width of the second partition corresponds to the length of the Golomb-Rice code, the code efficiency is optimally used. Adapting k to the statistics of the syntax element enables to adapt the width of the second partition such that the third partition may cover as much as possible so as to reduce the overall coding complexity since a lower complex code may have be used for the third partition such as the Exp-Golomb code. Further, the length of the first partition may be restricted to j∈{1, 2, 3} possible syntax element values, such as the lowest three levels. The syntax elements under consideration may be differentially coded or represent a prediction residual such is the case with the above exemplified transform coefficient levels which represent a prediction residual. The first source symbols $s_1$ may be symbolized/desymbolized by use of a truncated unary code with the resulting j bins being-partially or all of them-coded context-adaptively or not as mentioned above.

The subgroup of the syntax elements may encompass absolute transform coefficient levels of absolute transform coefficients of transform blocks of a picture with the absolute transform coefficient levels of a respective transform block being arranged within the sequence (138) of syntax elements in accordance with a scan path leading through the absolute transform coefficients of the respective transform blocks, wherein the decomposer may be configured to adapt one or more of limits between the partitions during decomposing the absolute transform coefficient levels of the absolute transform coefficients of a respective transform block depending on already encoded absolute transform coefficient levels of absolute transform coefficients of the respective transform blocks preceding in the scan order or depending on a position of the absolute transform coefficient level currently to be decomposed in the scan order, or based on an evaluation of the already reconstructed absolute transform coefficient levels of transform coefficients neighboring—either spatially or in scan order—the position of the absolute transform coefficient level currently to be decomposed.

Further, the above-mentioned embodiments inter alias describe an entropy decoding apparatus comprising a VLC decoder 200 configured to codeword-wisely reconstruct source symbols of a first subsequence 204 of source symbols from codewords of a first bitstream 206; a PIPE or arithmetic decoder 202 configured to reconstruct a second subsequence 208 of source symbols; a composer 224 configured to compose a sequence 226 of syntax elements from the first subsequence 204 of source symbols and the second subsequence 208 of source symbols by individually composing each syntax element from a respective number of source symbols, wherein the composer is configured to, for at least a subgroup of the syntax elements, determine the respective number n of source symbols $s_i$ with i=1 . . . n depending on as to which of a sequence of n partitions $140_{1-3}$ into which a value range of the respective syntax elements is subdivided, a value z of the respective syntax elements falls into, by summing-up the values of the respective number of source symbols $s_i$ from 1 to n as long as the value of $s_i$ corresponds to a range of the $i^{th}$ partition so as to obtain the value of the syntax element z, wherein the composer 224 is configured to retrieve all source symbols $s_x$ with x being member of a first subset of {1 . . . n} from the first subsequence (204) and all source symbols $s_y$ with y being member of a second subset of {1 . . . n} being disjoint to the first subset, from the second subsequence 208. The values z of the subgroup of the syntax elements may be absolute values. The second subset may be {1} with the sequence of n partitions being arranged such that a pth partition covers higher values of the value range than a qth partition for all p,q∈{1 . . . n} with p>q. n may be 3. The first subset may be {2,3} with the a VLC decoder 200 being configured to use a Golomb-Rice code to codeword-wisely reconstruct the source symbols 52, and a Exp-Golomb Code to codeword-wisely reconstruct the source symbols s3. More generally, 2 may be element of the first subset with the a VLC decoder 102 being configured to use a Golomb-Rice code to codeword-wisely reconstruct the source symbols 52 and adapt a Golomb-Rice parameter of the Golomb-Rice code according to previously reconstructed source symbols. The entropy decoding apparatus may further comprise a recombiner 220 configured to recombine the first subsequence 204 of source symbols and the second subsequence of source symbols to obtain the sequence 218 of source symbols. The syntax elements may be of different type and the composer may be configured to perform the individual composing depending on the type of the syntax elements. The subgroup of the syntax elements may encompass absolute transform coefficient levels of absolute transform coefficients of transform blocks of a picture with the absolute transform coefficient levels of a respective transform block being arranged within the sequence 138 of syntax elements in accordance with a scan path leading through the absolute transform coefficients of the respective transform blocks, wherein the composer may be configured to adapt one or more of limits between the partitions during composing the absolute transform coefficient levels of the absolute transform coefficients of a respective transform block depending on already reconstructed absolute transform coefficient levels of absolute transform coefficients of the respective transform blocks preceding in the scan order or depending on a position of the absolute transform coefficient level currently to be composed in the scan order, or based on an evaluation of the already reconstructed absolute transform coefficient levels of transform coefficients neighboring—either spatially or in scan order—the position of the absolute transform coefficient level currently to be composed.

Regarding the embodiments combining PIPE coding with VLC coding using the decomposition according to FIG. 1b, the following is noted in order to repeat some aspects thereof in other words.

The mapping of a sequence of symbols to a bit stream and the inverse mapping has been described. Each symbol carries associated parameter(s) with it that are simultaneously known at encoder and decoder. The entropy codec contains multiple first-in first-out (FIFO) buffers with each of them assigned to subsets of parameter(s) that are associated to the symbols. For given parameter(s) of a symbol, the encoder assigns the symbol to the corresponding FIFO buffer. Since the encoder assignment rule is known at the decoder side, the decoder reads from the FIFO buffer to which the encoder has assigned the symbol.

Some syntax elements are coded using standard variable-length codes and are written to a particular buffer. Other syntax elements are coded using the probability interval partitioning entropy (PIPE) coding concept. At this, the symbols are first binarized and the resulting bins are classified based on associated probability estimates. The probability estimate may be given or derived from a measurement that can be conducted simultaneously at encoder and decoder. A particular FIFO buffer contains symbols with estimated probability values falling into a subset of probabilities that is chosen, so that the entropy coding can be improved. The improvement achieved by a combination of the PIPE concept with VLC is a complexity reduction while still providing a high coding efficiency. Symbols for which a standard VLC code is suitable are coded with the simple and low-complex VLC approach, while other symbols for which the bit rate would be significantly increased by coding them with a VLC code are coded with the more sophisticated PIPE concept.

Thus, in order to further reduce the complexity of entropy coding, the symbols have been split into two categories. Symbols of a first category can well be represented with VLC codes and don't necessitate the more complex PIPE coding, while symbols of a second category cannot be efficiently represented with VLC codes and a PIPE coding for these symbols significantly reduced the necessitated bit rate.

It should be noted that the above embodiments have been described with one VLC encoder and decoder only, but it is clear that this concept can be generalized to the use of two and more VLC encoders and decoders to be interleaved with the PIPE coders.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The inventive encoded/compressed signals can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An apparatus for decoding comprising:
a symbol decoder configured to:
obtain, based on codewords from a data stream, a first sequence of source symbols and a second sequence of source symbols, wherein source symbols of the first and second sequences are related to level values of transform coefficients of a transform coefficient block, wherein the symbol decoder is configured to obtain a source symbol of the first sequence using arithmetic context-based entropy coding and a source symbol of the second sequence using Exp-Golomb coding; and
a composer configured to:
compose a sequence of syntax elements having a value range which is sub-divided into a plurality of disjoint portions by, for each syntax element:
obtaining a set of source symbols from the first and second sequences based on a portion of the plurality of disjoint portions associated with the syntax element, and
combining values of the source symbols of the set to determine the value of the syntax element.

2. The apparatus of claim 1, wherein the symbol decoder comprises:
a first decoder configured to:
receive a first portion of the data stream, and
reconstruct, using the arithmetic context-based entropy coding, source symbols of the first sequence of source symbols from codewords of the first portion of the data stream; and
a second decoder configured to:
receive a second portion of the data stream, and
reconstruct, using the Exp-Golomb coding, source symbols of the second sequence of source symbols from codewords of the second portion of the data stream.

3. The apparatus of claim 1, wherein a source symbol in the first sequence of source symbols corresponds to a first portion of the plurality of disjoint portions, and the plurality of disjoint portions is arranged such that the first portion covers lower values of the value range than a second portion of the plurality of disjoint portions.

4. The apparatus of claim 1, wherein the source symbols from the first sequence and the source symbols from the second sequence correspond to different portions.

5. The apparatus of claim 1, wherein the plurality of disjoint portions includes a maximum of three portions.

6. The apparatus of claim 1, wherein a third portion of the data stream represents at least one scaling factor.

7. The apparatus of claim 1, wherein the apparatus is at least a portion of a programmable logic device, a programmable gate array, a microprocessor, a computer or an electronic circuit.

8. The apparatus of claim 1, wherein the composer is configured to adapt at least one limit between the disjoint portions during composing absolute transform coefficient levels of the transform coefficients of the transform coefficient block based on at least one of:
- a previously reconstructed absolute transform coefficient level of a transform coefficient preceding in a scan order,
- a position of a current absolute transform coefficient level to be composed in the scan order,
- an evaluation of previously reconstructed absolute transform coefficient levels of transform coefficients spatially neighboring the position of the current absolute transform coefficient level to be composed, and
- an evaluation of previously reconstructed absolute transform coefficient levels of transform coefficients neighboring according to the scan order the position of the current absolute transform coefficient level to be composed.

9. A method for decoding comprising:
- obtaining, based on codewords from a data stream, a first sequence of source symbols and a second sequence of source symbols, wherein source symbols of the first and second sequences are related to level values of transform coefficients of a transform coefficient block, wherein the obtaining includes obtaining a source symbol of the first sequence using arithmetic context-based entropy coding and a source symbol of the second sequence using Exp-Golomb coding; and
- composing a sequence of syntax elements having a value range which is sub-divided into a plurality of disjoint portions by, for each syntax element:
- obtaining a set of source symbols from the first and second sequences based on a portion of the plurality of disjoint portions associated with the syntax element, and
- combining values of the source symbols of the set to determine the value of the syntax element.

10. The method of claim 9, further comprising:
- receiving a first portion of the data stream;
- reconstructing, using the arithmetic context-based entropy coding, source symbols of the first sequence of source symbols from codewords of the first portion of the data stream;
- receiving a second portion of the data stream; and
- reconstructing, using the Exp-Golomb coding, source symbols of the second sequence of source symbols from codewords of the second portion of the data stream.

11. The method of claim 9, wherein a source symbol in the first sequence of source symbols corresponds to a first portion of the plurality of disjoint portions, and the plurality of disjoint portions is arranged such that the first portion covers lower values of the value range than a second portion of the plurality of disjoint portions.

12. The method of claim 9, wherein the source symbols from the first sequence and the source symbols from the second sequence correspond to different portions.

13. The method of claim 9, wherein the plurality of disjoint portions includes a maximum of three portions.

14. The method of claim 9, wherein a third portion of the data stream represents at least one scaling factor.

15. The method of claim 9, wherein the method is implemented using a programmable logic device, a programmable gate array, a microprocessor, a computer or an electronic circuit.

16. The method of claim 9, further comprising:
- adapting at least one limit between the disjoint portions during composing absolute transform coefficient levels of the transform coefficients of the transform coefficient block based on at least one of:
- a previously reconstructed absolute transform coefficient level of a transform coefficient preceding in a scan order,
- a position of a current absolute transform coefficient level to be composed in the scan order,
- an evaluation of previously reconstructed absolute transform coefficient levels of transform coefficients spatially neighboring the position of the current absolute transform coefficient level to be composed, and
- an evaluation of previously reconstructed absolute transform coefficient levels of transform coefficients neighboring according to the scan order the position of the current absolute transform coefficient level to be composed.

17. An apparatus for encoding comprising:
a decomposer configured to:
- receive a sequence of syntax elements having a value range which is sub-divided into a plurality of disjoint portions, related to level values of transform coefficients of a transform coefficient block, and
- obtain a sequence of source symbols based on the sequence of syntax elements by decomposing each syntax element into a corresponding set of source symbols based on a portion of the plurality of disjoint portions associated with the syntax element, such that a combination of values of the source symbols of the set yields the value of the syntax element; and
a symbol encoder configured to:
- receive the sequence of source symbols,
- sub-divide the sequence of source symbols into a first sequence of source symbols and a second sequence of source symbols, and
- encode a source symbol of the first sequence using arithmetic context-based entropy coding and a source symbol of the second sequence using Exp-Golomb coding.

18. The apparatus of claim 17, wherein the symbol encoder includes:
- a first encoder configured to encode the source symbols of the first sequence using the arithmetic context-based entropy coding; and
- a second encoder configured to encode the source symbols of the second sequence using the Exp-Golomb coding.

19. The apparatus of claim 17, wherein a source symbol in the first sequence of source symbols corresponds to a first portion in the plurality of disjoint portions, and the plurality of disjoint portions is arranged such that the first portion covers lower values of the value range than a second portion of the plurality of disjoint portions.

20. The apparatus of claim 17, wherein the first encoder or the second encoder is further configured to encode a scaling factor.

21. The apparatus of claim 17, wherein the source symbols from the first sequence and the source symbols from the second sequence correspond to different portions of the plurality of disjoint portions.

22. The apparatus of claim 17, wherein the apparatus is at least a portion of a programmable logic device, a programmable gate array, a microprocessor, a computer or an electronic circuit.

23. A non-transitory computer-readable medium for storing video data, comprising:
- a data stream stored in the non-transitory computer-readable medium and comprising data associated with a first sequence of source symbols and a second sequence of source symbols, wherein the source symbols of the first and second sequences are related to level values of transform coefficients of a transform coefficient block, and are obtained based on a sequence of syntax elements having a value range which is sub-divided into a plurality of disjoint portions by executing operations using a processor, the operations including:

decomposing each syntax element into a corresponding set of source symbols based on a portion of the plurality of disjoint portions associated with the syntax element, such that a combination of values of the source symbols of the set yields the value of the syntax element, sub-dividing the sequence of source symbols into a first sequence of source symbols and a second sequence of source symbols, and encoding a source symbol of the first sequence using arithmetic context-based entropy coding and a source symbol of the second sequence using Exp-Golomb coding.

24. The non-transitory computer-readable medium of claim 23, the operations further comprising: encoding the source symbols of the first sequence using a first encoder; and encoding the source symbols of the second sequence using a second encoder.

25. The non-transitory computer-readable medium of claim 23, wherein the first encoder or the second encoder is configured to encode a scaling factor.

26. The non-transitory computer-readable medium of claim 23, wherein a source symbol in the first sequence of source symbols corresponds to a first portion in the plurality of disjoint portions, and the plurality of disjoint portions is arranged such that the first portion covers lower values of the value range than a second portion of the plurality of disjoint portions.

27. The non-transitory computer-readable medium of claim 23, wherein the source symbols from the first sequence and the source symbols from the second sequence correspond to different portions of the plurality of disjoint portions.

28. The non-transitory computer-readable medium of claim 23, wherein the plurality of disjoint portions includes a maximum of three portions.

29. The non-transitory computer-readable medium of claim 23, wherein a third portion of the data stream represents at least one scaling factor.

30. The non-transitory computer-readable medium of claim 23, wherein the operations further include adapting at least one limit between the disjoint portions during composing absolute transform coefficient levels of the transform coefficients of the transform coefficient block based on at least one of:

a previously reconstructed absolute transform coefficient level of a transform coefficient preceding in a scan order, a position of a current absolute transform coefficient level to be composed in the scan order, an evaluation of previously reconstructed absolute transform coefficient levels of transform coefficients spatially neighboring the position of the current absolute transform coefficient level to be composed, and an evaluation of previously reconstructed absolute transform coefficient levels of transform coefficients neighboring according to the scan order the position of the current absolute transform coefficient level to be composed.

* * * * *